(12) United States Patent
Seo et al.

(10) Patent No.: US 11,728,245 B2
(45) Date of Patent: Aug. 15, 2023

(54) SEMICONDUCTOR DEVICE AND SEMICONDUCTOR PACKAGE INCLUDING PENETRATION VIA STRUCTURE

(71) Applicant: SAMSUNG ELECTRONICS CO., LTD., Suwon-si (KR)

(72) Inventors: Jubin Seo, Seongnam-si (KR); Kwangjin Moon, Hwaseong-si (KR); Kunsang Park, Hwaseong-si (KR); Myungjoo Park, Pohang-si (KR); Sujeong Park, Hwaseong-si (KR); Jaewon Hwang, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 37 days.

(21) Appl. No.: 17/316,970

(22) Filed: May 11, 2021

(65) Prior Publication Data
US 2022/0037236 A1    Feb. 3, 2022

(30) Foreign Application Priority Data

Aug. 3, 2020  (KR) .................. 10-2020-0096758

(51) Int. Cl.
*H01L 23/528*    (2006.01)
*H01L 23/48*     (2006.01)
(Continued)

(52) U.S. Cl.
CPC ...... *H01L 23/481* (2013.01); *H01L 23/49816* (2013.01); *H01L 23/49838* (2013.01); *H01L 23/5226* (2013.01); *H01L 23/5283* (2013.01); *H01L 23/5286* (2013.01); *H01L 23/5384* (2013.01); *H01L 23/5386* (2013.01);
(Continued)

(58) Field of Classification Search
CPC ..... H01L 2224/02372; H01L 21/76898; H01L 2225/06541–06544; H01L 23/5286
See application file for complete search history.

(56) References Cited

U.S. PATENT DOCUMENTS 7,253,527 B2    8/2007   Tanida et al.
7,851,321 B2   12/2010   Clevenger et al.
(Continued)

FOREIGN PATENT DOCUMENTS

CN          103378032        10/2013

*Primary Examiner* — Bradley Smith
*Assistant Examiner* — William Henry Anderson
(74) *Attorney, Agent, or Firm* — F. Chau & Associates, LLC

(57) ABSTRACT

A semiconductor device includes a semiconductor substrate having a first surface and a second surface, which are opposite to each other, an active pattern protruding from the first surface of the semiconductor substrate, the active pattern including a source/drain region, a power rail electrically connected to the source/drain region, a power delivery network disposed on the second surface of the semiconductor substrate, and a penetration via structure penetrating the semiconductor substrate and electrically connected to the power rail and the power delivery network. The penetration via structure includes a first conductive pattern electrically connected to the power rail and a second conductive pattern electrically connected to the power delivery network. The first conductive pattern includes a material different from the second conductive pattern.

20 Claims, 48 Drawing Sheets

(51) Int. Cl.
*H01L 23/498* (2006.01)
*H01L 23/538* (2006.01)
*H01L 23/00* (2006.01)
*H01L 25/065* (2023.01)
*H01L 23/522* (2006.01)
*H01L 23/532* (2006.01)

(52) U.S. Cl.
CPC ........ *H01L 23/53209* (2013.01); *H01L 24/08* (2013.01); *H01L 24/16* (2013.01); *H01L 25/0652* (2013.01); *H01L 25/0657* (2013.01); *H01L 2224/08146* (2013.01); *H01L 2224/08147* (2013.01); *H01L 2224/16146* (2013.01); *H01L 2224/16147* (2013.01); *H01L 2224/16227* (2013.01); *H01L 2224/16237* (2013.01); *H01L 2225/06513* (2013.01); *H01L 2225/06517* (2013.01); *H01L 2225/06544* (2013.01); *H01L 2225/06548* (2013.01); *H01L 2924/1431* (2013.01); *H01L 2924/1434* (2013.01)

(56) References Cited

U.S. PATENT DOCUMENTS

| | | | |
|---|---|---|---|
| 8,022,529 | B2 | 9/2011 | Kawano |
| 8,304,863 | B2 | 11/2012 | Filippi et al. |
| 8,884,440 | B2 | 11/2014 | Kim et al. |
| 9,093,316 | B2 | 7/2015 | Kuroda |
| 9,263,324 | B2 | 2/2016 | Farooq et al. |
| 9,269,651 | B2 | 2/2016 | Hong et al. |
| 9,653,420 | B2 | 5/2017 | Hiatt et al. |
| 9,786,604 | B2 | 10/2017 | Kao et al. |
| 10,622,284 | B2 | 4/2020 | Birner et al. |
| 2017/0200675 | A1* | 7/2017 | Jung ................ H01L 23/53295 |
| 2020/0135634 | A1* | 4/2020 | Chiang ............... H10B 12/0335 |
| 2020/0203276 | A1* | 6/2020 | Hiblot ................... H01L 21/743 |
| 2020/0373242 | A1* | 11/2020 | Hiblot ................. H01L 23/5384 |
| 2021/0233834 | A1* | 7/2021 | Chen ....................... H01L 24/83 |

* cited by examiner

SEMICONDUCTOR DEVICE AND SEMICONDUCTOR PACKAGE INCLUDING PENETRATION VIA STRUCTURE

CROSS-REFERENCE TO RELATED APPLICATIONS

This U.S. non-provisional patent application claims priority under 35 U.S.C. § 119 to Korean Patent Application No. 10-2020-0096758, filed on Aug. 3, 2020 in the Korean Intellectual Property Office, the disclosure of which is hereby incorporated by reference in its entirety.

TECHNICAL FIELD

Embodiments of the present disclosure relate to a semiconductor device and a semiconductor package, and more particularly, to a semiconductor device and a semiconductor package which include a penetration via structure penetrating a semiconductor substrate.

DISCUSSION OF RELATED ART

A semiconductor device may include an integrated circuit including a plurality of metal-oxide semiconductor field-effect transistors (MOSFETs). To meet an increasing demand for a semiconductor device with a small pattern size and a reduced design rule, the MOSFETs are being aggressively scaled down. However, such scaling down may lead to deterioration in operational properties of the semiconductor device.

SUMMARY

Embodiments of the inventive concept provide a semiconductor device having increased reliability, which can be easily fabricated, and a semiconductor package including the same.

According to an embodiment of the inventive concept, a semiconductor device includes a semiconductor substrate having a first surface and a second surface, which are opposite to each other, an active pattern protruding from the first surface of the semiconductor substrate, the active pattern including a source/drain region, a power rail electrically connected to the source/drain region, a power delivery network disposed on the second surface of the semiconductor substrate, and a penetration via structure penetrating the semiconductor substrate and electrically connected to the power rail and the power delivery network. The penetration via structure includes a first conductive pattern connected to the power rail and a second conductive pattern connected to the power delivery network. The first conductive pattern includes a material different from the second conductive pattern.

According to an embodiment of the inventive concept, a semiconductor device includes a semiconductor substrate having a first surface and a second surface, which are opposite to each other, a transistor disposed on the first surface of the semiconductor substrate, a power rail electrically connected to a terminal of the transistor, a lower insulating layer disposed on the second surface of the semiconductor substrate, a plurality of lower interconnection lines disposed in the lower insulating layer, and a penetration via structure penetrating the semiconductor substrate and electrically connecting a corresponding one of the lower interconnection lines to the power rail. The penetration via structure extends from the second surface toward the first surface in a direction substantially perpendicular to the second surface of the semiconductor substrate. The penetration via structure includes a first conductive pattern electrically connected to the power rail and a second conductive pattern electrically connected to the corresponding lower interconnection line. The first conductive pattern includes a metal different from the second conductive pattern.

According to an embodiment of the inventive concept, a semiconductor package includes a lower semiconductor chip including a semiconductor substrate and a penetration via structure penetrating the semiconductor substrate, and an upper semiconductor chip disposed on the lower semiconductor chip. The upper semiconductor chip is electrically connected to the lower semiconductor chip through the penetration via structure. The penetration via structure includes a first conductive pattern penetrating a lower portion of the semiconductor substrate and a second conductive pattern penetrating an upper portion of the semiconductor substrate. The first conductive pattern includes a metal different from the second conductive pattern.

BRIEF DESCRIPTION OF THE DRAWINGS

The above and other features of the inventive concept will become more apparent by describing in detail embodiments thereof with reference to the accompanying drawings, in which.

DETAILED DESCRIPTION

Figure 1:
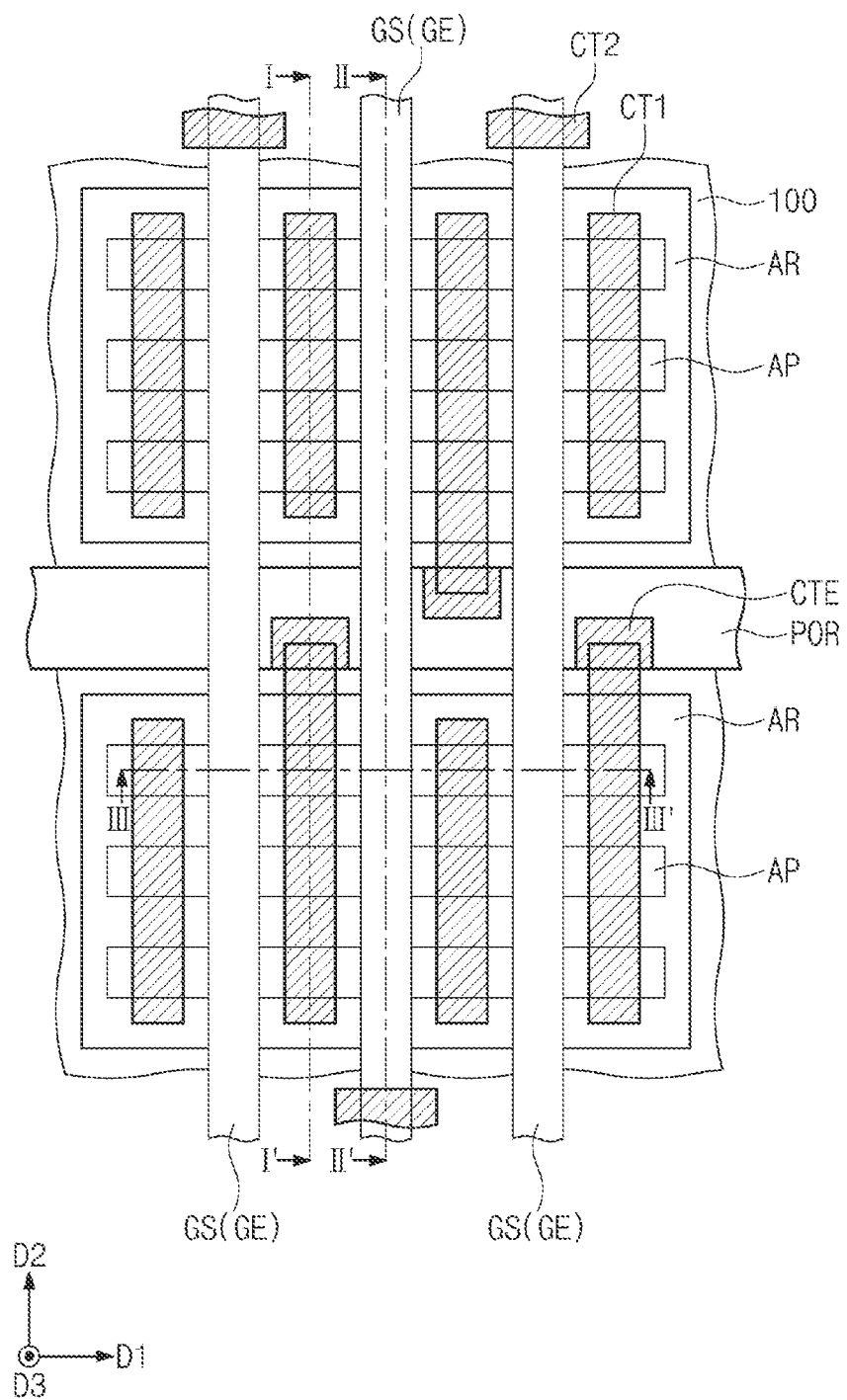
FIG. 1 is a plan view illustrating a semiconductor device according to an embodiment of the inventive concept.

Embodiments of the inventive concept will be described more fully hereinafter with reference to the accompanying drawings. Like reference numerals may refer to like elements throughout the accompanying drawings.

The terms "first," "second," "third," etc. are used herein to distinguish one element from another, and the elements are not limited by these terms. Thus, a "first" element in an embodiment may be described as a "second" element in another embodiment.

Descriptions of features or aspects within each embodiment should typically be considered as available for other similar features or aspects in other embodiments, unless the context clearly indicates otherwise.

As used herein, the singular forms "a", "an" and "the" are intended to include the plural forms as well, unless the context clearly indicates otherwise.

When two components or directions are described herein as extending substantially parallel or perpendicular to each other, the two components or directions extend exactly parallel or perpendicular to each other, or extend approximately parallel or perpendicular to each other within a measurement error (e.g., based on the limitations of the measurement system) as would be understood by a person having ordinary skill in the art. Other uses of the term "substantially" should be interpreted in a like fashion.

Figure 2A:
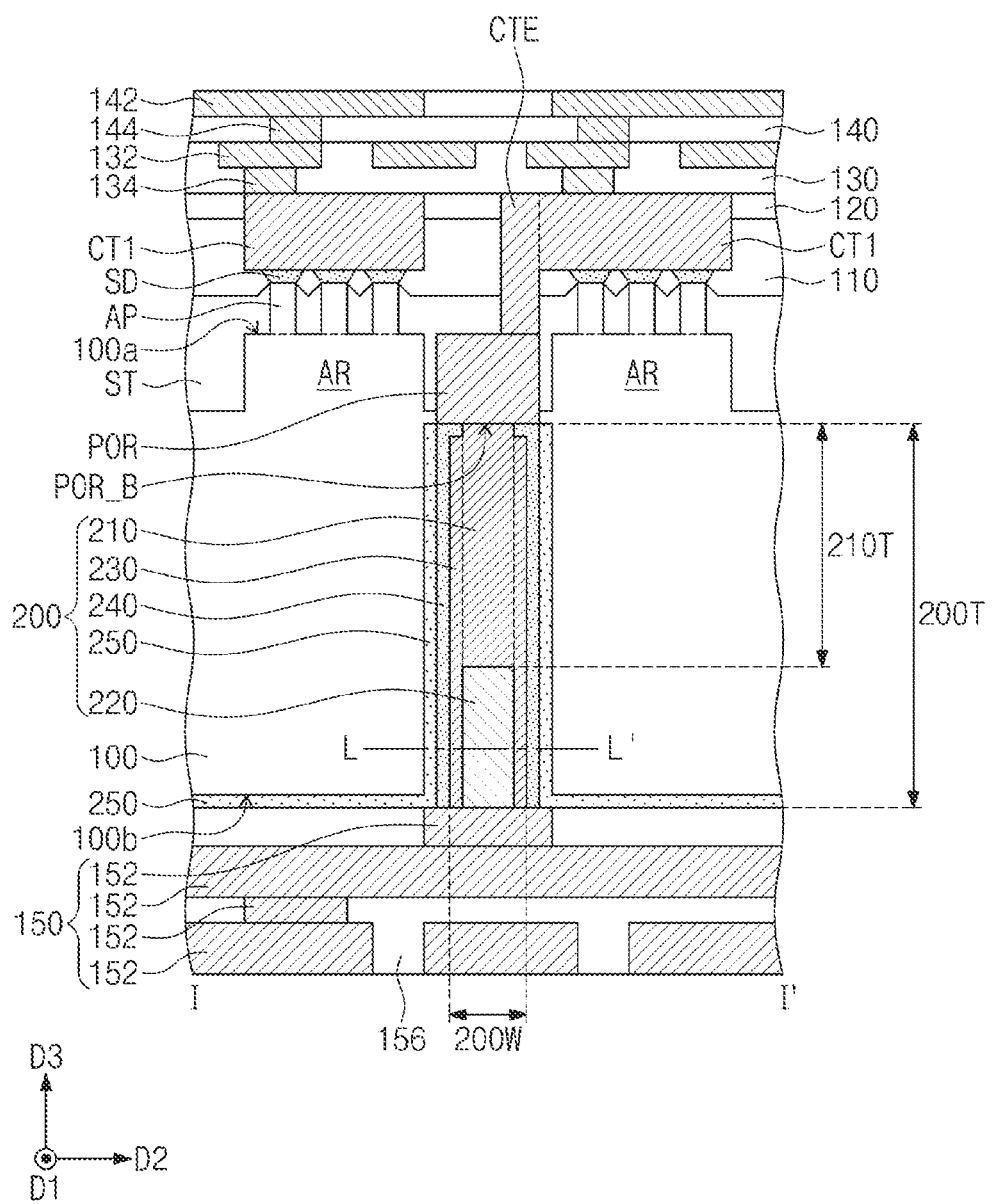
FIGS. 2A, 2B, and 2C are cross-sectional views of a semiconductor device according to an embodiment of the inventive concept, which are respectively taken along lines I-I', II-II', and III-III' of FIG. 1.
Figure 2B:
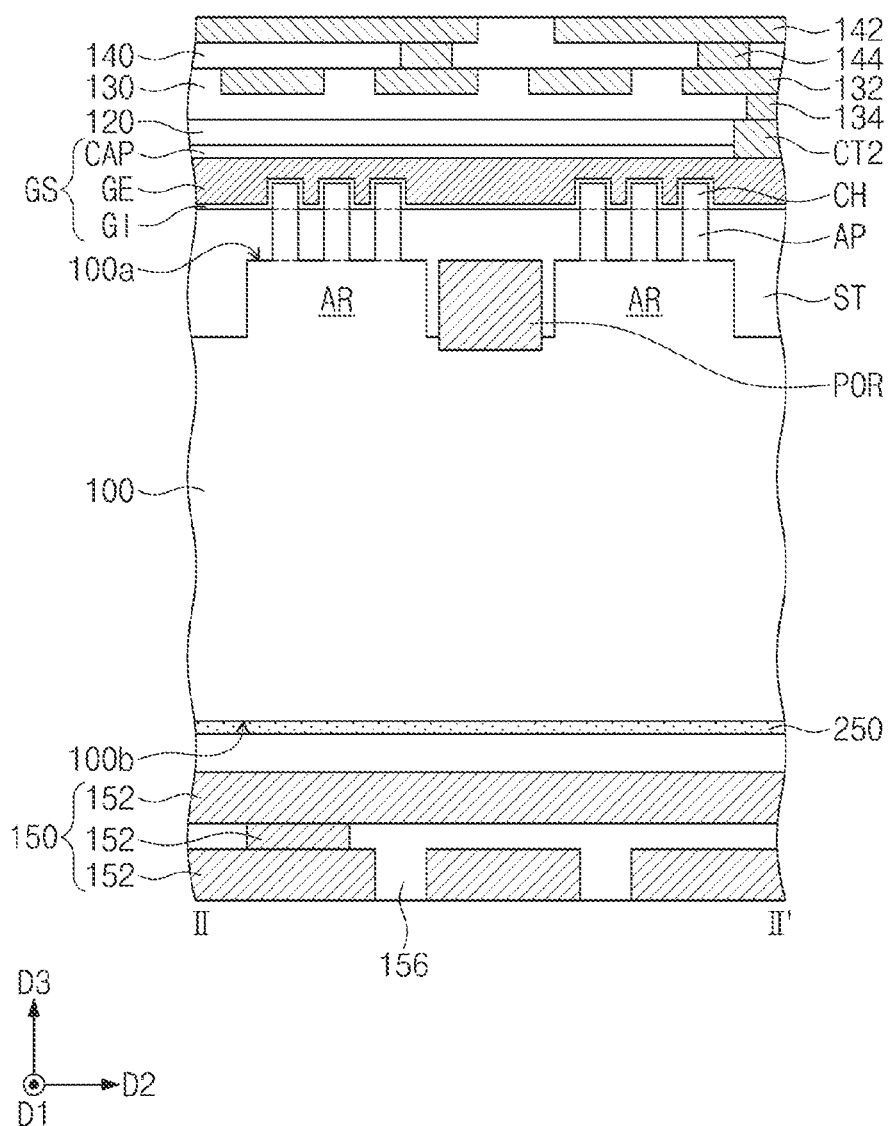
Figure 2C:
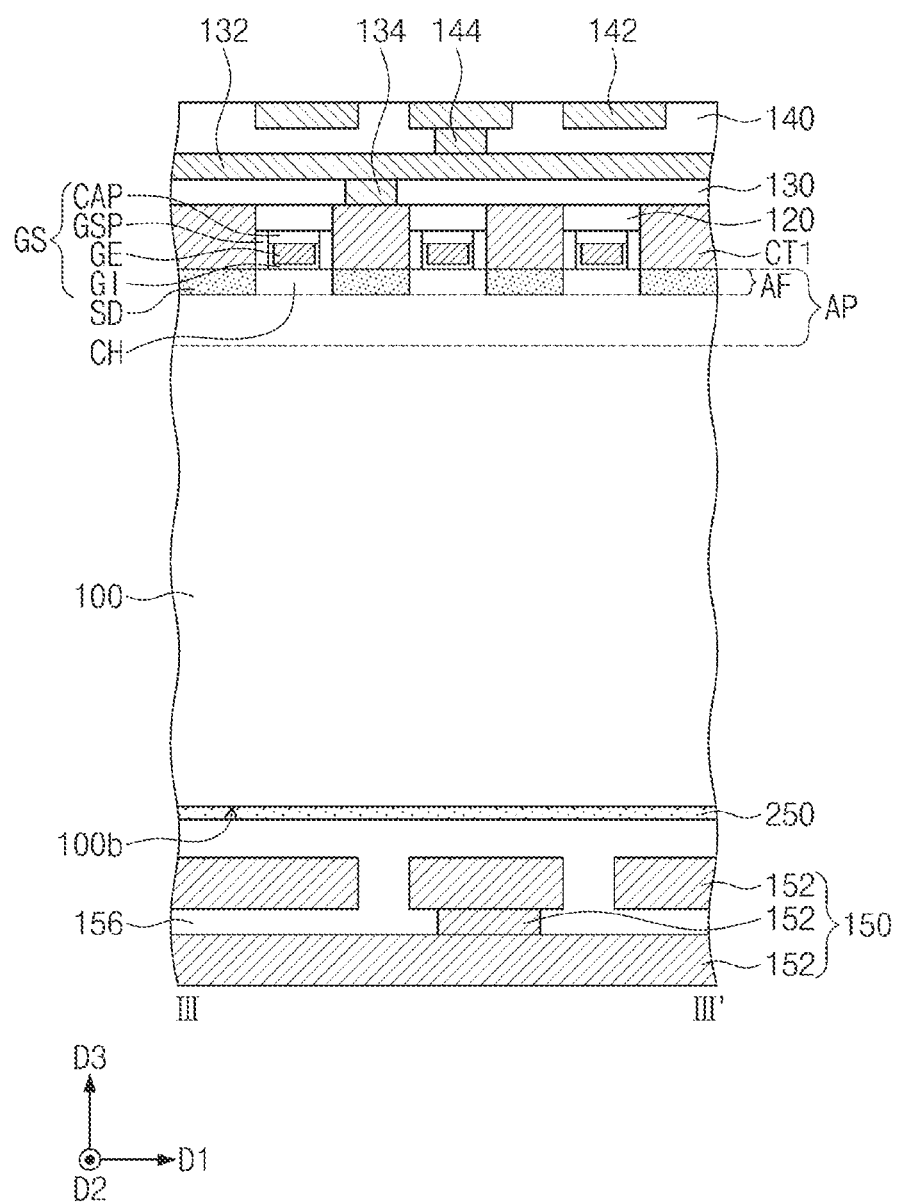
Figure 3:
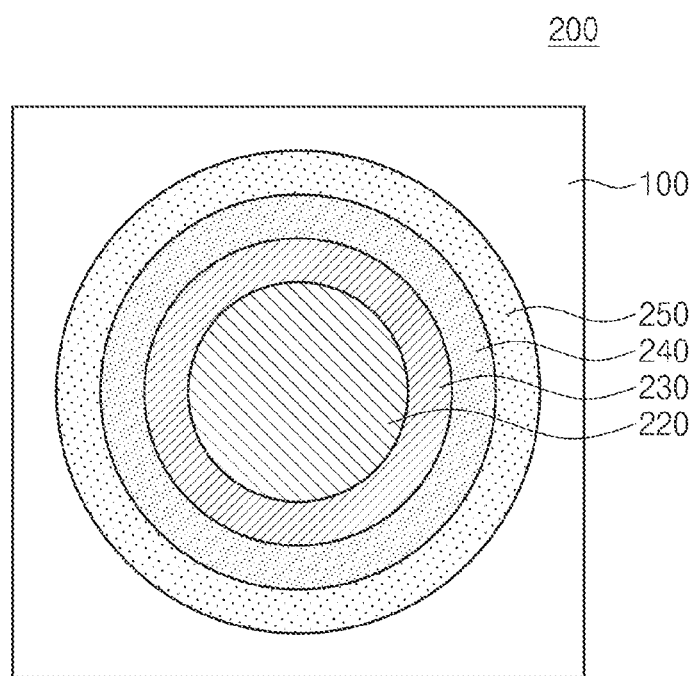
FIG. 3 is a plan view of a penetration via structure according to an embodiment of the inventive concept, taken along line L-L' of FIG. 2A.

FIG. 1 is a plan view illustrating a semiconductor device according to an embodiment of the inventive concept. FIGS. 2A, 2B, and 2C are cross-sectional views of a semiconductor device according to an embodiment of the inventive concept, which are respectively taken along lines I-I', II-II', and III-III' of FIG. 1. FIG. 3 is a plan view of a penetration via structure according to an embodiment of the inventive concept, taken along line L-L' of FIG. 2A.

Referring to FIGS. 1 and 2A to 2C, a semiconductor substrate 100 includes a first surface 100a and a second surface 100b, which are opposite to each other. The semiconductor substrate 100 may be, for example, a silicon wafer, a germanium wafer, or a silicon-germanium wafer.

A device isolation layer ST may be disposed in the semiconductor substrate 100 and adjacent to the first surface 100a to define active regions AR. The semiconductor substrate 100 may include the active regions AR defined by the device isolation layer ST. For example, the active regions AR may be separated from each other by the device isolation layer ST by way of a portion of the device isolation layer ST being disposed between adjacent active regions AR. The active regions AR may extend in a first direction D1 and may be spaced apart from each other in a second direction D2, with the device isolation layer ST interposed therebetween. The first and second directions D1 and D2 may be substantially parallel to the second surface 100b of the semiconductor substrate 100, and may cross each other. The active regions AR may be p-type metal-oxide semiconductor field-effect transistor (PMOSFET) or n-type metal-oxide semiconductor field-effect transistor (NMOSFET) regions. The device isolation layer ST may include at least one of, for example, a silicon oxide layer, a silicon nitride layer, or a silicon oxynitride layer.

In an embodiment, a power rail POR may be disposed in the device isolation layer ST between adjacent active regions AR. Between the active regions AR, the power rail POR may extend in the first direction D1 and may be buried in the device isolation layer ST. The power rail POR may be a line-shaped pattern extending in the first direction D1. For example, the power rail POR may have the shape of a substantially straight line extending in the first direction D1. The power rail POR may be formed of or include at least one of conductive materials (e.g., metals).

A plurality of active patterns AP may protrude from the first surface 100a of the semiconductor substrate 100. The active patterns AP may protrude from a top surface of each of the active regions AR (e.g., the first surface 100a of the semiconductor substrate 100) in a third direction D3, which is substantially perpendicular to the top surface of each of the active regions AR (e.g., the first surface 100a of the semiconductor substrate 100) For example, the first surface 100a of the semiconductor substrate 100 may be raised in the third direction D3, relative to other portions of the first surface 100a, in areas corresponding to the active regions AR to form the active regions AR. On each active region AR, the active patterns AP may extend in the first direction D1 and may be spaced apart from each other in the second direction D2. The device isolation layer ST may extend to a region on the top surface of each of the active regions AR to cover side surfaces of the active patterns AP. For example, the device isolation layer ST may cover side surfaces of the active regions AR, a portion of top surfaces of the active regions AR, and side surfaces of the active patterns AP. The active patterns AP may be spaced apart from each other in the second direction D2, with the device isolation layer ST interposed therebetween. In an embodiment, the active patterns AP may be portions of the semiconductor substrate 100 which protrude from the top surface of each of the active regions AR (e.g., the first surface 100a of the semiconductor substrate 100).

Each of the active patterns AP may include an active fin AF, which protrudes above the device isolation layer ST. In an embodiment, the active fin AF is not fully covered by the device isolation layer ST. In other words, the device isolation layer ST may partially cover the active fin AF, and thus, may expose at least a portion of the active fin AF. The active fin AF of each of the active patterns AP may include a channel region CH and source/drain regions SD. Thus, each active pattern may be described as including a source/drain region SD. The channel region CH may be interposed between the source/drain regions SD. The source/drain regions SD may be epitaxial patterns, which may be formed by a selective epitaxial growth process, in which each active pattern AP is used as a seed layer. The source/drain regions SD may be formed of or include at least one of, for example, silicon, silicon germanium, or silicon carbide. The channel region CH may be a portion of each active pattern AP which is interposed between the source/drain regions SD.

Gate structures GS may be provided on the first surface 100a of the semiconductor substrate 100 to cross the active patterns AP. The gate structures GS may extend in the second direction D2 and may be spaced apart from each other in the first direction D1. In an embodiment, the gate structures GS may extend in the second direction D2 to cross the power rail POR. Each of the gate structures GS may overlap the channel region CH of the active fin AF of each of the active patterns AP, when viewed in a plan view. Each of the gate structures GS may cover a top surface of the channel region CH and may cover side surfaces of the channel region CH, which are opposite to each other in the second direction D2. The source/drain regions SD may be disposed at both sides of each of the gate structures GS.

Each of the gate structures GS may include a gate electrode GE, a gate insulating pattern GI disposed between the gate electrode GE and the channel region CH, gate spacers GSP disposed on side surfaces of the gate electrode GE, and a gate capping pattern CAP disposed on a top surface of the gate electrode GE. The gate insulating pattern GI may extend into a region between the gate electrode GE and the gate spacers GSP, and the topmost surface of the gate insulating pattern GI may be substantially coplanar with the top surface of the gate electrode GE. For example, the topmost surface of the gate insulating pattern GI and the top surface of the gate electrode GE may be substantially aligned with each other. The gate electrode GE may cover the top surface of the channel region CH, may cover side surfaces of the channel region CH, which are opposite to each other in the second direction D2, and may extend to a region on a top surface of the device isolation layer ST. The gate insulating pattern GI may be interposed between the gate electrode GE and the top surface of the channel region CH and between the gate electrode GE and each of the opposite side surfaces of the channel region CH in the second direction D2, and may extend to a region between the top surface of the device isolation layer ST and the gate electrode GE. The gate electrode GE, the channel region CH, and the source/drain regions SD may constitute a fin field effect transistor. Thus, a transistor may be disposed on the first surface 100a of the semiconductor substrate 100. In addition, since the power rail POR may be electrically connected to a source/drain region SD, as described further below, the power rail POR may be electrically connected to a terminal of the transistor (e.g., a S/D terminal of the transistor).

The gate electrode GE may be formed of or include at least one of, for example, doped semiconductor materials, conductive metal nitrides, and/or metallic materials. The gate insulating pattern GI may be formed of or include at least one of, for example, silicon oxide, silicon nitride, silicon oxynitride, or high-k dielectric materials. The high-k dielectric materials may include materials (e.g., hafnium oxide (HfO), aluminum oxide (A1O), or tantalum oxide (TaO)) whose dielectric constants are higher than silicon oxide. Each of the gate spacers GSP and the gate capping pattern CAP may include at least one of, for example, a silicon oxide layer, a silicon nitride layer, or a silicon oxynitride layer.

A first interlayer insulating layer 110 may be disposed on the first surface 100a of the semiconductor substrate 100 to cover the gate structure GS and the source/drain regions SD. The first interlayer insulating layer 110 may cover the top surface of the device isolation layer ST. A top surface of the first interlayer insulating layer 110 may be substantially coplanar with a top surface of the gate capping pattern CAP. For example, the top surface of the first interlayer insulating layer 110 and the top surface of the gate capping pattern CAP may be substantially aligned with each other. The gate spacer GSP may be interposed between the gate capping pattern CAP and the first interlayer insulating layer 110. A second interlayer insulating layer 120 may be disposed on the first interlayer insulating layer 110. The second interlayer insulating layer 120 may cover the top surface of the gate capping pattern CAP. At least one of the first and second interlayer insulating layers 110 and 120 may include at least one of, for example, a silicon oxide layer, a silicon nitride layer, a silicon oxynitride layer, or low-k dielectric layers.

First contacts CT1 may penetrate the first and second interlayer insulating layers 110 and 120 and may be connected to the source/drain regions SD. The first contacts CT1 may be disposed at both sides of each gate structure GS and may be bar-shaped patterns extending in the second direction D2. Each of the first contacts CT1 may be connected to a plurality of the source/drain regions SD, which are spaced apart from each other in the second direction D2. At least one of the first contacts CT1 may be connected to the power rail POR. Thus, the power rail POR may be electrically connected to at least one of the plurality of source/drain regions SD via at least one of the first contacts CT1. As an example, the at least one of the first contacts CT1 may include a contact extended portion CTE, which penetrates an upper portion of the device isolation layer ST and is connected to the power rail POR. The contact extended portion CTE may be vertically extended from one side of the at least one of the first contacts CT1 toward the power rail POR to penetrate the second interlayer insulating layer 120, the first interlayer insulating layer 110, and the upper portion of the device isolation layer ST, and to be connected to the power rail POR. The contact extended portion CTE may be formed of or include the same material as the at least one of the first contacts CT1, and the contact extended portion CTE and the at least one of the first contacts CT1 may be connected to form a single object (or a unitary body). Thus, at least one of the source/drain regions SD may be electrically connected to the power rail POR via a first contact CT1 and a corresponding contact extended portion CTE electrically connected to the first contact CT1 and the power rail POR.

Second contacts CT2 may be disposed in the second interlayer insulating layer 120. Each of the second contacts CT2 may penetrate the second interlayer insulating layer 120 and the gate capping pattern CAP and may be connected to the gate electrode GE. Top surfaces of the first and second contacts CT1 and CT2 may be substantially coplanar with the top surface of the second interlayer insulating layer 120. For example, the top surfaces of the first and second contacts CT1 and CT2 may be located at substantially the same height as the top surface of the second interlayer insulating layer 120, when measured from the first surface 100a of the semiconductor substrate 100. The first and second contacts CT1 and CT2 may be formed of or include the same conductive material. The first and second contacts CT1 and CT2 may include at least one of metallic materials (e.g., aluminum, copper, tungsten, molybdenum, and cobalt).

A third interlayer insulating layer 130 may be provided on the second interlayer insulating layer 120 to cover the top surfaces of the first and second contacts CT1 and CT2. First upper interconnection lines 132 and first upper vias 134 may be disposed in the third interlayer insulating layer 130. The first upper interconnection lines 132 may penetrate an upper portion of the third interlayer insulating layer 130, and top surfaces of the first upper interconnection lines 132 may be substantially coplanar with a top surface of the third interlayer insulating layer 130. In other words, the top surfaces of the first upper interconnection lines 132 may be located at substantially the same height as the top surface of the third interlayer insulating layer 130, when measured from the first surface 100a of the semiconductor substrate 100. The first upper vias 134 may be disposed between the first contacts CT1 and the first upper interconnection lines 132 and between the second contacts CT2 and the first upper interconnection lines 132, and may penetrate a lower portion of the third interlayer insulating layer 130. Each of the first and second contacts CT1 and CT2 may be electrically connected to a corresponding one of the first upper interconnection lines 132 through a corresponding one of the first upper vias 134.

A fourth interlayer insulating layer 140 may be disposed on the third interlayer insulating layer 130 to cover the top surfaces of the first upper interconnection lines 132. Second upper interconnection lines 142 and second upper vias 144 may be disposed in the fourth interlayer insulating layer 140. The second upper interconnection lines 142 may penetrate an upper portion of the fourth interlayer insulating layer 140, and top surfaces of the second upper interconnection lines 142 may be substantially coplanar with a top surface of the fourth interlayer insulating layer 140. In other words, the top surfaces of the second upper interconnection lines 142 may be located at substantially the same height as the top surface of the fourth interlayer insulating layer 140, when measured from the first surface 100a of the semiconductor substrate 100. The second upper vias 144 may be disposed between the first upper interconnection lines 132 and the second upper interconnection lines 142 to penetrate a lower portion of the fourth interlayer insulating layer 140. Each of the first upper interconnection lines 132 may be electrically connected to a corresponding one of the second upper interconnection lines 142 through a corresponding one of the second upper vias 144.

In an embodiment, the third interlayer insulating layer 130 and the fourth interlayer insulating layer 140 may include at least one of, for example, a silicon oxide layer, a silicon nitride layer, a silicon oxynitride layer, or low-k dielectric layers. The first and second upper interconnection lines 132 and 142 and the first and second upper vias 134 and 144 may be formed of or include at least one of metallic materials or conductive metal nitrides.

A power delivery network 150 may be disposed on the second surface 100b of the semiconductor substrate 100. The power delivery network 150 may include lower interconnection lines 152 disposed on the second surface 100b of the semiconductor substrate 100. Thus, the power delivery network 150 may also be referred to herein as a power delivery interconnection layer. The lower interconnection lines 152 may be formed of or include a metallic material (e.g., copper). A lower insulating layer 156 may be disposed on the second surface 100b of the semiconductor substrate 100 to cover the power delivery network 150. In other words, the lower insulating layer 156 may cover the lower interconnection lines 152, and the lower interconnection lines 152 may be disposed in the lower insulating layer 156. The lower insulating layer 156 may include at least one of, for example, a silicon oxide layer, a silicon nitride layer, a silicon oxynitride layer, or low-k dielectric layers.

A penetration via structure 200 may penetrate the semiconductor substrate 100 and may be connected to the power rail POR and the power delivery network 150. The penetration via structure 200 may be connected to a corresponding one of the lower interconnection lines 152 and may be vertically extended in the third direction D3 to be connected to a bottom surface POR_B of the power rail POR. The penetration via structure 200 may be in direct contact with the bottom surface POR_B of the power rail POR. The third direction D3 may be substantially perpendicular to the second surface 100b of the semiconductor substrate 100.

Referring to FIGS. 2A and 3, the penetration via structure 200 may include a first conductive pattern 210 connected to the power rail POR and a second conductive pattern 220 connected to the power delivery network 150. The first conductive pattern 210 may pass through a portion of the semiconductor substrate 100, and may be in contact with, and electrically connected to, the bottom surface POR_B of the power rail POR. The second conductive pattern 220 may pass through another portion of the semiconductor substrate 100 and may be connected to the corresponding lower interconnection line 152. The first and second conductive patterns 210 and 220 may be in direct contact with each other. Each of the first and second conductive patterns 210 and 220 may be, for example, a pillar-shaped pattern.

The first and second conductive patterns 210 and 220 may be formed of or include different materials. For example, the first and second conductive patterns 210 and 220 may be formed of or include different metallic materials. The second conductive pattern 220 may be formed of or include a metallic material whose resistance is lower than the first conductive pattern 210. As an example, the second conductive pattern 220 may be formed of or include copper (Cu), and the first conductive pattern 210 may be formed of or include at least one of non-copper metals. The first conductive pattern 210 may be formed of or include at least one of, for example, cobalt (Co), ruthenium (Ru), molybdenum (Mo), or tungsten (W).

The penetration via structure 200 may further include a barrier pattern 240, which is interposed between the semiconductor substrate 100 and the first conductive pattern 210 and extends into a region between the semiconductor substrate 100 and the second conductive pattern 220. An end of the barrier pattern 240 may be in contact with the bottom surface POR_B of the power rail POR, and an opposite end of the barrier pattern 240 may be in contact with the corresponding lower interconnection line 152. When viewed in a plan view, the barrier pattern 240 may enclose an outer circumference surface of each of the first and second conductive patterns 210 and 220. The barrier pattern 240 may have a hollow cylinder shape, and the first and second conductive patterns 210 and 220 may be disposed in the barrier pattern 240 within the hollow portion. The barrier pattern 240 may be formed of or include at least one of, for example, tantalum (Ta) or tantalum nitride (TaN).

The penetration via structure 200 may further include a seed pattern 230 interposed between the barrier pattern 240 and the second conductive pattern 220. The seed pattern 230 may extend into a region between the barrier pattern 240 and the first conductive pattern 210. In an embodiment, an end of the seed pattern 230 may be spaced apart from the bottom surface POR_B of the power rail POR, with a portion of the barrier pattern 240 interposed therebetween. In this case, the first conductive pattern 210 may pass through the portion of the barrier pattern 240 and may be in contact with, and electrically connected to, the bottom surface POR_B of the power rail POR. An opposite end of the seed pattern 230 may be in contact with the corresponding lower interconnection line 152. When viewed in a plan view, the seed pattern 230 may enclose an outer circumference surface of each of the first and second conductive patterns 210 and 220. The seed pattern 230 may have a hollow cylinder shape, and the first and second conductive patterns 210 and 220 may be disposed in the seed pattern 230 within the hollow portion.

In an embodiment, the seed pattern 230 may be formed of or include a material different from the second conductive pattern 220. For example, the seed pattern 230 may be formed of or include a metallic material different from the second conductive pattern 220. As an example, the second conductive pattern 220 may be formed of or include copper (Cu), and the seed pattern 230 may be formed of or include at least one of non-copper metals. The seed pattern 230 may be formed of or include at least one of, for example, cobalt (Co), ruthenium (Ru), molybdenum (Mo), or tungsten (W). The seed pattern 230 may be formed of or include the same material or the same metallic material as the first conductive pattern 210. In this case, the seed pattern 230 and the first conductive pattern 210 may form a single object (or a unitary body or a single pattern) without any interfacial surface. For example, in an embodiment of the inventive concept, the seed pattern 230 and the first conductive pattern 210 may form a single object (or a single pattern) that does not include an interface or boundary between the seed pattern 230 and the first conductive pattern 210.

The penetration via structure 200 may further include an insulating pattern 250 interposed between the semiconductor substrate 100 and the barrier pattern 240. The barrier pattern 240 may be spaced apart from the semiconductor substrate 100 with the insulating pattern 250 interposed therebetween. The insulating pattern 250 may have a hollow cylinder shape, and the barrier pattern 240, the seed pattern 230, and the first and second conductive patterns 210 and 220 may be disposed in the insulating pattern 250 within the hollow portion. In an embodiment, the insulating pattern 250 may extend into a region between the second surface 100b of the semiconductor substrate 100 and the lower insulating layer 156. In an embodiment, the insulating pattern 250 may be formed of or include silicon oxide.

The penetration via structure 200 may have a vertical length in the third direction D3. A vertical length 200T of the penetration via structure 200 may be about 500 nm to about 700 nm, and a vertical length 210T of the first conductive pattern 210 may be about 200 nm to about 400 nm. A ratio R of the vertical length 210T of the first conductive pattern 210 to the vertical length 200T of the penetration via structure 200 (e.g., R=210T/200T) may range from about 0.2 to about 0.9. In an embodiment, the ratio R may be equal to or greater than about 0.5 and may be smaller than about 0.9. The penetration via structure 200 may have a width in a direction (e.g., the second direction D2) substantially parallel to the second surface 100b of the semiconductor substrate 100. In an embodiment, a width 200W of the penetration via structure 200 may be about 40 nm to about 100 nm. In this case, the width 200W may be a width of the penetration via structure 200, from which the insulating pattern 250 and the barrier pattern 240 are excluded.

Referring back to FIGS. 1 and 2A to 2C, the power rail POR may be electrically connected to the power delivery network 150 through the penetration via structure 200. In other words, the power rail POR may be electrically connected to a corresponding one of the lower interconnection lines 152 through the penetration via structure 200. The power delivery network 150 may apply a power voltage VDD or a ground voltage VSS to the power rail POR through the penetration via structure 200. The power rail POR may apply the power voltage VDD or the ground voltage VSS to a corresponding one of the first contacts CT1.

The penetration via structure 200 may be formed by depositing a conductive material in a penetration hole penetrating the semiconductor substrate 100. Referring to a comparative example, as an aspect ratio of the penetration via structure 200 increases, a difficulty in the deposition process to fill the penetration hole with the conductive material may increase. In addition, it may be desirable to reduce electric resistance of the penetration via structure 200, for an electric connection between the power rail POR and the power delivery network 150.

According to an embodiment of the inventive concept, the penetration via structure 200 may include the first and second conductive patterns 210 and 220, which are formed of or include different materials (e.g., different metals) from each other. According to an embodiment of the inventive concept, the seed pattern 230 may be formed of or include the same material as one of the first and second conductive patterns 210 and 220, and thus, may be formed of or include a different material from the other one of the first and second conductive patterns 210 and 220. According to an embodiment of the inventive concept, the first and second conductive patterns 210 and 220 may be formed of or include an entirely different material(s) from each other and do not have any of the same material(s) in common. During the deposition process to form the penetration via structure 200, the first conductive pattern 210 may be formed of or include material (e.g., a non-copper metal) which can more easily fill the penetration hole in the semiconductor substrate 100, compared with the second conductive pattern 220. Thus, according to embodiments of the inventive concept, difficulty in performing the deposition process to form the penetration via structure 200 may be reduced. The second conductive pattern 220 may be formed of or include a material (e.g., copper) whose resistance is lower than the first conductive pattern 210, and in this case, a total resistance of the penetration via structure 200 may be reduced.

In addition, since the first conductive pattern 210 is formed closer to the first surface 100a of the semiconductor substrate 100 than the second conductive pattern 220 is, copper, which is contained in the second conductive pattern 220, may be prevented or suppressed from being diffused into a transistor formed on the first surface 100a of the semiconductor substrate 100. Accordingly, deterioration in characteristics of the transistor caused by the diffusion of copper may be prevented or reduced.

Thus, embodiments of the inventive concept provide a semiconductor device having increased reliability, which can be easily fabricated.

Figure 4:
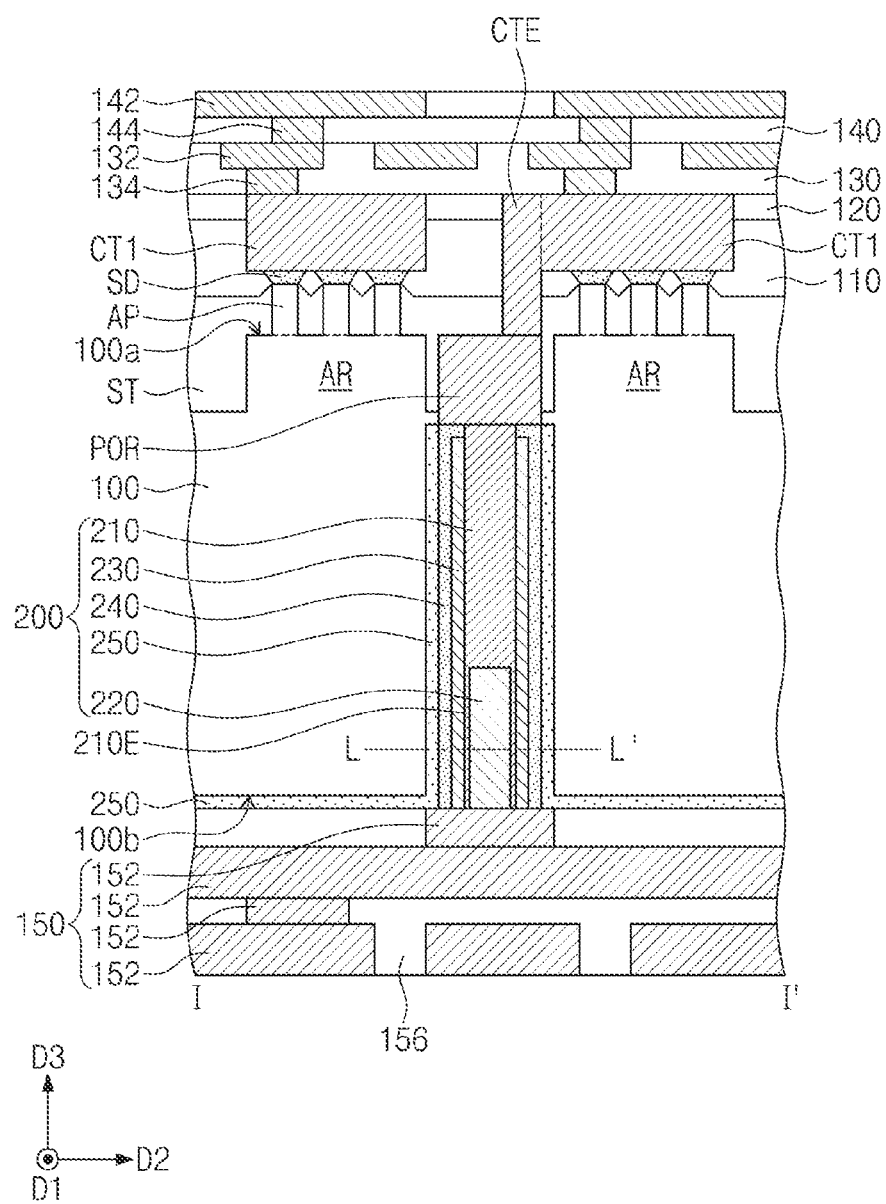
FIG. 4 is a cross-sectional view illustrating a semiconductor device according to an embodiment of the inventive concept, taken along line I-I' of FIG. 1.
Figure 5:
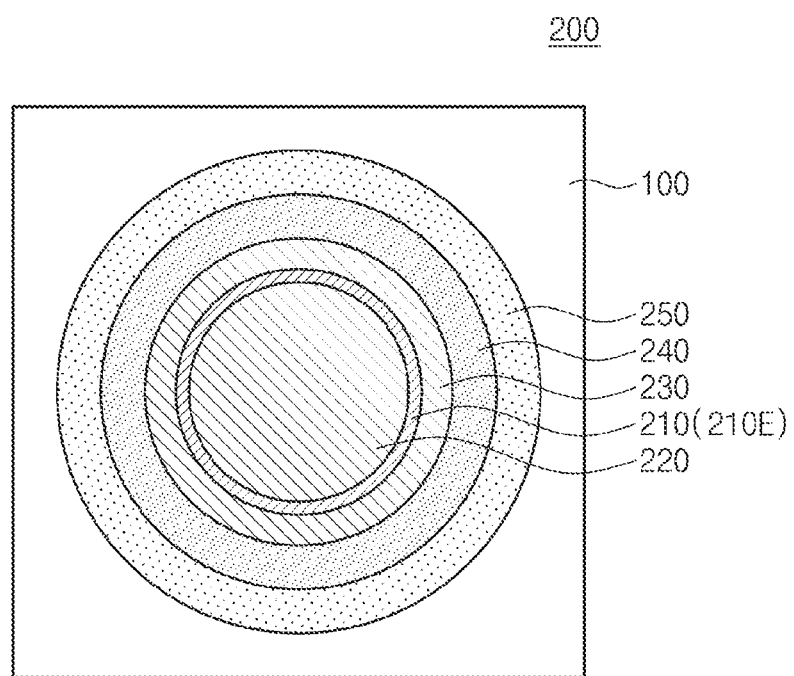
FIG. 5 is a plan view of a penetration via structure according to an embodiment of the inventive concept, taken along line L-L' of FIG. 4.

FIG. 4 is a cross-sectional view illustrating a semiconductor device according to an embodiment of the inventive concept, taken along line I-I' of FIG. 1. FIG. 5 is a plan view of a penetration via structure according to an embodiment of the inventive concept, taken along line L-L' of FIG. 4. For convenience of explanation, features which are different from the semiconductor device of FIGS. 1, 2A to 2C, and 3, will be mainly described below, and a further description of features previously described may be omitted.

Referring to FIGS. 4 and 5, the penetration via structure 200 may further include the seed pattern 230 interposed between the barrier pattern 240 and the second conductive pattern 220. The seed pattern 230 may extend into a region between the barrier pattern 240 and the first conductive pattern 210. In an embodiment, the seed pattern 230 may be formed of or include the same material as the second conductive pattern 220. The seed pattern 230 may be formed of or include the same metal as the second conductive pattern 220. As an example, the seed pattern 230 and the second conductive pattern 220 may be formed of or include copper. The first conductive pattern 210 may be formed of or include a material (e.g., metal) which is different from the seed pattern 230 and the second conductive pattern 220. The first conductive pattern 210 may be formed of or include at least one of, for example, cobalt (Co), ruthenium (Ru), molybdenum (Mo), or tungsten (W).

The first conductive pattern 210 may include an extended portion 210E, which extends into a region between the seed pattern 230 and the second conductive pattern 220.

When viewed in a plan view, the extended portion 210E of the first conductive pattern 210 may enclose an outer circumference surface of the second conductive pattern 220. In an embodiment, the first conductive pattern 210 may have a pillar shape, and the extended portion 210E of the first conductive pattern 210 may have a hollow cylinder shape. The second conductive pattern 220 may be disposed in the extended portion 210E of the first conductive pattern 210 within the hollow portion. An end of the extended portion 210E of the first conductive pattern 210 may be in contact with the corresponding lower interconnection line 152.

Except for the differences described above, the penetration via structure 200 may have substantially the same features as the penetration via structure 200 described with reference to FIGS. 1, 2A to 2C, and 3.

Figure 6:
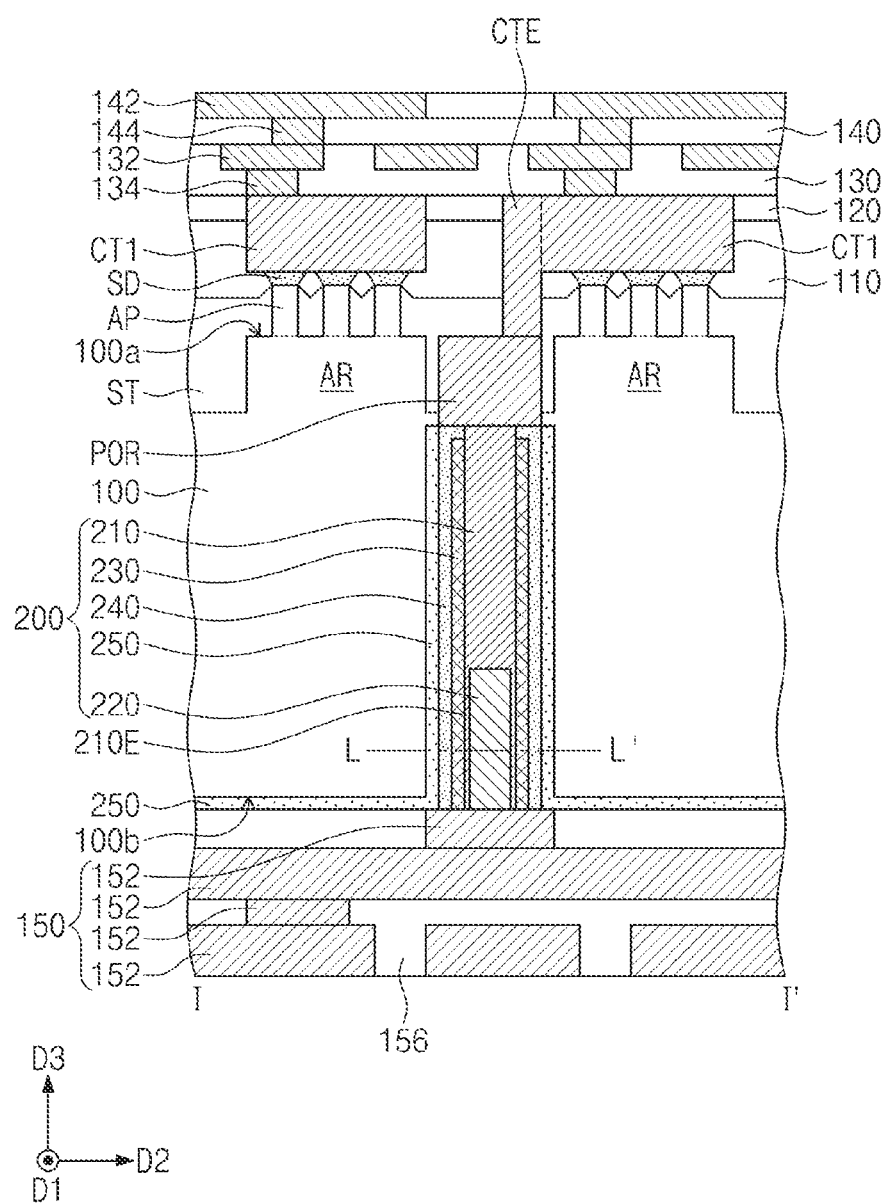
FIG. 6 is a cross-sectional view illustrating a semiconductor device according to an embodiment of the inventive concept, taken along line I-I' of FIG. 1.
Figure 7:
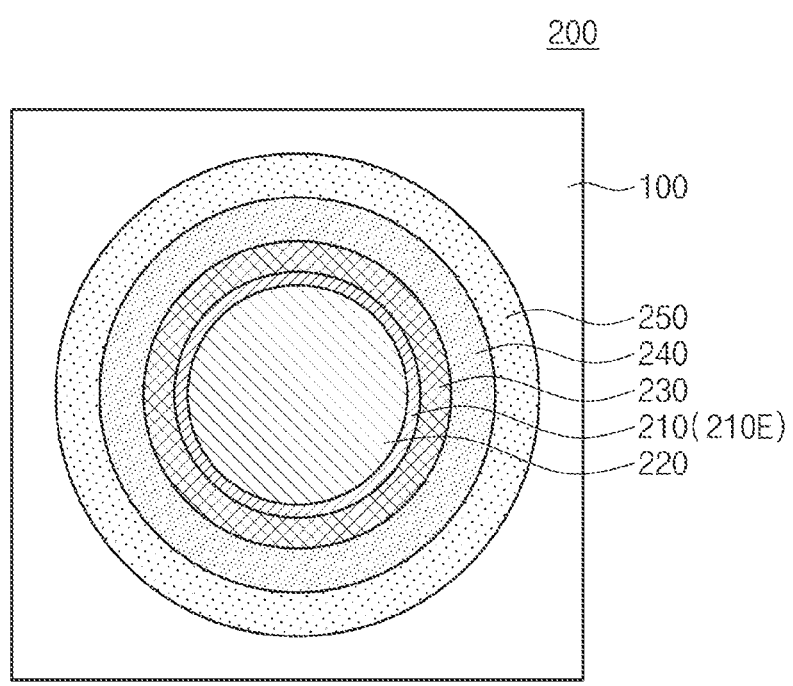
FIG. 7 is a plan view of a penetration via structure according to an embodiment of the inventive concept, taken along line L-L' of FIG. 6.
Figure 8A:
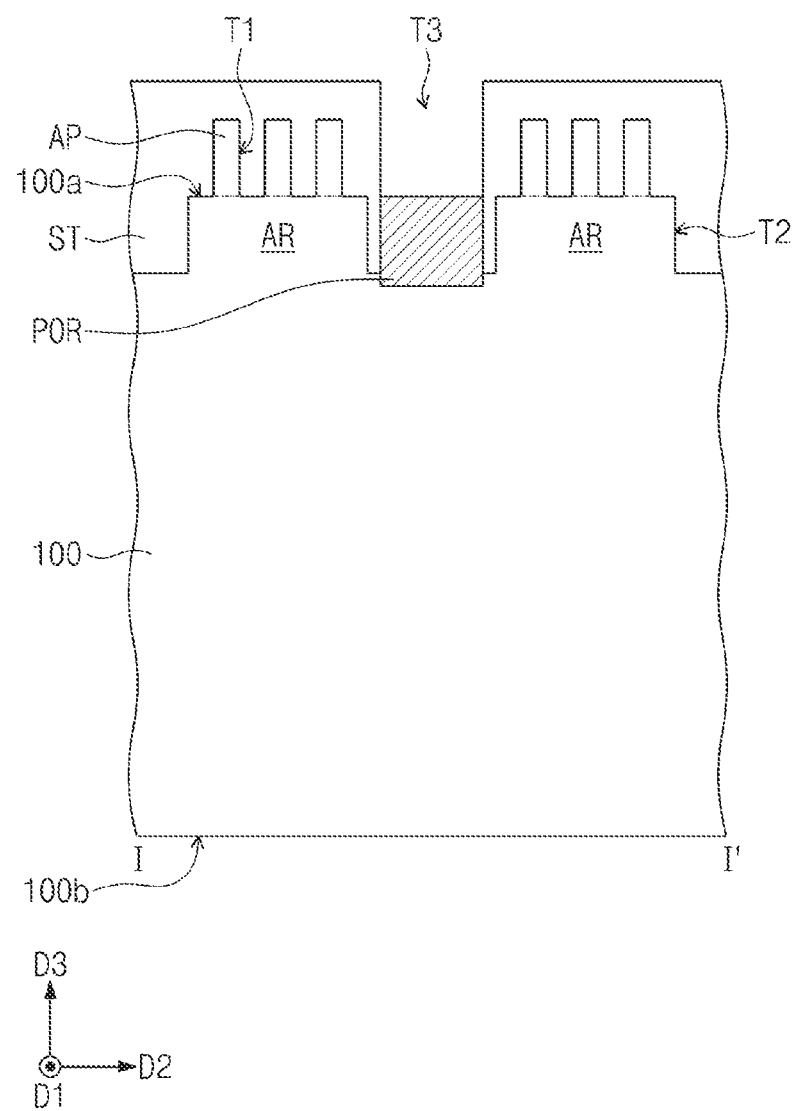
FIGS. 8A, 9A, 10A, 11A, 12A, 13A, 14A, 15A and 16A are cross-sectional views illustrating a method of fabricating a semiconductor device according to an embodiment of the inventive concept and corresponding to line I-I' of FIG. 1.
Figure 8B:
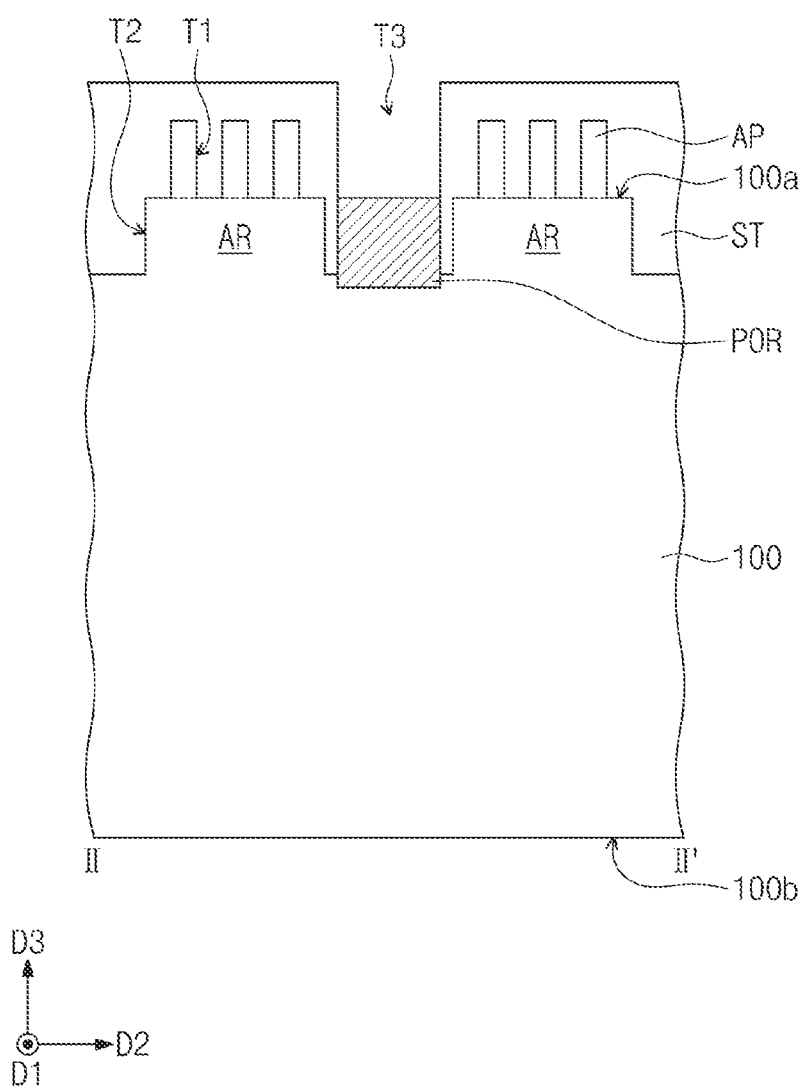
FIGS. 8B, 9B, 10B, 11B, 12B, 13B, 14B, 15B and 16B are cross-sectional views illustrating a method of fabricating a semiconductor device according to an embodiment of the inventive concept and corresponding to line II-II' of FIG. 1.
Figure 8C:
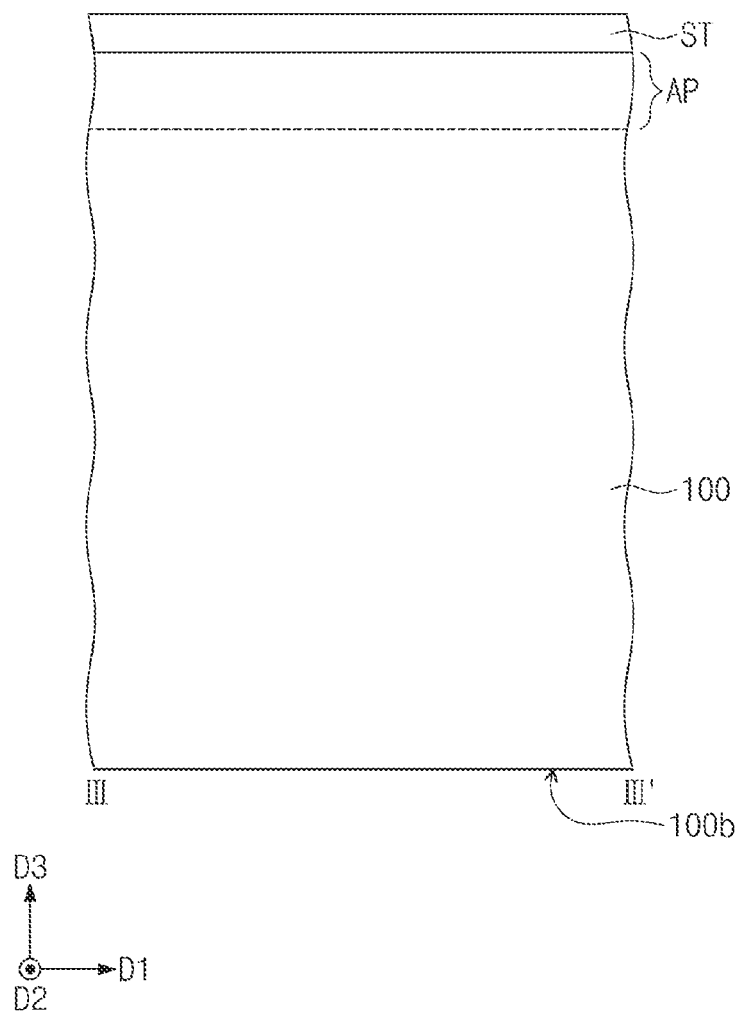
FIGS. 8C, 9C, 10C, 11C, 12C, 13C, 14C, 15C and 16C are cross-sectional views illustrating a method of fabricating a semiconductor device according to an embodiment of the inventive concept and corresponding to line III-III' of FIG. 1.
Figure 9A:
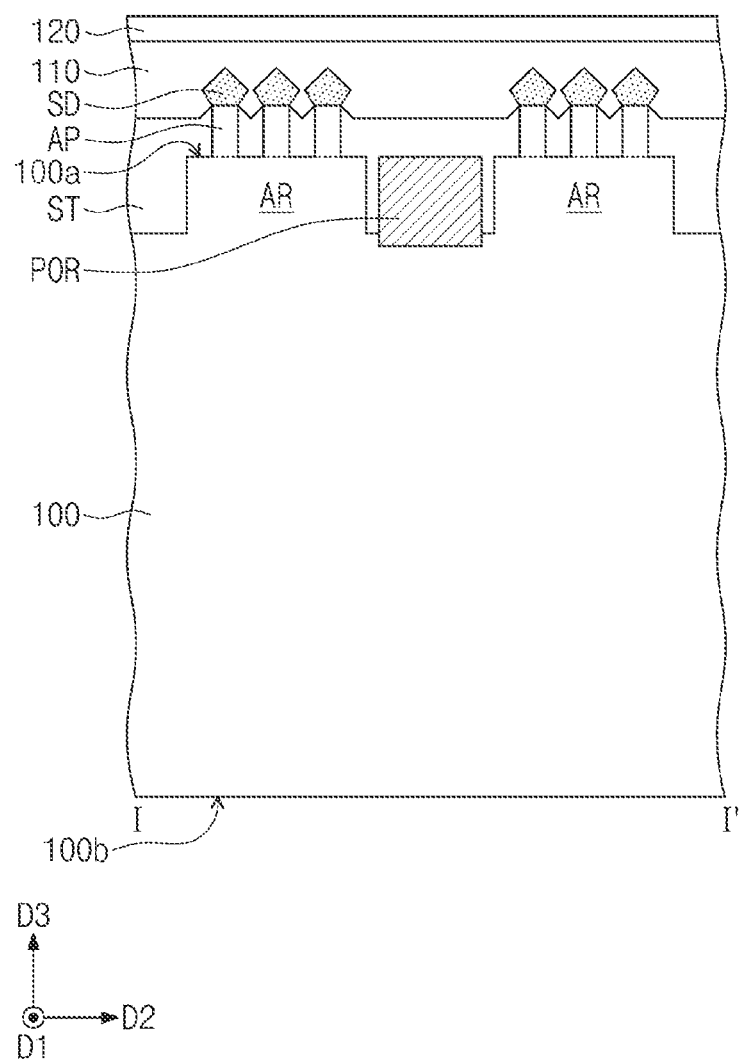
Figure 9B:
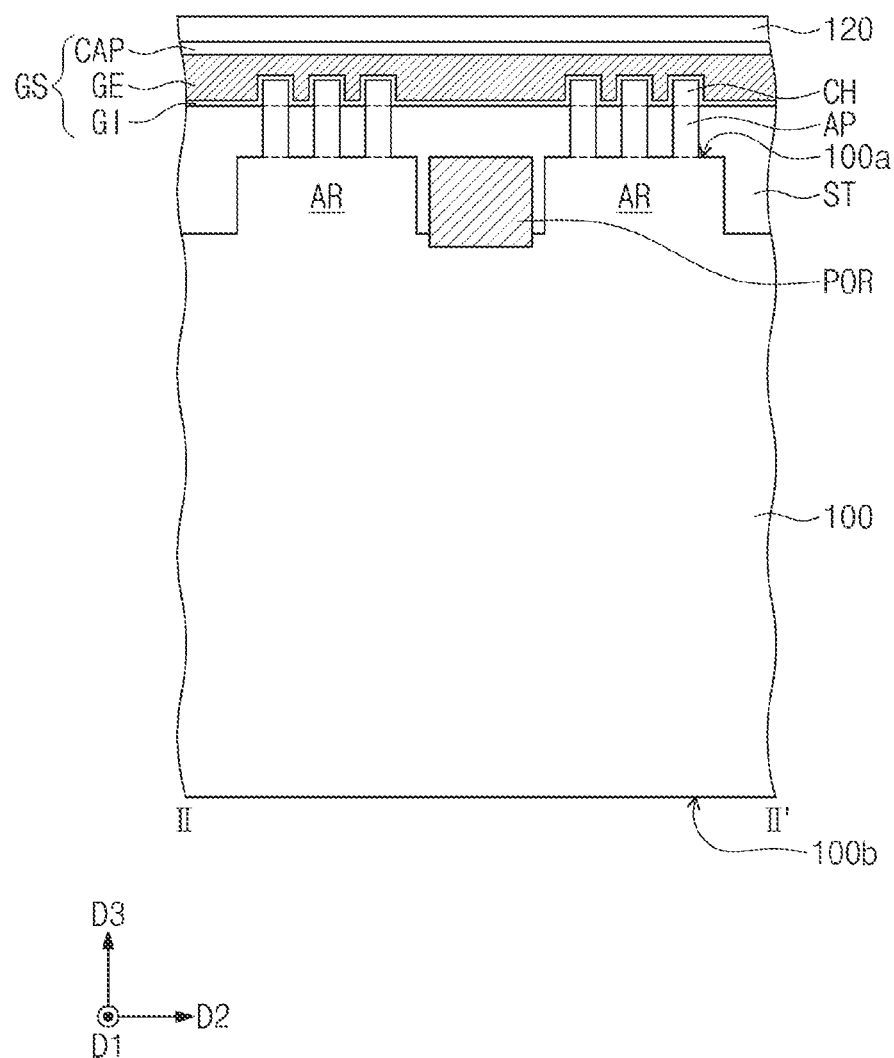
Figure 9C:
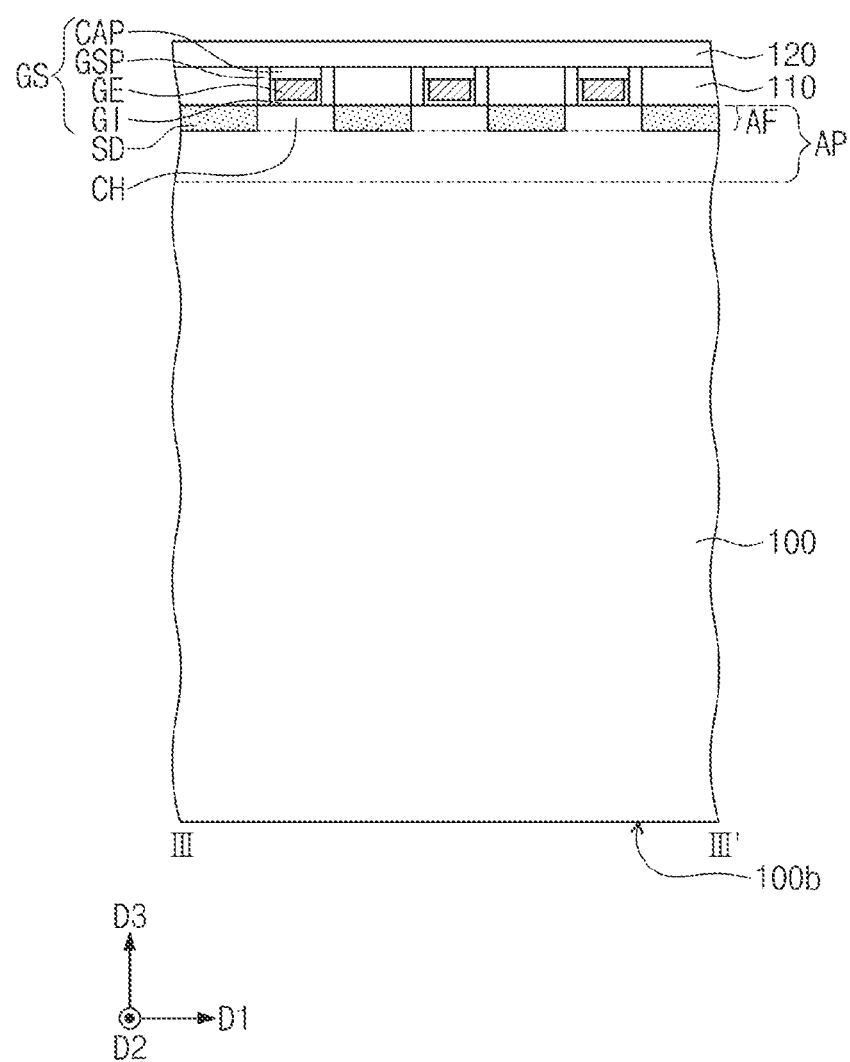
Figure 10A:
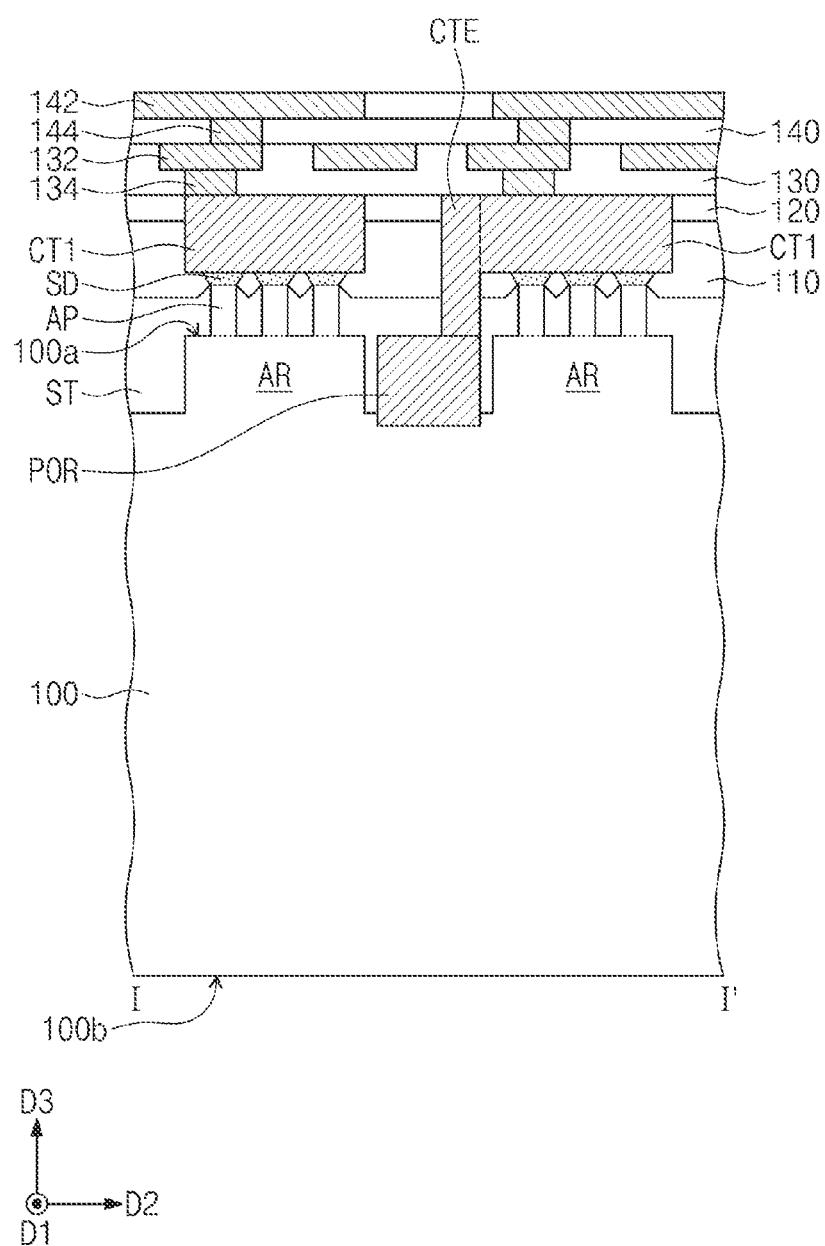
Figure 10B:
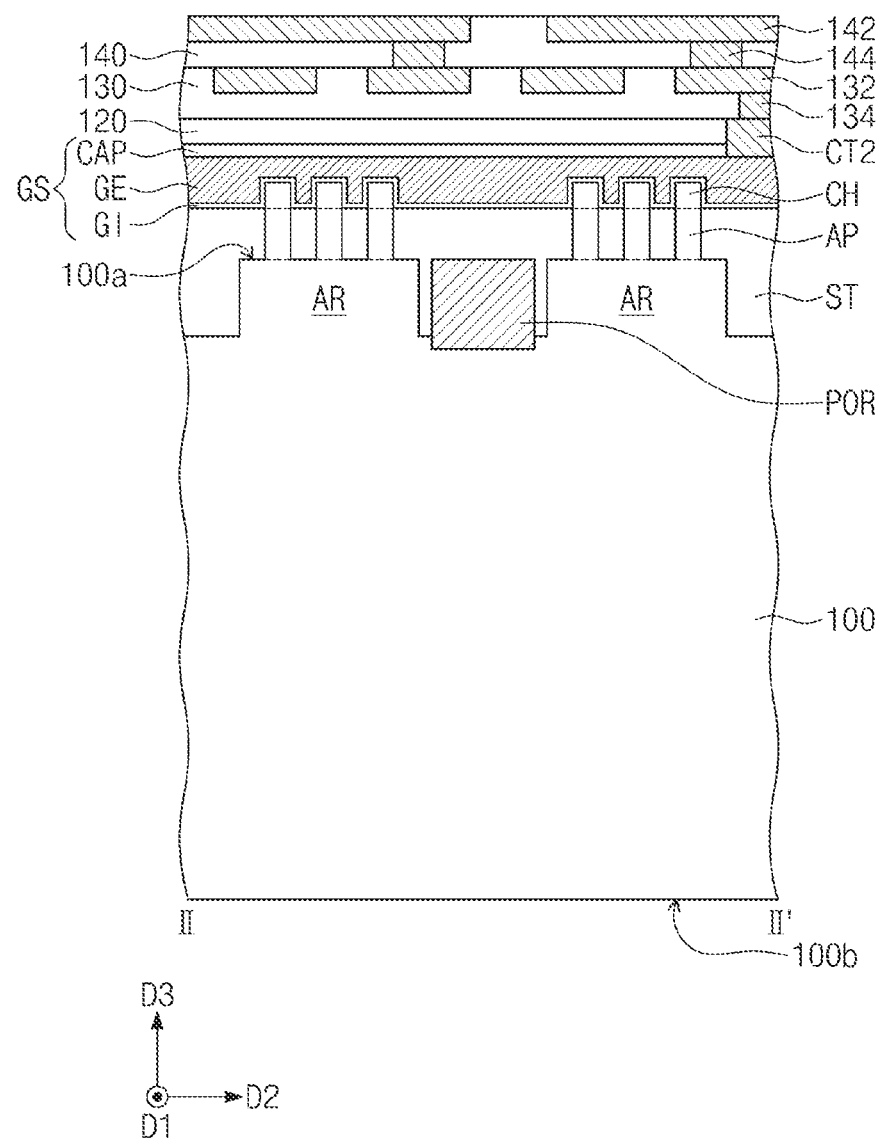
Figure 10C:
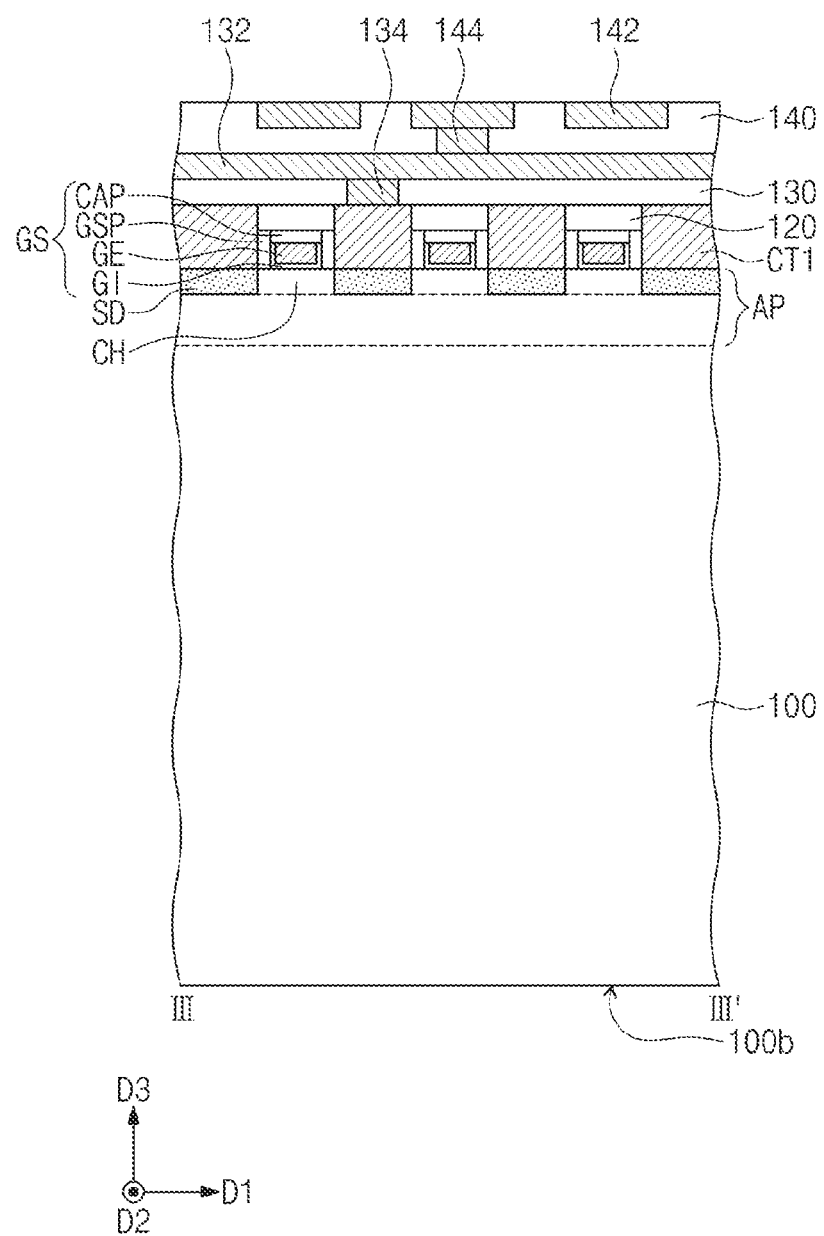
Figure 11A:
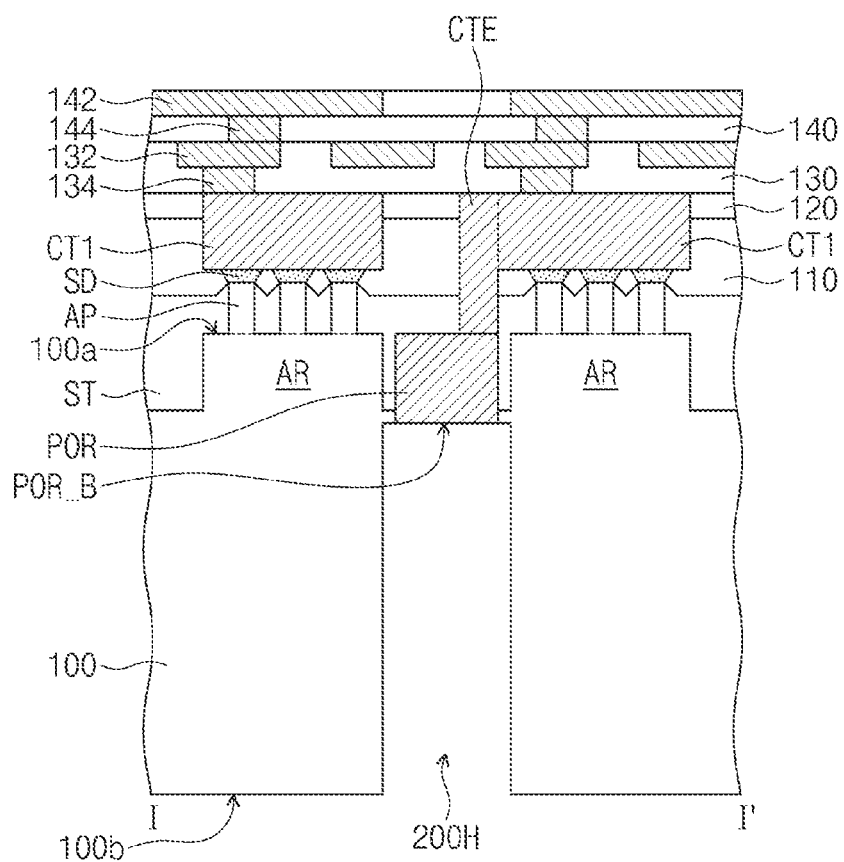
Figure 11B:
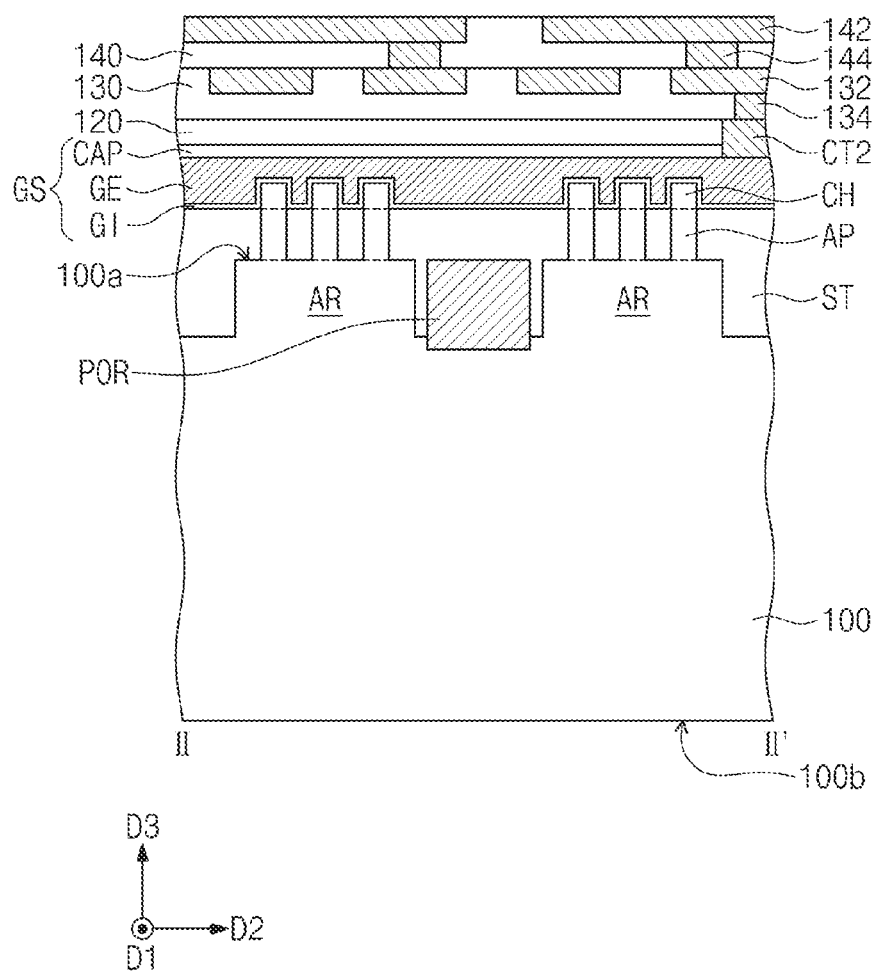
Figure 11C:
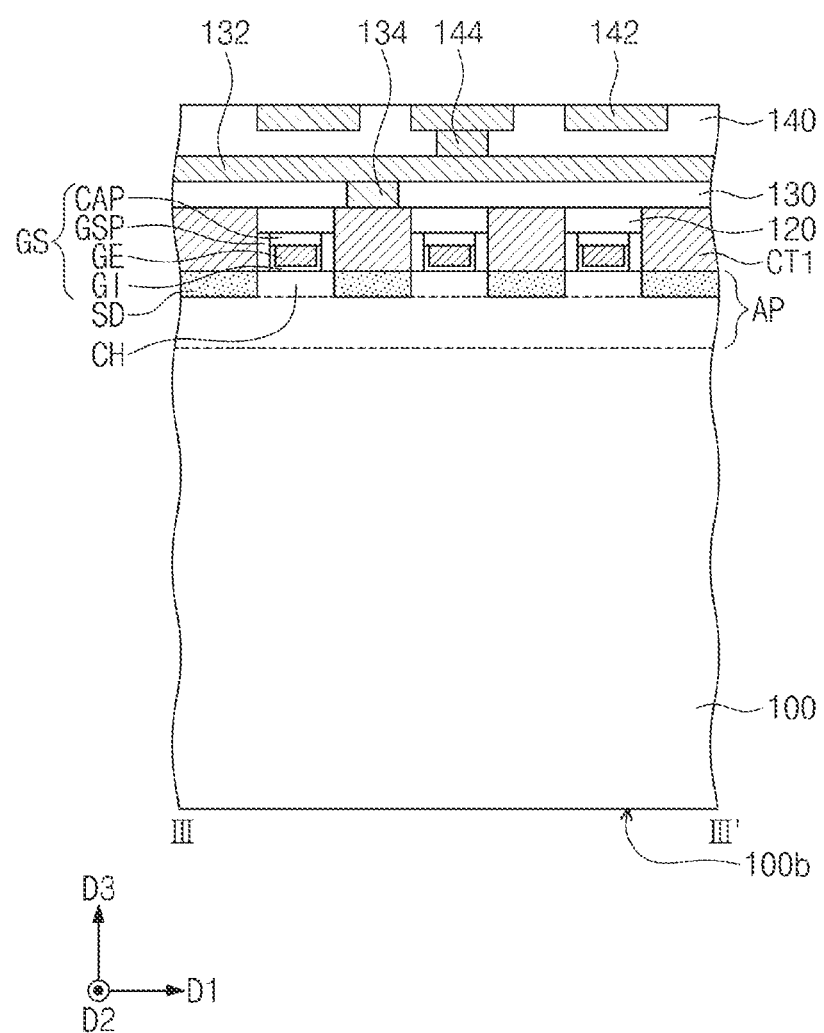
Figure 12A:
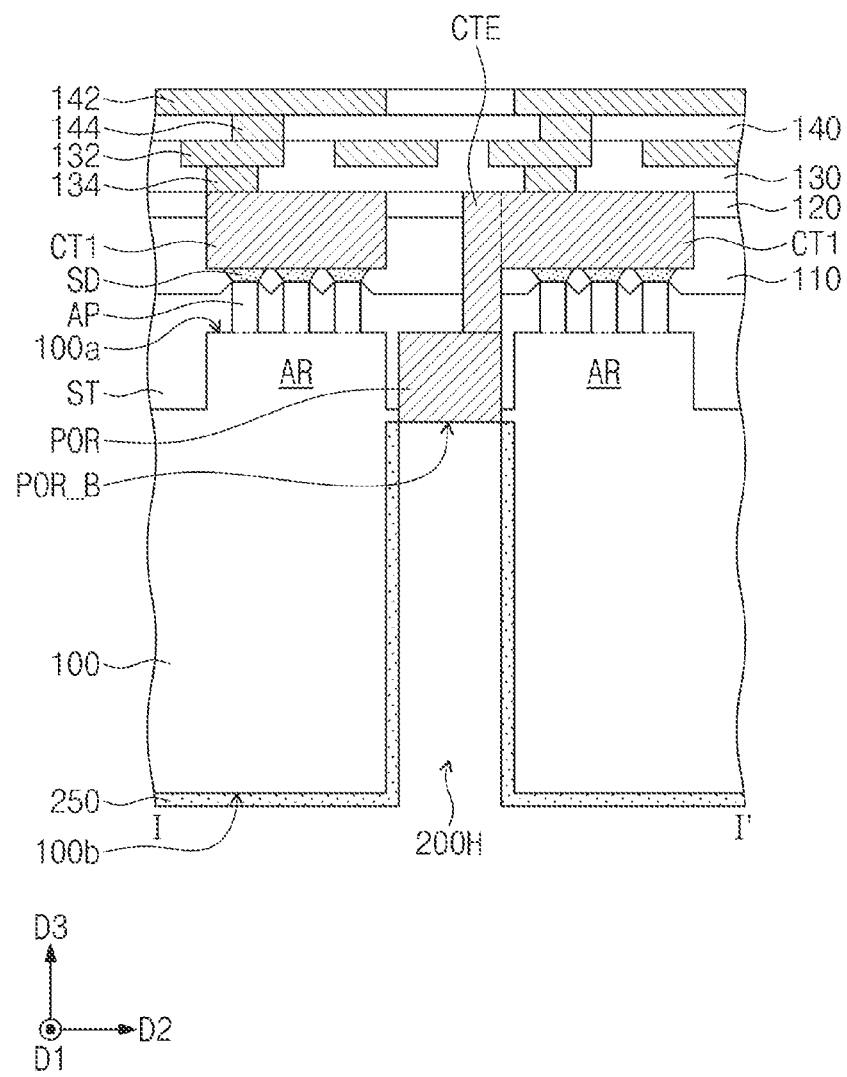
Figure 12B:
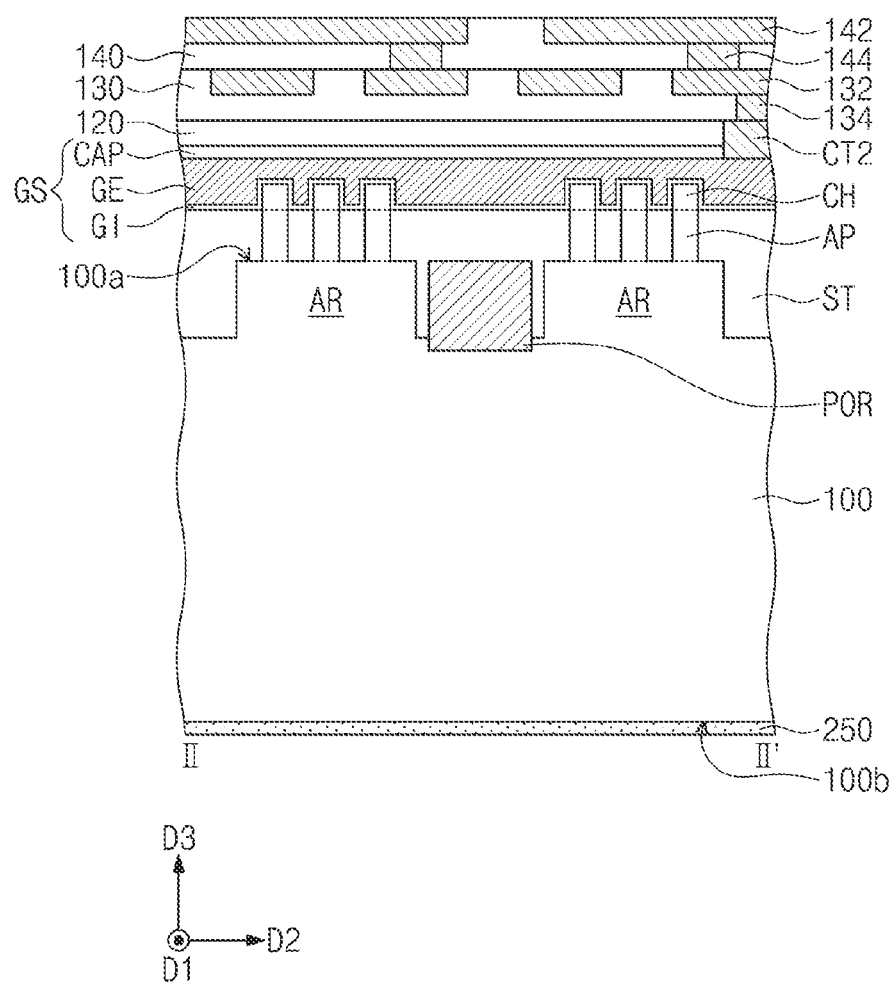
Figure 12C:
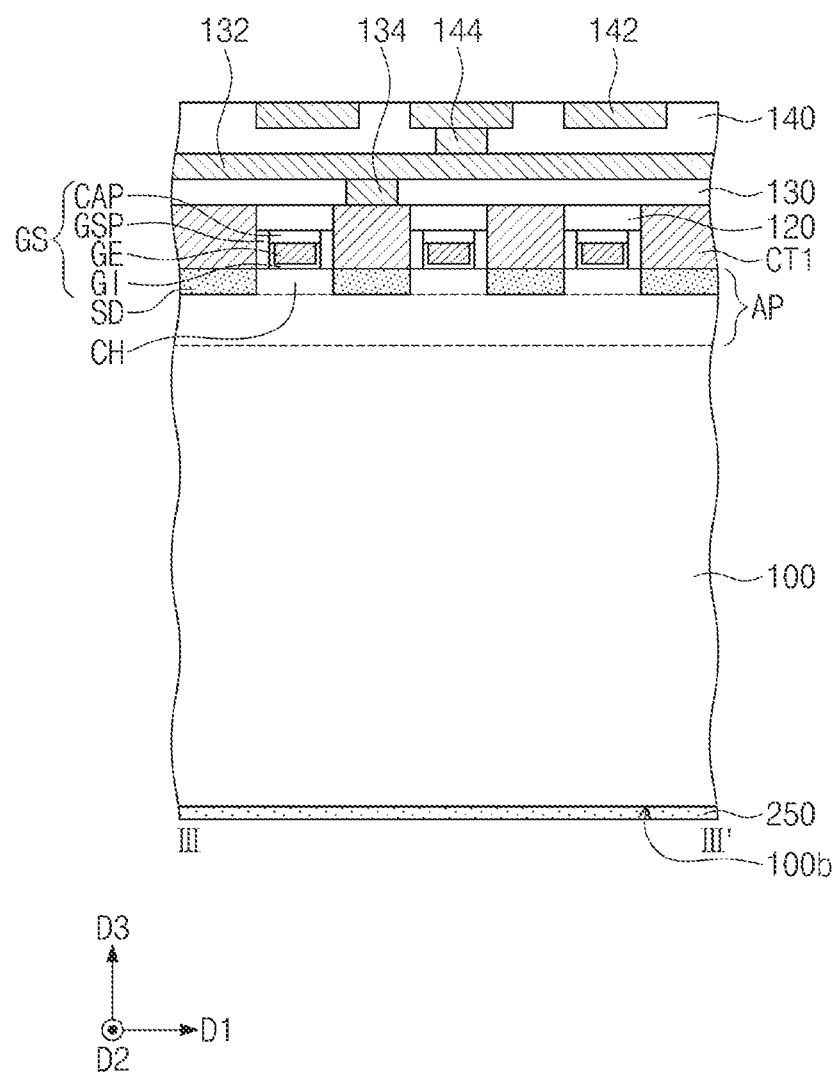
Figure 13A:
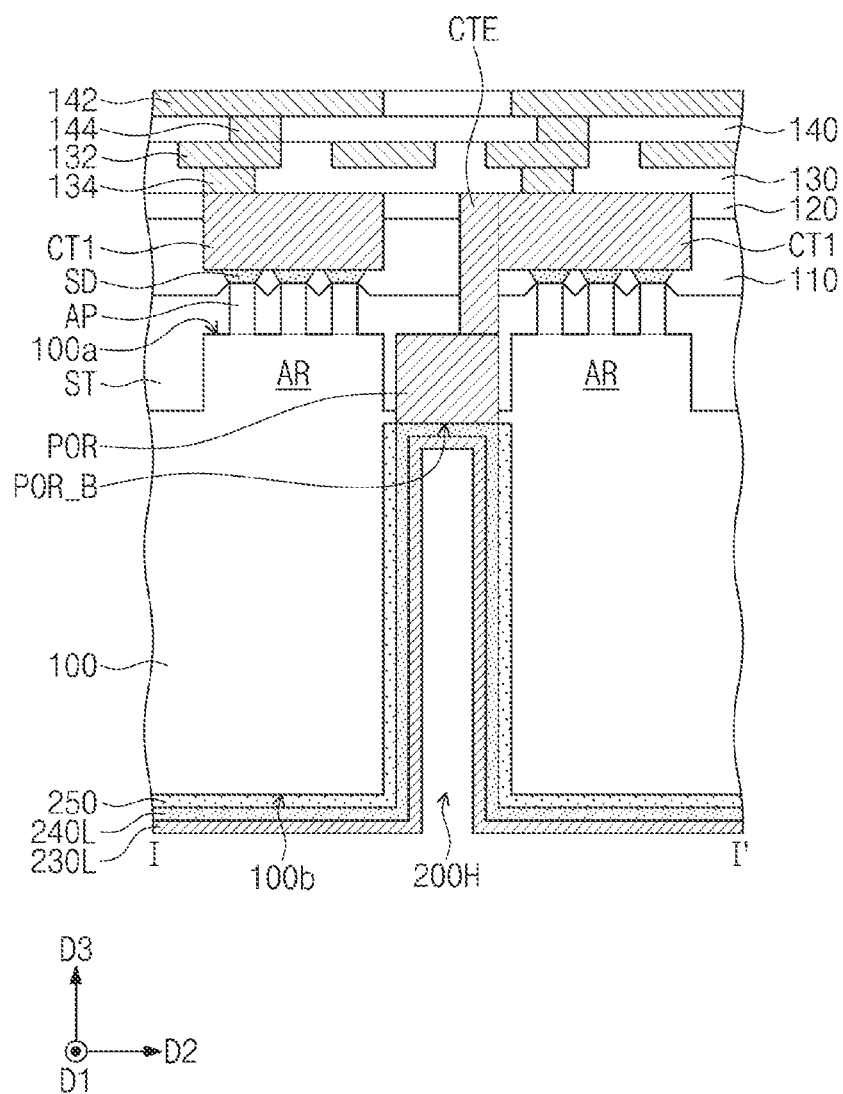
Figure 13B:
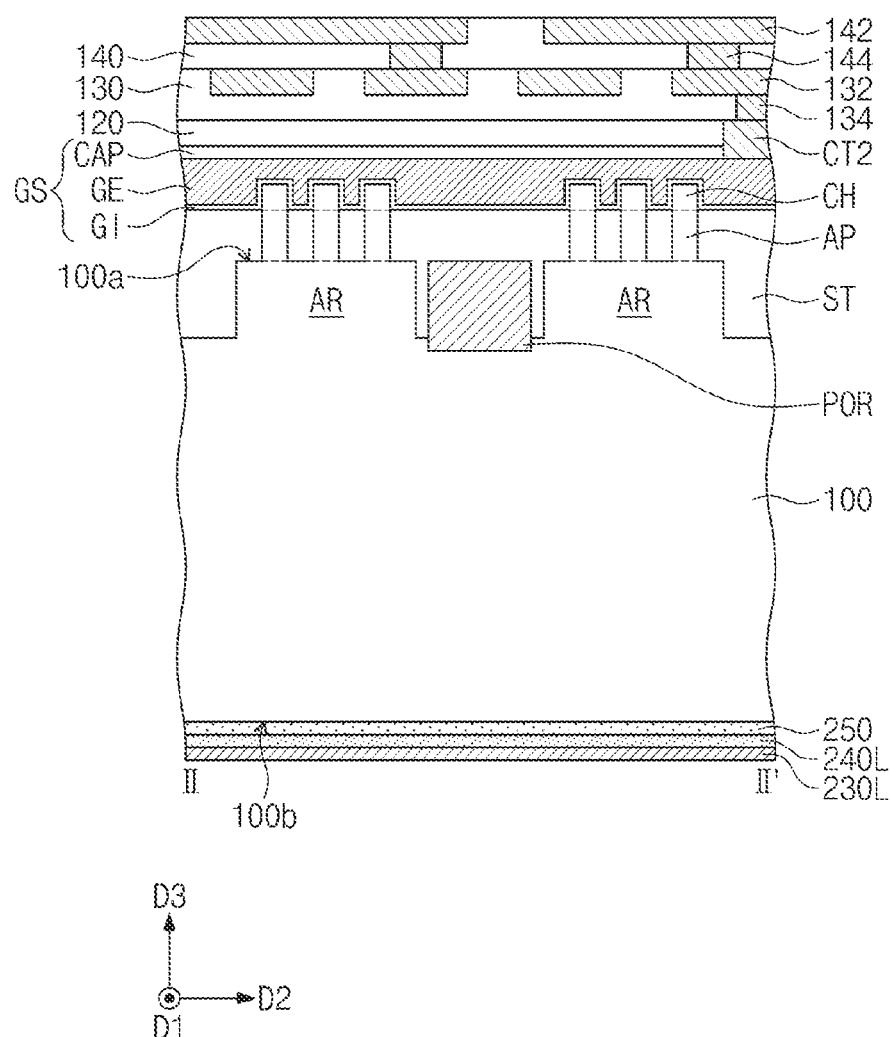
Figure 13C:
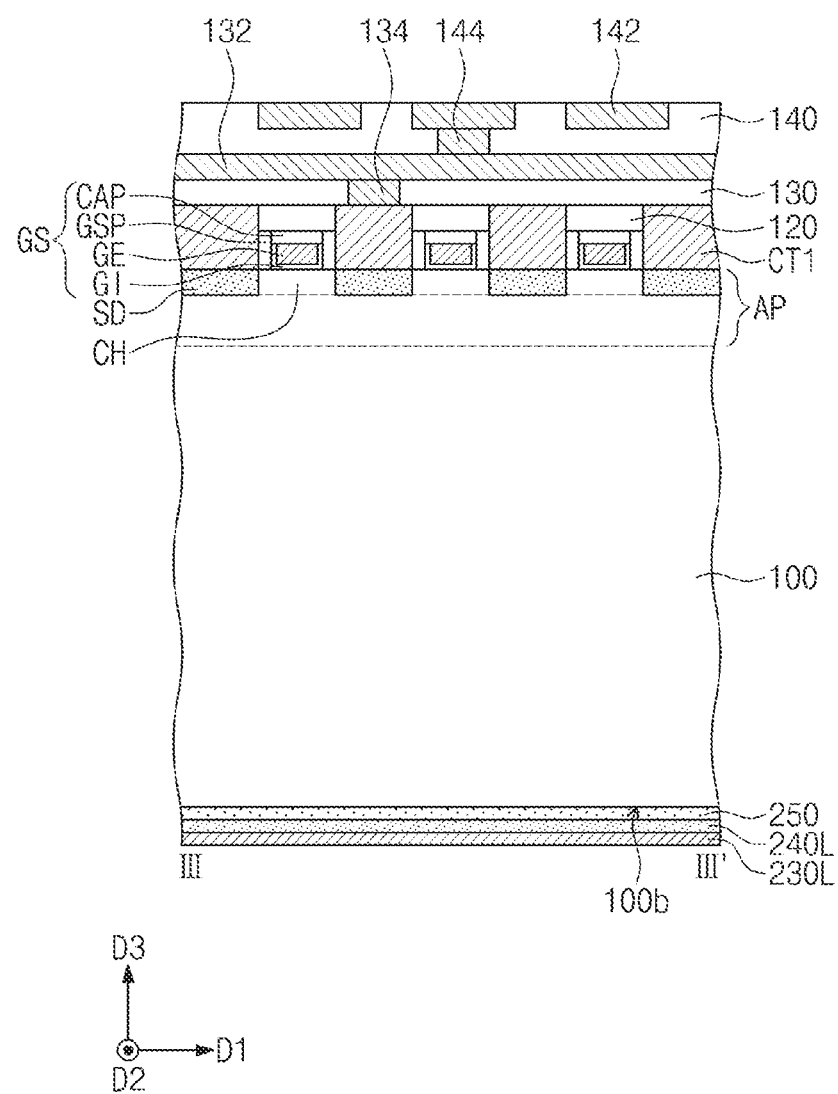
Figure 14A:
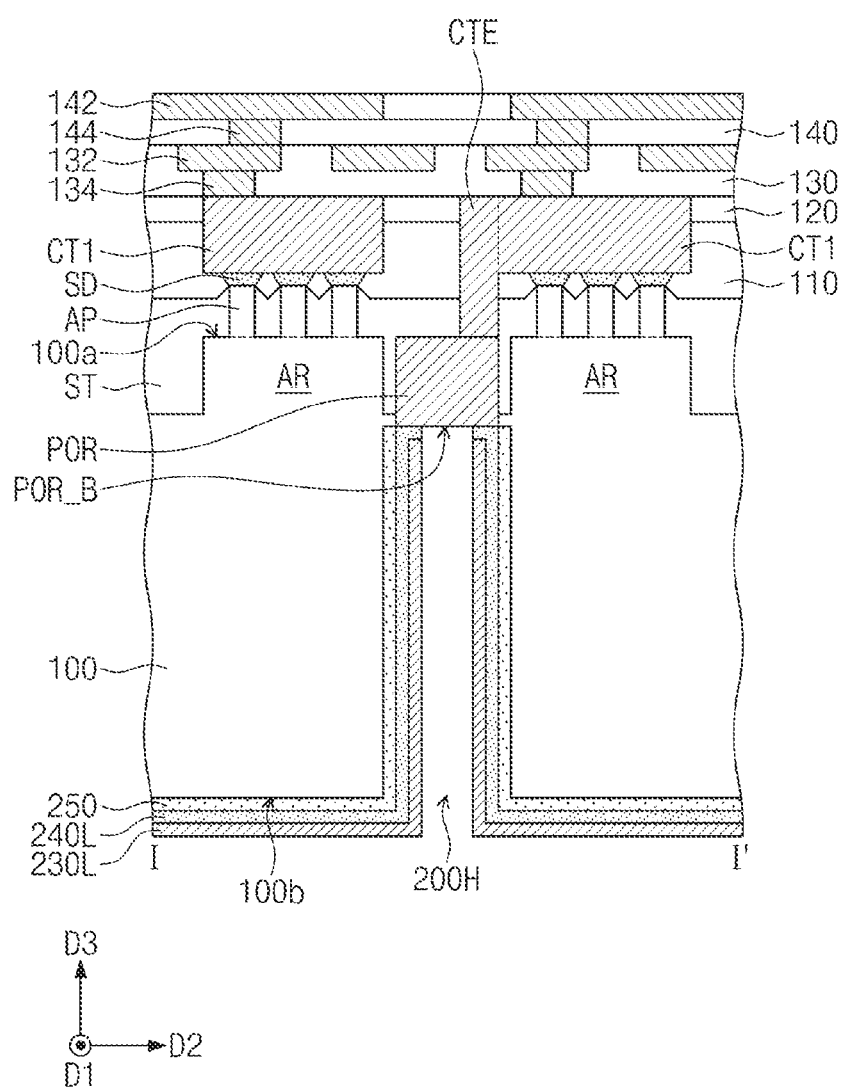
Figure 14B:
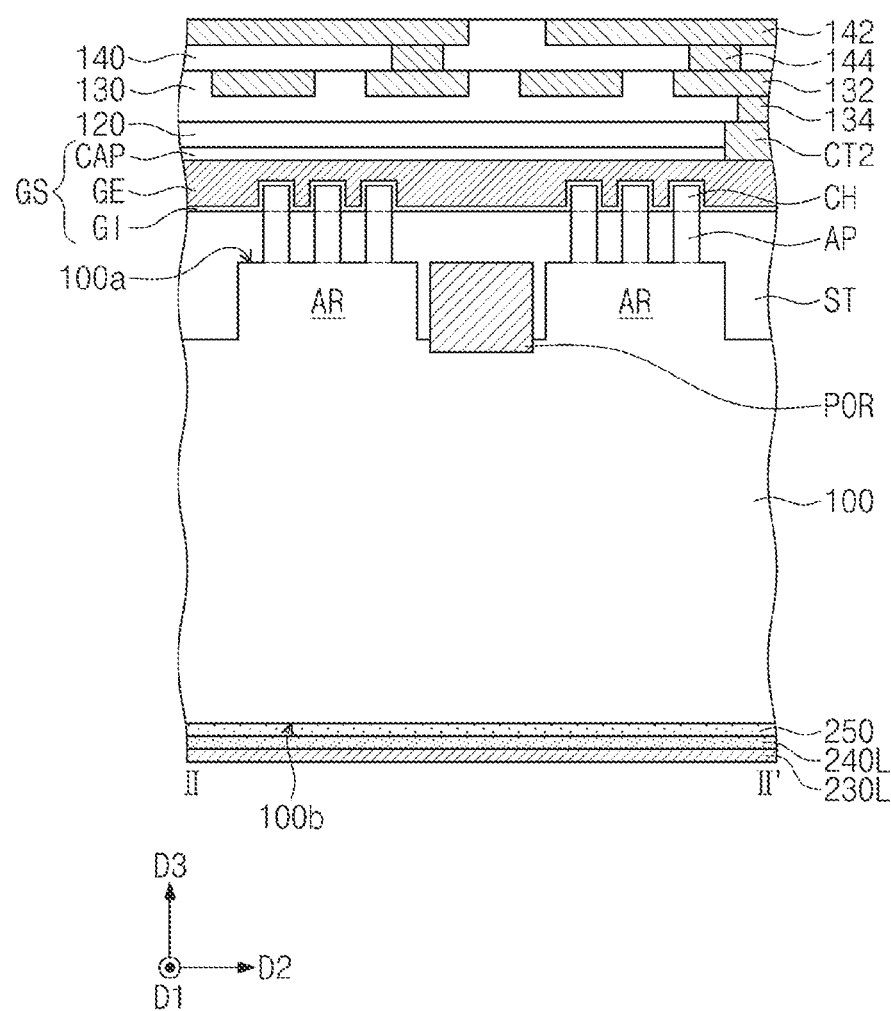
Figure 14C:
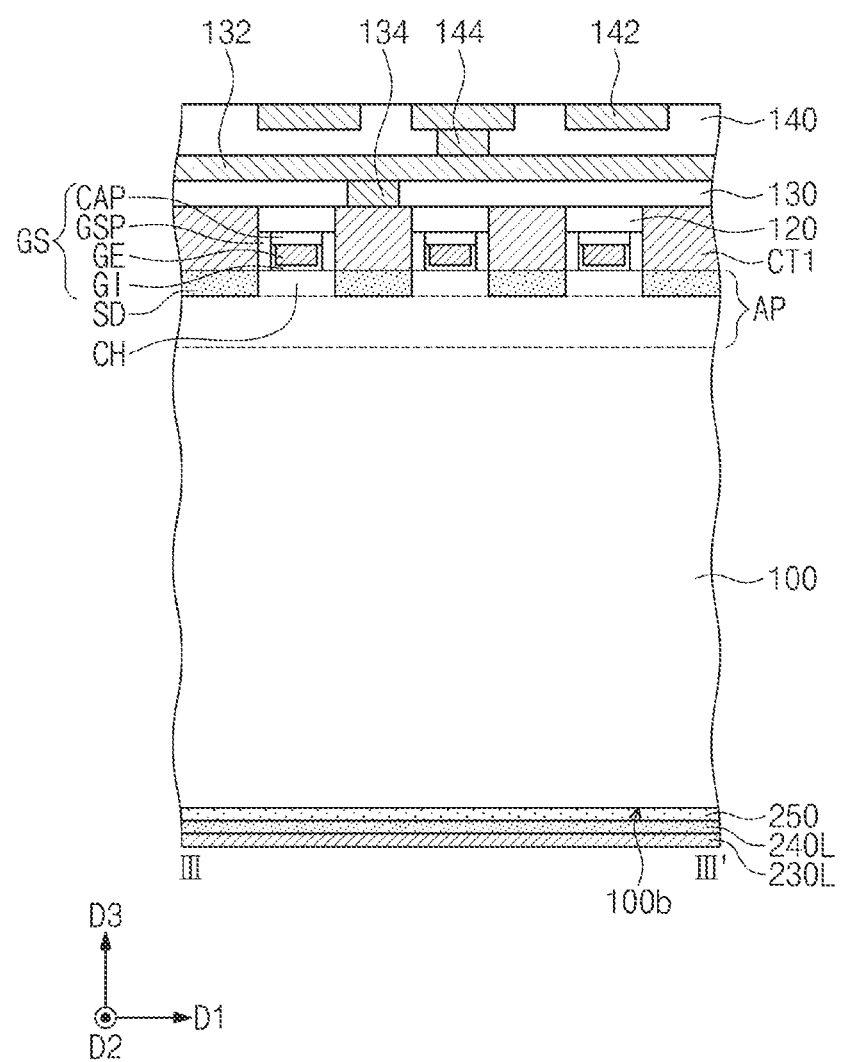
Figure 15A:
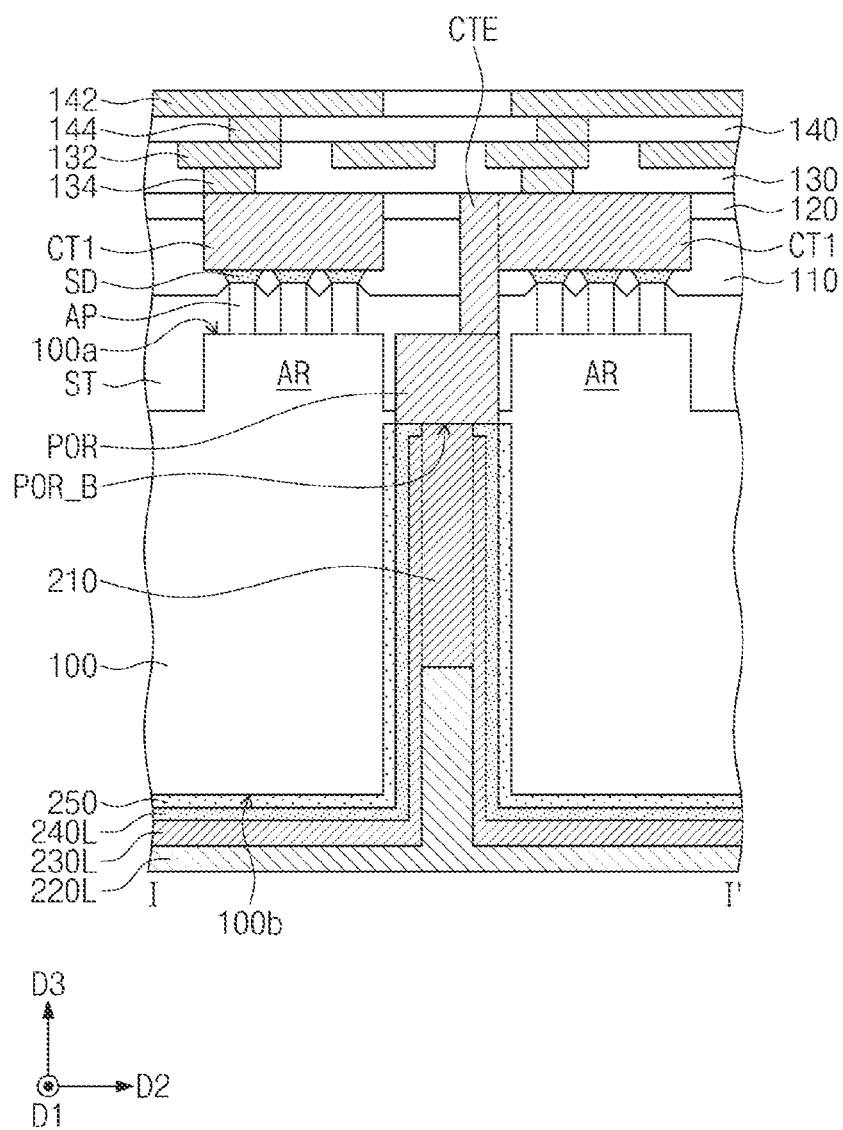
Figure 15B:
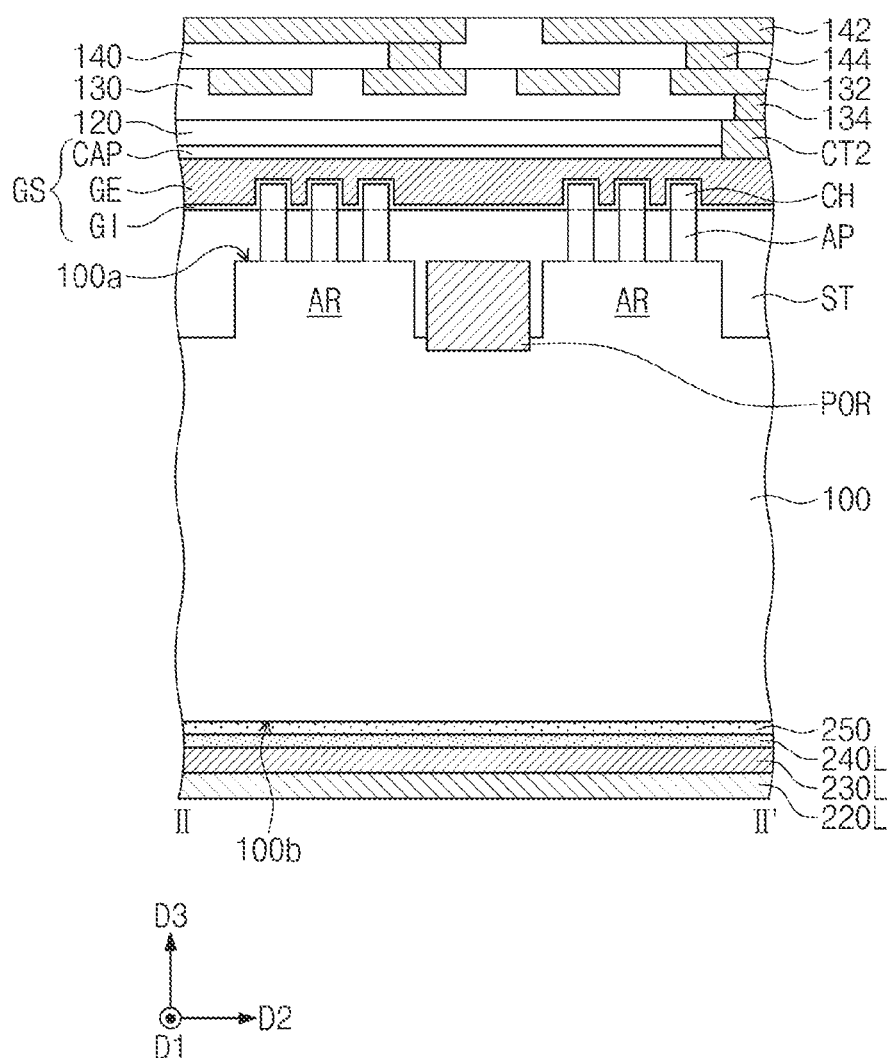
Figure 15C:
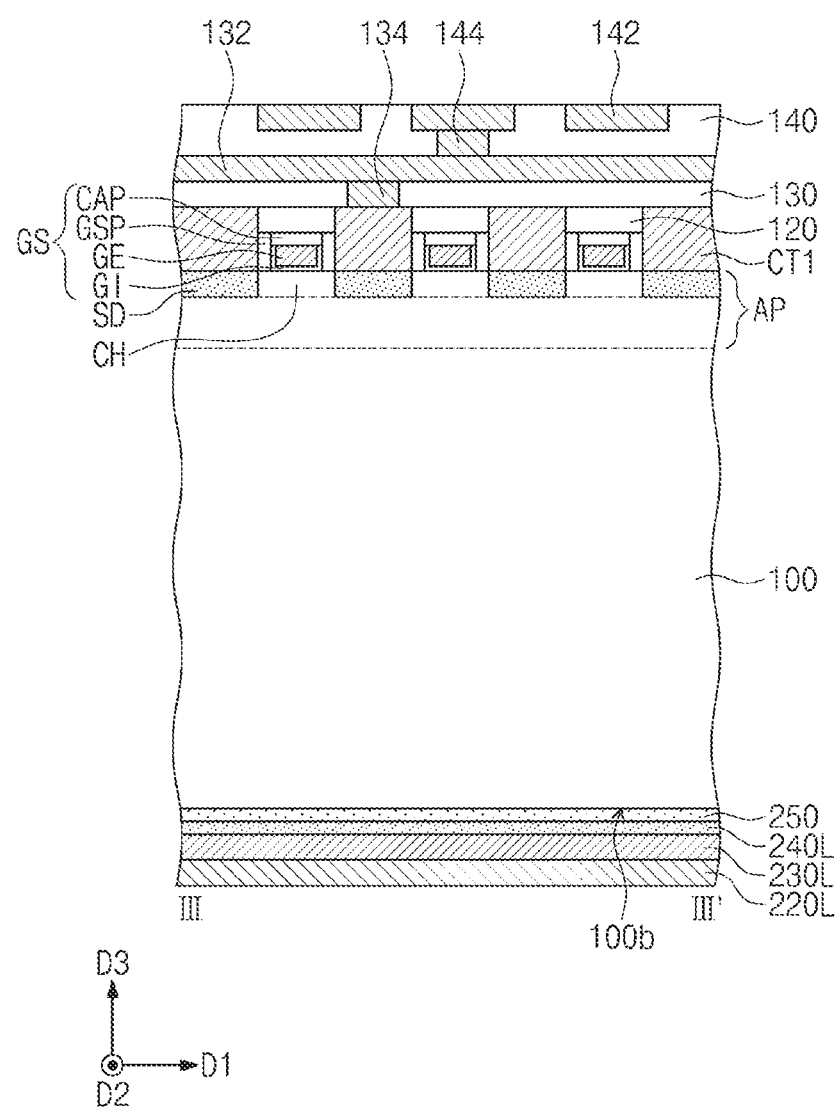
Figure 16A:
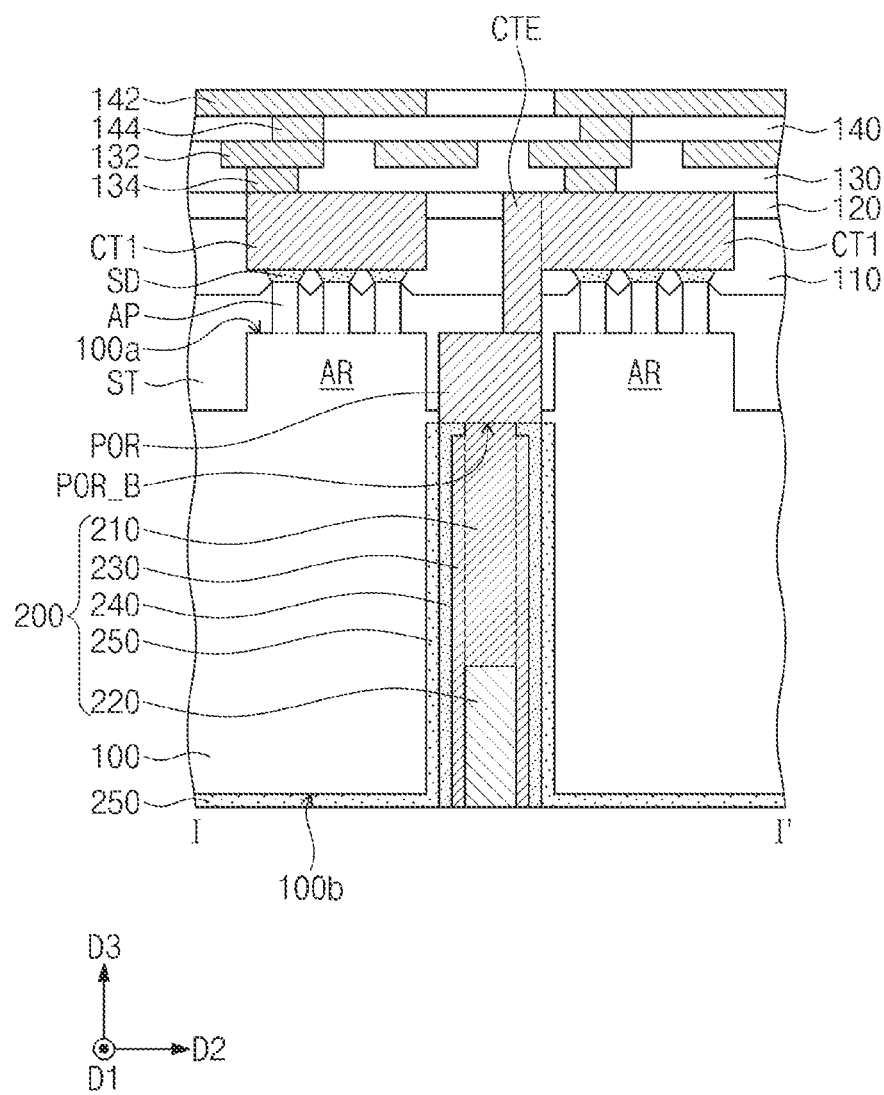
Figure 16B:
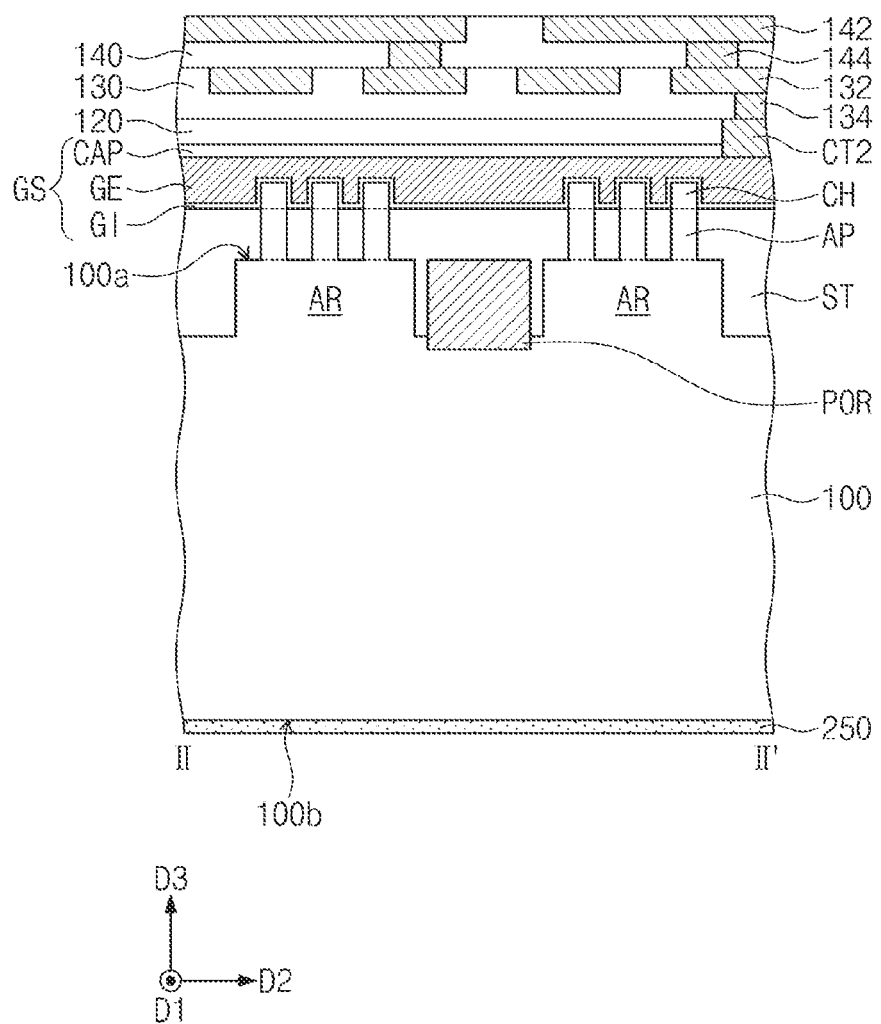
Figure 16C:
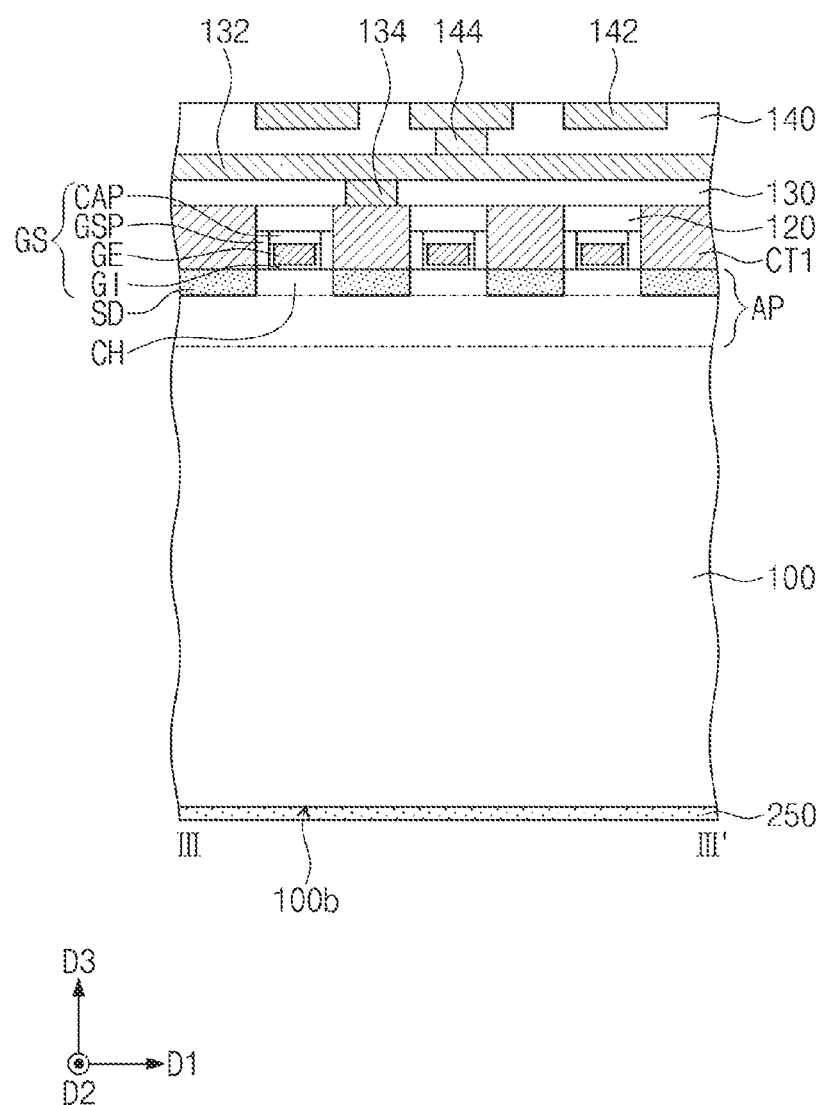

FIG. 6 is a cross-sectional view illustrating a semiconductor device according to an embodiment of the inventive concept, taken along I-I' of FIG. 1. FIG. 7 is a plan view of a penetration via structure according to an embodiment of the inventive concept, taken along line L-L' of FIG. 6. For convenience of explanation, features which are different from the semiconductor device of FIGS. 1, 2A to 2C, and 3, will be mainly described below, and a further description of features previously described may be omitted.

Referring to FIGS. 6 and 7, the penetration via structure 200 may further include the seed pattern 230 interposed between the barrier pattern 240 and the second conductive pattern 220. The seed pattern 230 may extend into a region between the barrier pattern 240 and the first conductive pattern 210. In an embodiment, the seed pattern 230 may include a material that is different from the first and second conductive patterns 210 and 220. The seed pattern 230 may include a metallic material that is different from the first and second conductive patterns 210 and 220. As an example, the second conductive pattern 220 may be formed of or include copper (Cu), and the first conductive pattern 210 may be formed of or include at least one of non-copper metals. The seed pattern 230 may be formed of or include at least one of non-copper metals which are different from that in the first conductive pattern 210. In an embodiment, the seed pattern 230 may be formed of or include at least one of metallic materials including, for example, cobalt (Co), ruthenium (Ru), molybdenum (Mo) and tungsten (W) and are different from the first conductive pattern 210.

The first conductive pattern 210 may include the extended portion 210E, which extends into a region between the seed pattern 230 and the second conductive pattern 220. When viewed in a plan view, the extended portion 210E of the first conductive pattern 210 may enclose an outer circumference surface of the second conductive pattern 220. In an embodiment, the first conductive pattern 210 may have a pillar shape, and the extended portion 210E of the first conductive pattern 210 may have a hollow cylinder shape. The second conductive pattern 220 may be disposed in the extended portion 210E of the first conductive pattern 210. An end of the extended portion 210E of the first conductive pattern 210 may be in contact with the corresponding lower interconnection line 152.

Except for the differences described above, the penetration via structure 200 may have substantially the same features as the penetration via structure 200 described with reference to FIGS. 1, 2A to 2C, and 3.

FIGS. 8A, 9A, 10A, 11A, 12A, 13A, 14A, 15A and 16A are cross-sectional views illustrating a method of fabricating a semiconductor device according to an embodiment of the inventive concept and corresponding to line I-I' of FIG. 1. FIGS. 8B, 9B, 10B, 11B, 12B, 13B, 14B, 15B and 16B are cross-sectional views illustrating a method of fabricating a semiconductor device according to an embodiment of the inventive concept and corresponding to line II-II' of FIG. 1. FIGS. 8C, 9C, 10C, 11C, 12C, 13C, 14C, 15C and 16C are cross-sectional views illustrating a method of fabricating a semiconductor device according to an embodiment of the inventive concept and corresponding to line III-III' of FIG. 1. For convenience of explanation, a further description of elements and technical aspects previously described may be omitted.

Referring to FIGS. 1 and 8A to 8C, the semiconductor substrate 100 may be provided. First trenches T1 may be formed by patterning an upper portion of the semiconductor substrate 100. The first trenches T1 may define the active patterns AP in the upper portion of the semiconductor substrate 100. The active patterns AP may extend in the first direction D1 and may be spaced apart from each other in the second direction D2.

Second trenches T2 may be formed by patterning an upper portion of the semiconductor substrate 100. The second trenches T2 may be formed deeper in the semiconductor substrate 100 than the first trenches T1. That is, the second trenches T2 may extend further into the semiconductor substrate 100 toward the second surface 100b of the semiconductor substrate 100 than the first trenches T1. The second trenches T2 may define the active regions AR in the upper portion of the semiconductor substrate 100. The active regions AR may extend in the first direction D1 and may be spaced apart from each other in the second direction D2. The active patterns AP may be disposed on the active regions AR. Each of the active patterns AP may protrude from a top surface of a corresponding one of the active regions AR (e.g., the first surface 100a of the semiconductor substrate 100) in the third direction D3.

The device isolation layer ST may be formed to cover the active patterns AP and the active regions AR and to fill the first and second trenches T1 and T2. A third trench T3 may be formed by patterning a portion of the device isolation layer ST between the active regions AR. The third trench T3 may be formed to penetrate the device isolation layer ST between the active regions AR and to expose the semiconductor substrate 100 between the active regions AR. The third trench T3 may extend in the first direction D1 between the active regions AR.

The power rail POR may be formed in the third trench T3. As an example, the formation of the power rail POR may include forming a conductive layer to fill the third trench T3 and recessing the conductive layer. As a result of the recessing of the conductive layer, the power rail POR may be locally formed in a lower portion of the third trench T3.

Referring to FIGS. 1 and 9A to 9C, an insulating layer may be formed on the device isolation layer ST to fill a remaining portion of the third trench T3. The insulating layer and the device isolation layer ST may be recessed until upper portions of the active patterns AP are exposed. The upper portion of each active pattern AP, which is exposed by the device isolation layer ST, may be referred to as the active fin AF. The channel region CH and the source/drain regions SD may be formed in the active fin AF. As an example, the formation of the source/drain regions SD may include recessing portions of the active fin AF at both sides of the channel region CH and performing an epitaxial growth process on the recessed regions of the active fin AF. The channel region CH may be a portion of the active fin AF that is interposed between the source/drain regions SD.

The first interlayer insulating layer 110 may be formed to cover the source/drain regions SD, and the gate structures GS may be formed in the first interlayer insulating layer 110. The gate structures GS may be formed to cross the active patterns AP. Each gate structure GS may cross the active fin AF of a corresponding one of the active patterns AP and may vertically overlap the channel region CH, when viewed in a plan view. Each of the gate structures GS may cover the top surface of the channel region CH and may cover side surfaces of the channel region CH, which are opposite to each other in the second direction D2. The source/drain regions SD may be disposed at both sides of each of the gate structures GS.

As an example, the formation of the gate structures GS may include forming an empty region in the first interlayer insulating layer 110 to expose the channel region CH and forming the gate insulating pattern GI, the gate electrode GE, the gate capping pattern CAP, and the gate spacers GSP in the empty region. The second interlayer insulating layer 120 may be formed on the first interlayer insulating layer 110 to cover the gate structures GS.

Referring to FIGS. 1 and 10A to 10C, the first contacts CT1 may be formed in the first and second interlayer insulating layers 110 and 120. The first contacts CT1 may be formed to penetrate the first and second interlayer insulating layers 110 and 120 and may be connected to the source/drain regions SD. At least one of the first contacts CT1 may include the contact extended portion CTE, which penetrates an upper portion of the device isolation layer ST and is connected to the power rail POR. The second contacts CT2 may be formed in the second interlayer insulating layer 120. Each of the second contacts CT2 may be formed to penetrate the second interlayer insulating layer 120 and the gate capping pattern CAP and may be connected to the gate electrode GE. As an example, the formation of the first and second contacts CT1 and CT2 may include forming first contact holes to penetrate the first and second interlayer insulating layers 110 and 120 and to expose the source/drain regions SD, forming second contact holes to penetrate the second interlayer insulating layer 120 and the gate capping pattern CAP and to expose the gate electrode GE, forming a conductive layer to fill the first and second contact holes, and planarizing the conductive layer to expose a top surface of the second interlayer insulating layer 120.

The third interlayer insulating layer 130 may be formed on the second interlayer insulating layer 120, and the first upper interconnection lines 132 and the first upper vias 134 may be formed in the third interlayer insulating layer 130. The fourth interlayer insulating layer 140 may be formed on the third interlayer insulating layer 130, and the second upper interconnection lines 142 and the second upper vias 144 may be formed in the fourth interlayer insulating layer 140. Additional interlayer insulating layers, additional upper interconnection lines, and additional upper vias may be formed on the fourth interlayer insulating layer 140.

Referring to FIGS. 1 and 11A to 11C, an etching process may be performed on the second surface 100b of the semiconductor substrate 100, which is opposite to top surfaces of the active regions AR (e.g., the first surface 100a of the semiconductor substrate 100), to remove a lower portion of the semiconductor substrate 100. The etching process may be performed until a thickness of the semiconductor substrate 100 (e.g., a thickness between the first surface 100a and the second surface 100b in the third direction D3) has a desired value.

A penetration hole 200H may be formed in the semiconductor substrate 100. The penetration hole 200H may penetrate the semiconductor substrate 100 to expose the bottom surface POR_B of the power rail POR. As an example, the formation of the penetration hole 200H may include forming a mask pattern (e.g., a photoresist pattern) to define a region, on which the penetration hole 200H will be formed, on the second surface 100b of the semiconductor substrate 100, and etching the semiconductor substrate 100 using the mask pattern as an etch mask.

Referring to FIGS. 1 and 12A to 12C, the insulating pattern 250 may be formed to fill a portion of the penetration hole 200H. The insulating pattern 250 may conformally cover an inner surface of the penetration hole 200H and the second surface 100b of the semiconductor substrate 100. For example, the insulating pattern 250 may be continuously disposed on the inner surface of the penetration hole 200H and the second surface 100b of the semiconductor substrate 100 in a shape corresponding thereto. As an example, the formation of the insulating pattern 250 may include forming an insulating layer on the second surface 100b of the semiconductor substrate 100 to fill the portion of the penetration hole 200H and then removing a portion of the insulating layer to expose the bottom surface POR_B of the power rail POR.

Referring to FIGS. 1 and 13A to 13C, a barrier layer 240L and a seed layer 230L may be sequentially formed on the second surface 100b of the semiconductor substrate 100. The barrier and seed layers 240L and 230L may be formed to partially fill the penetration hole 200H and to conformally cover an inner surface of the penetration hole 200H and the second surface 100b of the semiconductor substrate 100. The barrier layer 240L may be interposed between the insulating pattern 250 and the seed layer 230L and between the bottom surface POR_B of the power rail POR and the seed layer 230L.

Referring to FIGS. 1 and 14A to 14C, a portion of each of the barrier and seed layers 240L and 230L may be removed to expose the bottom surface POR_B of the power rail POR. In an embodiment, a portion of the barrier layer 240L may be left between the bottom surface POR_B of the power rail POR and the seed layer 230L, and thus, the seed layer 230L may be spaced apart from the bottom surface POR_B of the power rail POR with the portion of the barrier layer 240L interposed therebetween.

Referring to FIGS. 1 and 15A to 15C, the first conductive pattern 210 may be formed to fill a portion of the penetration hole 200H. The first conductive pattern 210 may be formed to fill a first region of the penetration hole 200H that is distant from the second surface 100b of the semiconductor substrate 100. The first conductive pattern 210 may penetrate the portion of the barrier pattern 240 and may be in direct contact with the bottom surface POR_B of the power rail POR. The first conductive pattern 210 may be formed by, for example, a first electroplating process, in which the seed layer 230L is used as a seed layer. In an embodiment, the seed layer 230L and the first conductive pattern 210 may be formed of or include at least one of non-copper metals. The seed layer 230L and the first conductive pattern 210 may be formed of or include the same metal. In this case, the first conductive pattern 210 and the seed layer 230L may be in contact with each other without any interface therebetween, thereby forming a single object (or a unitary body). According to an embodiment of the inventive concept, even when the penetration hole 200H has an increased aspect ratio, the first region of the penetration hole 200H may be easily filled with the first conductive pattern 210, because the first conductive pattern 210 is formed of or includes the non-copper metal.

A second conductive layer 220L may be formed to fill a remaining portion of the penetration hole 200H. The second conductive layer 220L may be formed to fill a second region of the penetration hole 200H, which is close to the second surface 100b of the semiconductor substrate 100, and may extend to cover the second surface 100b of the semiconductor substrate 100. The second conductive layer 220L may be formed by, for example, a second electroplating process, in which the seed layer 230L is used as a seed layer. In an embodiment, the second conductive layer 220L may be formed to include at least one of metallic materials (e.g., copper) whose resistance is lower than the first conductive pattern 210. According to an embodiment of the inventive concept, since the second conductive layer 220L includes a metal (e.g., copper) whose resistance is lower than the first conductive pattern 210, a total resistance of a penetration via structure, which will be described further below, may be decreased.

Referring to FIGS. 1 and 16A to 16C, a planarization process may be performed to remove portions of the second conductive layer 220L, the seed layer 230L, and the barrier layer 240L from the second surface 100b of the semiconductor substrate 100. As an example, the planarization process may be performed until the insulating pattern 250 on the second surface 100b of the semiconductor substrate 100 is exposed. As a result of the planarization process, the barrier pattern 240, the seed pattern 230, and the second conductive pattern 220 may be locally formed in the penetration hole 200H. The first conductive pattern 210, the second conductive pattern 220, the seed pattern 230, the barrier pattern 240, and the insulating pattern 250 may be referred to collectively as the penetration via structure 200.

Referring back to FIGS. 1 and 2A to 2C, the power delivery network 150 may be formed on the second surface 100b of the semiconductor substrate 100. The power delivery network 150 may include the lower interconnection lines 152 formed on the second surface 100b of the semiconductor substrate 100. The lower insulating layer 156 may be formed on the second surface 100b of the semiconductor substrate 100 to cover the power delivery network 150. In other words, the lower insulating layer 156 may cover the lower interconnection lines 152, and the lower interconnection lines 152 may be disposed in the lower insulating layer 156. The penetration via structure 200 may be connected to a corresponding one of the lower interconnection lines 152. The power delivery network 150 may be electrically connected to the power rail POR through the penetration via structure 200.

Figure 17:
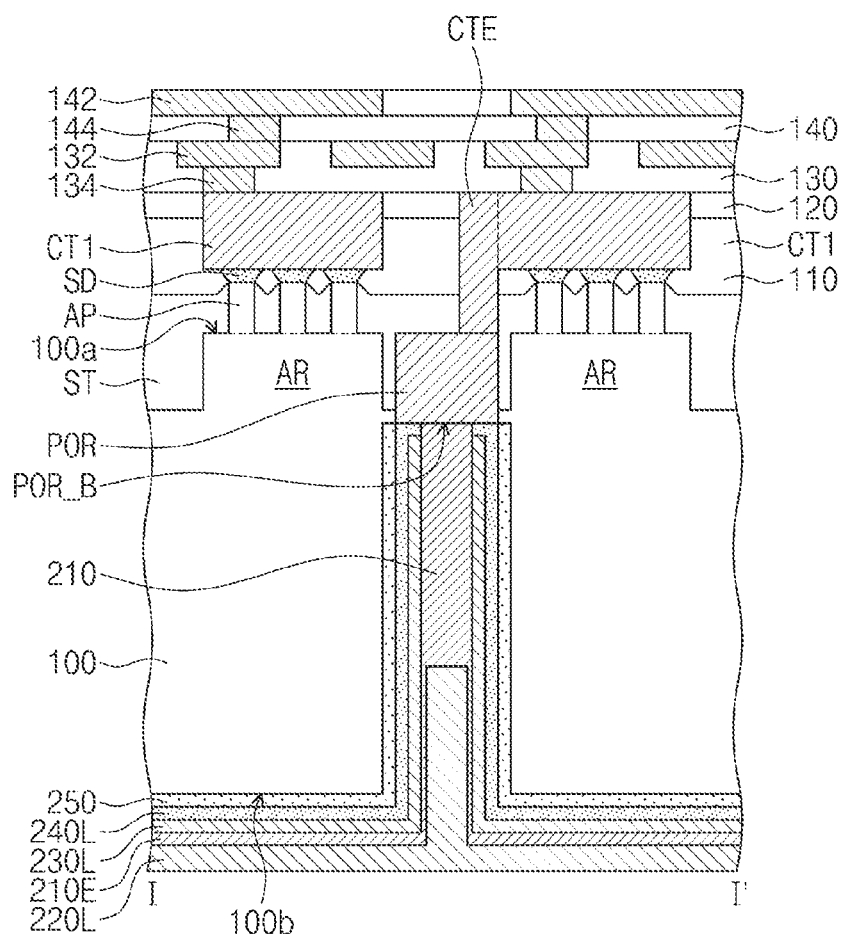
FIG. 17 is a cross-sectional view illustrating a method of fabricating a semiconductor device according to an embodiment of the inventive concept and corresponding to line I-I' of FIG. 1.

FIG. 17 is a cross-sectional view illustrating a method of fabricating a semiconductor device according to an embodiment of the inventive concept and corresponding to line I-I' of FIG. 1. For convenience of explanation, features which are different from the fabrication method described with reference to FIGS. 8A to 16C will be mainly described below, and a further description of features previously described may be omitted.

Referring to FIG. 17, the insulating pattern 250, and the barrier and seed layers 240L and 230L, may be formed to fill a portion of the penetration hole 200H, and the first conductive pattern 210 may be formed to fill a first region of the penetration hole 200H, which is distant from the second surface 100b of the semiconductor substrate 100. The first conductive pattern 210 may be formed by, for example, a first electroplating process, in which the seed layer 230L is used as a seed layer. In an embodiment, the first conductive pattern 210 may be formed of or include at least one of non-copper metals, and the seed layer 230L may be formed of or include at least one of metals different from the first conductive pattern 210. In this case, as a result of the first electroplating process, the extended portion 210E of the first conductive pattern 210 may be formed to extend along a surface of the seed layer 230L. The extended portion 210E of the first conductive pattern 210 may fill a portion of the second region of the penetration hole 200H, which is close to the second surface 100b of the semiconductor substrate 100, and may extend to cover the second surface 100b of the semiconductor substrate 100.

The second conductive layer 220L may be formed to fill a remaining portion of the penetration hole 200H. The second conductive layer 220L may fill the remaining portion of the second region of the penetration hole 200H and may extend to cover the second surface 100b of the semiconductor substrate 100. The second conductive layer 220L may be formed by, for example, a second electroplating process, in which the seed layer 230L and the extended portion 210E of the first conductive pattern 210 are used as a seed layer. In an embodiment, the second conductive layer 220L may be formed to include at least one of metallic materials (e.g., copper) whose resistance is lower than the first conductive pattern 210. The seed layer 230L may be formed of or include the same metal (e.g., copper) as the second conductive layer 220L.

Referring back to FIG. 4, a planarization process may be performed to remove portions of the second conductive layer 220L, the extended portion 210E of the first conductive pattern 210, the seed layer 230L, and the barrier layer 240L from the second surface 100b of the semiconductor substrate 100. As a result of the planarization process, the barrier pattern 240, the seed pattern 230, the extended portion 210E of the first conductive pattern 210, and the second conductive pattern 220 may be locally formed in the penetration hole 200H. The first conductive pattern 210, the second conductive pattern 220, the seed pattern 230, the barrier pattern 240, and the insulating pattern 250 may be referred to collectively as the penetration via structure 200, and the first conductive pattern 210 may include the extended portion 210E interposed between the seed pattern 230 and the second conductive pattern 220.

Figure 18:
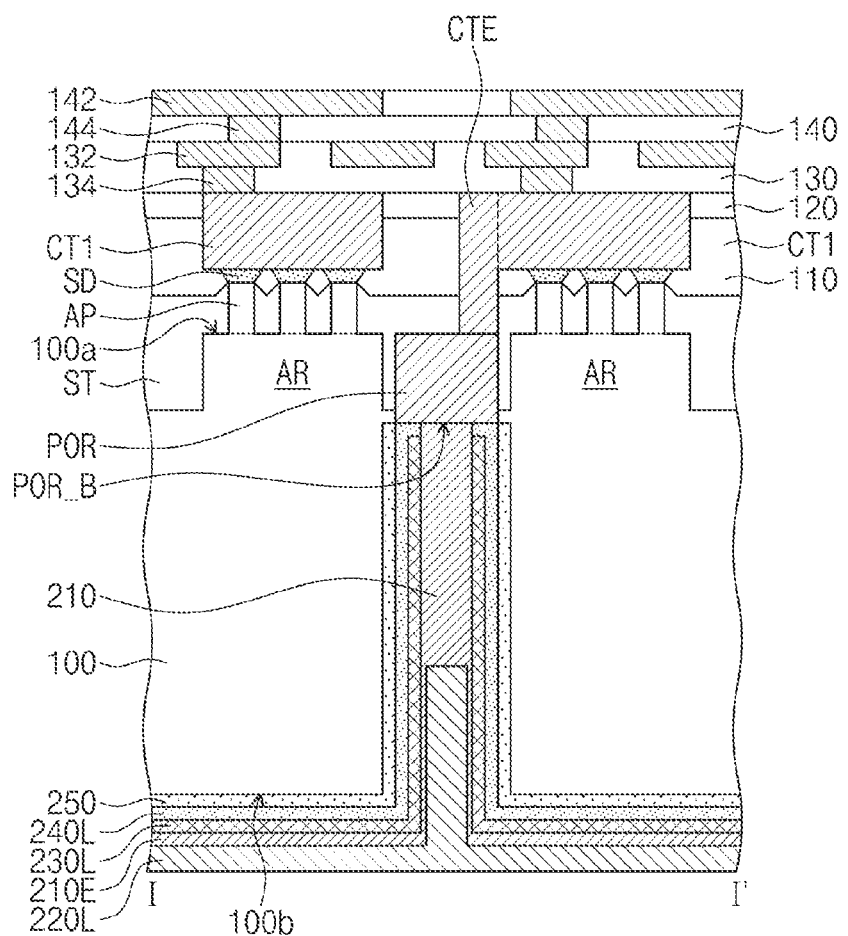
FIG. 18 is a cross-sectional view illustrating a method of fabricating a semiconductor device according to an embodiment of the inventive concept and corresponding to line I-I' of FIG. 1.
Figure 18:
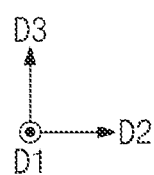

FIG. 18 is a cross-sectional view illustrating a method of fabricating a semiconductor device according to an embodiment of the inventive concept and corresponding to the line I-I' of FIG. 1. For convenience of explanation, features which are different from the fabrication method described with reference to FIGS. 8A to 16C will be mainly described below, and a further description of features previously described may be omitted.

Referring to FIG. 18, the insulating pattern 250, and the barrier and seed layers 240L and 230L, may be formed to fill a portion of the penetration hole 200H, and the first conductive pattern 210 may be formed to fill a first region of the penetration hole 200H, which is distant from the second surface 100b of the semiconductor substrate 100. The first conductive pattern 210 may be formed by, for example, a first electroplating process, in which the seed layer 230L is used as a seed layer. In an embodiment, the seed layer 230L and the first conductive pattern 210 may be formed of or include at least one of non-copper metals, and the seed layer 230L may be formed of or include at least one of metals different from the first conductive pattern 210. In this case, as a result of the first electroplating process, the extended portion 210E of the first conductive pattern 210 may be formed to extend along a surface of the seed layer 230L. The extended portion 210E of the first conductive pattern 210 may fill a portion of the second region of the penetration hole 200H, which is close to the second surface 100b of the semiconductor substrate 100, and may extend to cover the second surface 100b of the semiconductor substrate 100.

The second conductive layer 220L may be formed to fill a remaining portion of the penetration hole 200H. The second conductive layer 220L may fill the remaining portion of the second region of the penetration hole 200H and may extend to cover the second surface 100b of the semiconductor substrate 100. The second conductive layer 220L may be formed by, for example, a second electroplating process, in which the seed layer 230L and the extended portion 210E of the first conductive pattern 210 are used as a seed layer. In an embodiment, the second conductive layer 220L may be formed to include at least one of metallic materials (e.g., copper) whose resistance is lower than the first conductive pattern 210.

Referring back to FIG. 6, a planarization process may be performed to remove portions of the second conductive layer 220L, the extended portion 210E of the first conductive pattern 210, the seed layer 230L, and the barrier layer 240L from the second surface 100b of the semiconductor substrate 100. As a result of the planarization process, the barrier pattern 240, the seed pattern 230, the extended portion 210E of the first conductive pattern 210, and the second conductive pattern 220 may be locally formed in the penetration hole 200H. The first conductive pattern 210, the second conductive pattern 220, the seed pattern 230, the barrier pattern 240, and the insulating pattern 250 may be collectively referred to as the penetration via structure 200, and the first conductive pattern 210 may include the extended portion 210E interposed between the seed pattern 230 and the second conductive pattern 220.

Figure 19:
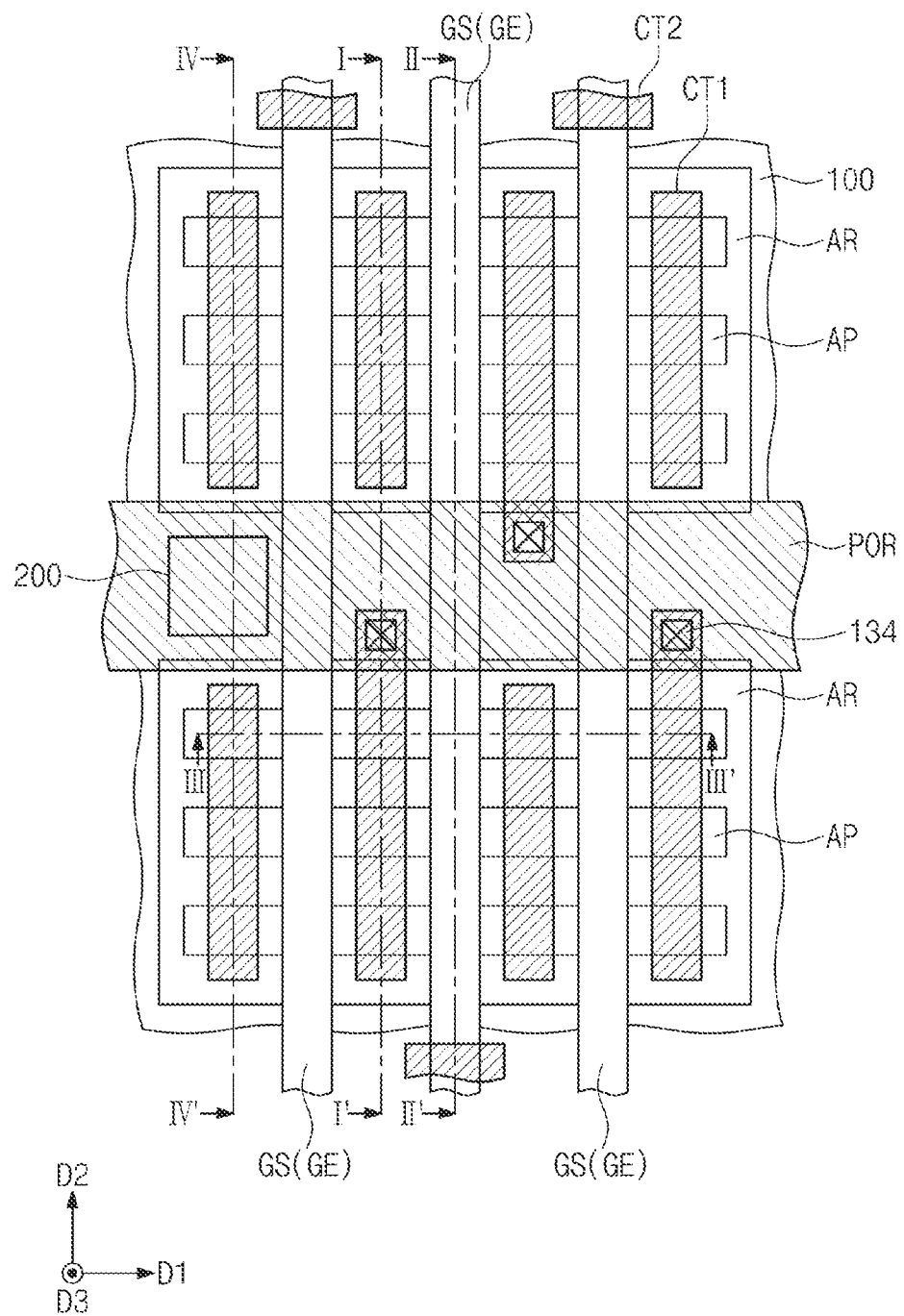
FIG. 19 is a plan view illustrating a semiconductor device according to an embodiment of the inventive concept.
Figure 20A:
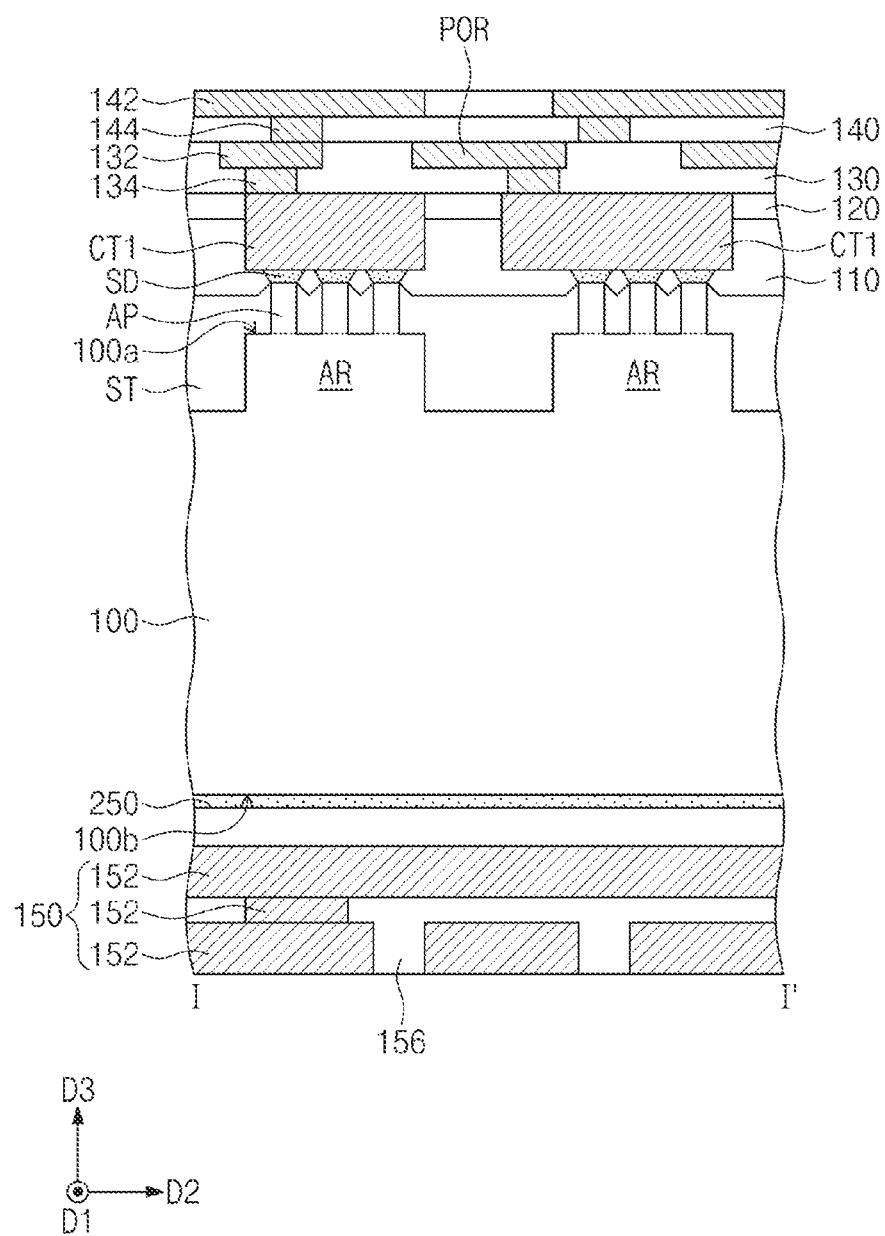
FIGS. 20A, 20B, and 20C are cross-sectional views of a semiconductor device according to an embodiment of the inventive concept, which are respectively taken along lines I-I', II-II', and IV-IV' of FIG. 19.
Figure 20B:
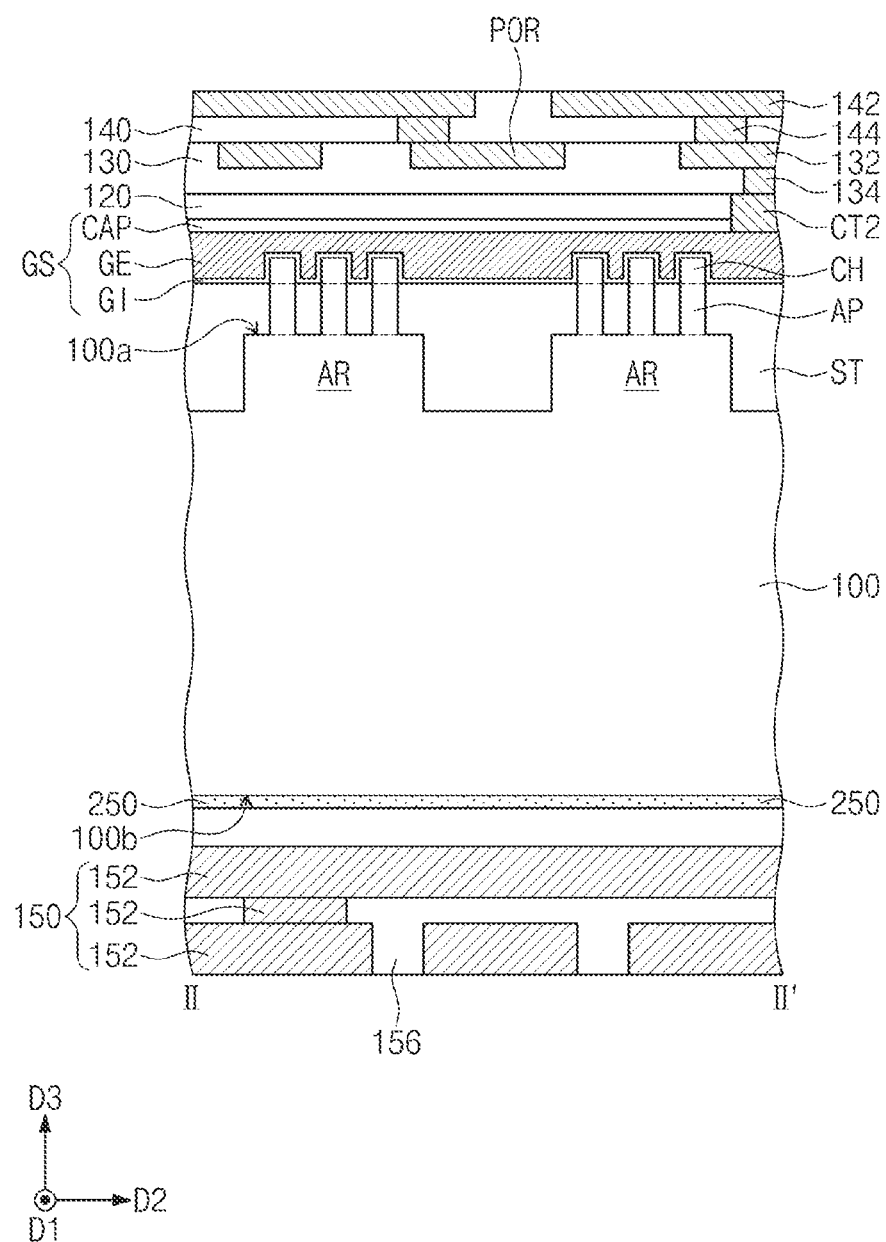
Figure 20C:
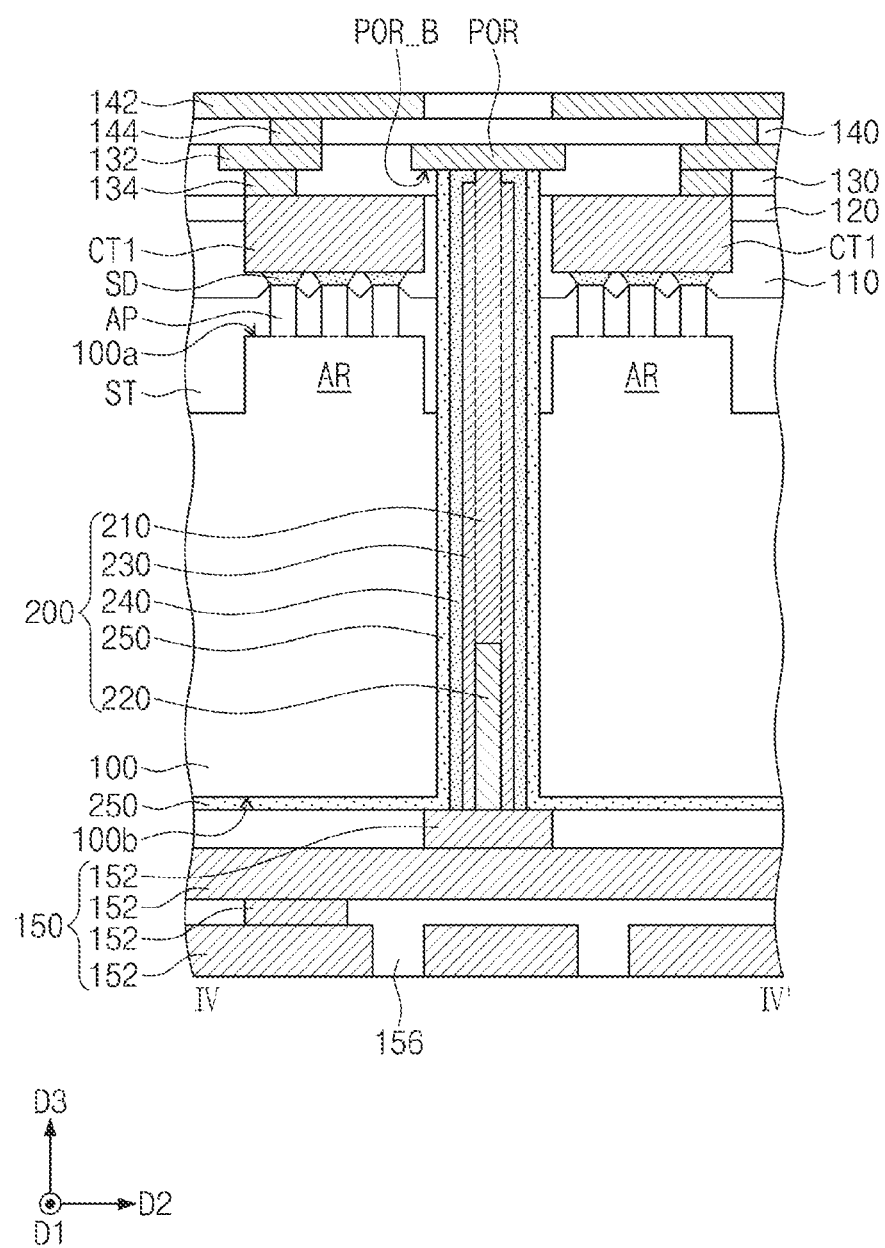

FIG. 19 is a plan view illustrating a semiconductor device according to an embodiment of the inventive concept. FIGS. 20A, 20B, and 20C are cross-sectional views of a semiconductor device according to an embodiment of the inventive concept, which are respectively taken along lines I-I', II-II', and IV-IV' of FIG. 19. A cross-sectional view taken along line III-III' of FIG. 19 may be substantially the same as FIG. 2C. For convenience of explanation, features which are different from the semiconductor device of FIGS. 1, 2A to 2C, and 3 will be mainly described below, and a further description of features previously described may be omitted.

Referring to FIGS. 19 and 20A to 20C, the power rail POR may be disposed in the third interlayer insulating layer 130. The power rail POR may be located at substantially the same height as the first upper interconnection lines 132, when measured from the first surface 100a of the semiconductor substrate 100. The first upper vias 134 may be disposed between the first contacts CT1 and the first upper interconnection lines 132 and between the first contacts CT1 and the power rail POR. At least one of the first contacts CT1 may be electrically connected to the power rail POR through a corresponding one of the first upper vias 134.

The penetration via structure 200 may penetrate the semiconductor substrate 100 and may be connected to the power rail POR and the power delivery network 150. The penetration via structure 200 may penetrate the device isolation layer ST, the first interlayer insulating layer 110, the second interlayer insulating layer 120, and a lower portion of the third interlayer insulating layer 130, and may be in contact with, and electrically connected to, the bottom surface POR_B of the power rail POR.

The penetration via structure 200 may include the first conductive pattern 210 connected to the power rail POR and the second conductive pattern 220 connected to the power delivery network 150. The first conductive pattern 210 may penetrate a portion of the semiconductor substrate 100, the device isolation layer ST, the first interlayer insulating layer 110, the second interlayer insulating layer 120, and the lower portion of the third interlayer insulating layer 130, and may be in contact with, and electrically connected to, the bottom surface POR_B of the power rail POR. The penetration via structure 200 may further include the barrier pattern 240, which is interposed between the semiconductor substrate 100 and the first conductive pattern 210 and is extended into a region between the semiconductor substrate 100 and the second conductive pattern 220. The barrier pattern 240 may extend into a region between the first conductive pattern 210 and each of the device isolation layer ST, the first interlayer insulating layer 110, the second interlayer insulating layer 120, and the third interlayer insulating layer 130. An end of the barrier pattern 240 may be in contact with, and electrically connected to, the bottom surface POR_B of the power rail POR.

The penetration via structure 200 may further include the seed pattern 230 interposed between the barrier pattern 240 and the second conductive pattern 220. The seed pattern 230 may extend into a region between the barrier pattern 240 and the first conductive pattern 210. The penetration via structure 200 may further include the insulating pattern 250 interposed between the semiconductor substrate 100 and the barrier pattern 240. The insulating pattern 250 may extend into a region between the barrier pattern 240 and each of the device isolation layer ST, the first interlayer insulating layer 110, the second interlayer insulating layer 120, and the third interlayer insulating layer 130.

The power delivery network 150 may apply the power voltage VDD or the ground voltage VSS to the power rail POR through the penetration via structure 200. The power rail POR may apply the power voltage VDD or the ground voltage VS S to the at least one first contact CT1 through the corresponding first upper via 134.

Figure 21:
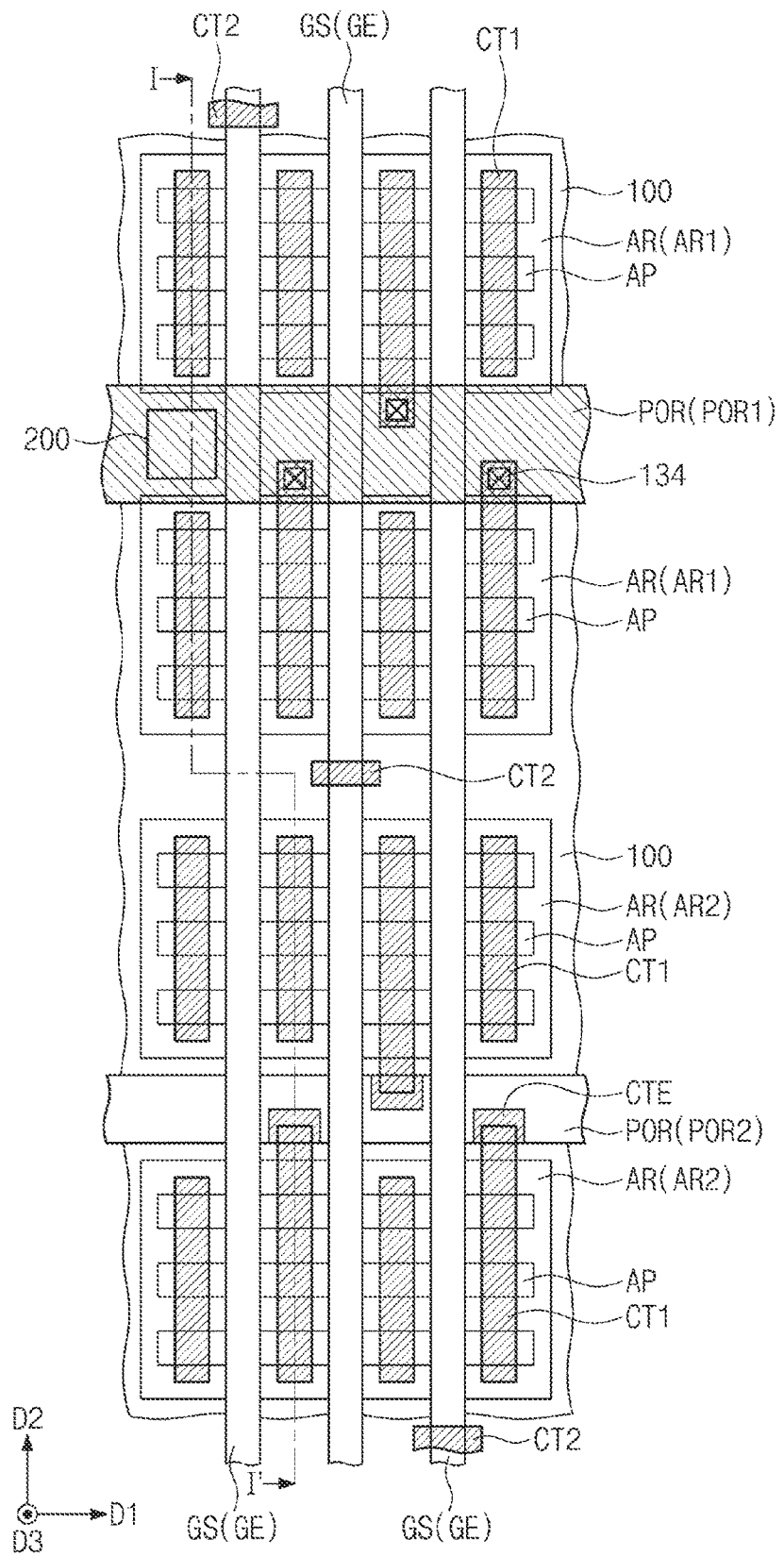
FIG. 21 is a plan view illustrating a semiconductor device according to an embodiment of the inventive concept.
Figure 22:
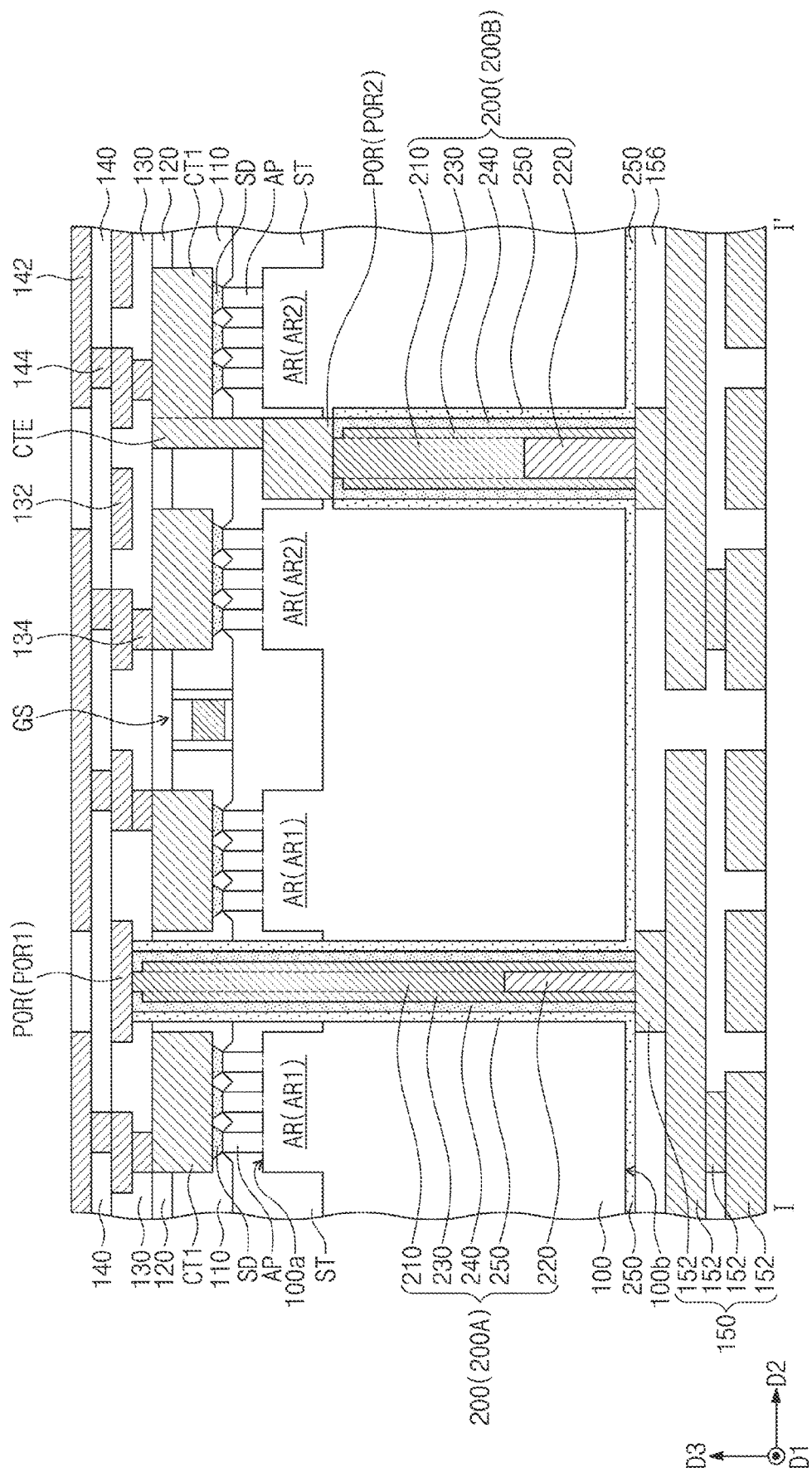
FIG. 22 is a cross-sectional view of a semiconductor device according to an embodiment of the inventive concept, taken along line I-I' of FIG. 21.

FIG. 21 is a plan view illustrating a semiconductor device according to an embodiment of the inventive concept. FIG. 22 is a cross-sectional view of a semiconductor device according to an embodiment of the inventive concept, taken along line I-I' of FIG. 21. For convenience of explanation, features which are different from the semiconductor device of FIGS. 1, 2A to 2C, and 3, will be mainly described below, and a further description of features previously described may be omitted.

Referring to FIGS. 21 and 22, in an embodiment, the active region AR may include first active regions AR1 and second active regions AR2. As an example, the first active regions AR1 may be PMOSFET regions, and the second active regions AR2 may be NMOSFET regions. As another example, the first active regions AR1 may be NMOSFET regions, and the second active regions AR2 may be PMOSFET regions.

A first power rail POR1 may be disposed in the third interlayer insulating layer 130. The first power rail POR1 may be located at substantially the same height as the first upper interconnection lines 132, when measured from the first surface 100a of the semiconductor substrate 100. The first penetration via structure 200A may penetrate the semiconductor substrate 100 and may be connected to the first power rail POR1 and the power delivery network 150. The first penetration via structure 200A may penetrate the device isolation layer ST between the first active regions AR1, the first interlayer insulating layer 110, the second interlayer insulating layer 120, and a lower portion of the third interlayer insulating layer 130, and may be in contact with, and electrically connected to, the first power rail POR1. The first power rail POR1 and the first penetration via structure 200A may be substantially the same as the power rail POR and the penetration via structure 200 described with reference to FIGS. 19 and 20A to 20C.

A second power rail POR2 may be disposed in the device isolation layer ST between the second active regions AR2. The second power rail POR2 may be buried in the device isolation layer ST between the second active regions AR2. The second penetration via structure 200B may penetrate the semiconductor substrate 100 and may be connected to the second power rail POR2 and the power delivery network 150. The second power rail POR2 and the second penetration via structure 200B may be substantially the same as the power rail POR and the penetration via structure 200 described with reference to FIGS. 1, 2A to 2C, and 3.

Figure 23:
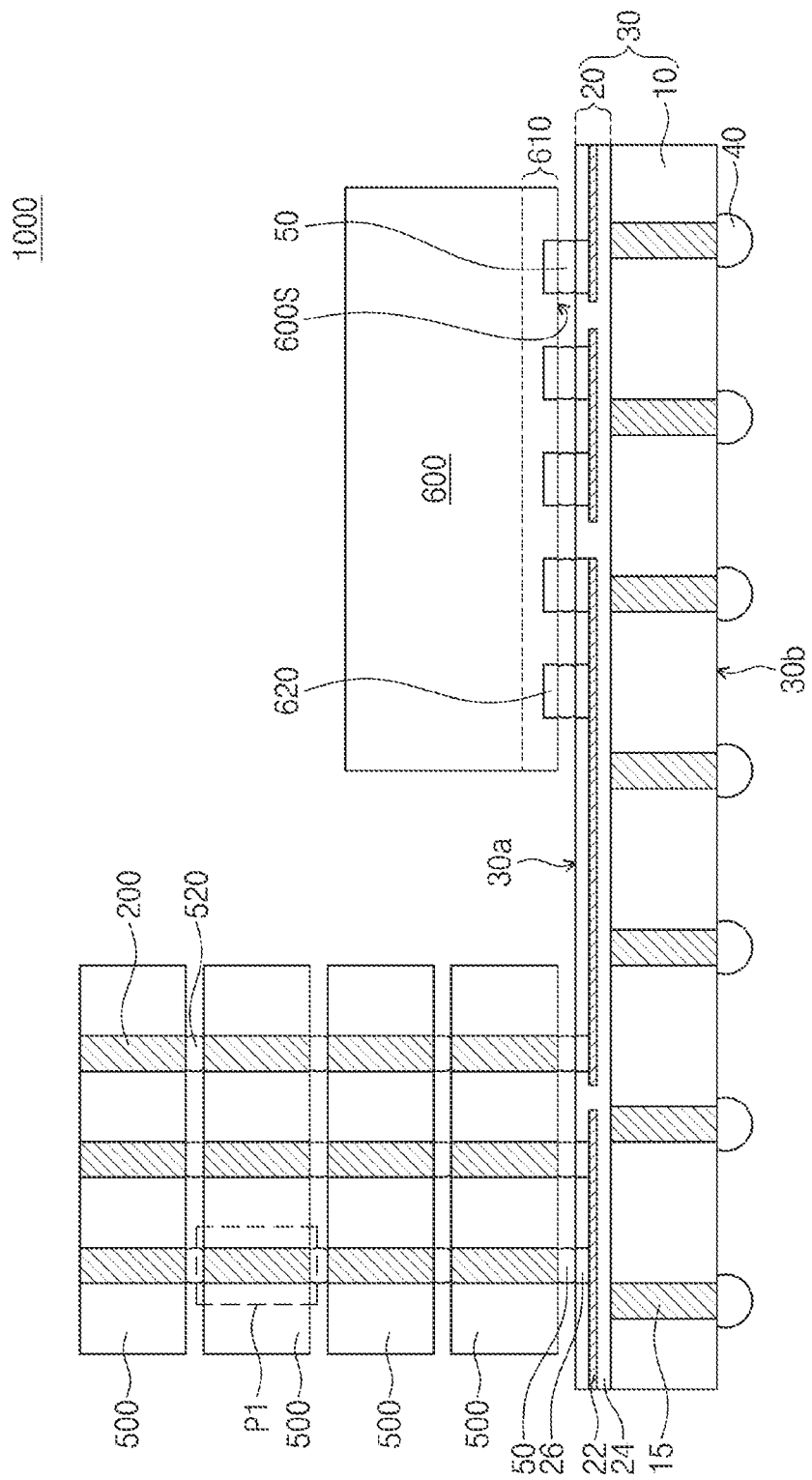
FIG. 23 is a cross-sectional view illustrating a semiconductor package according to an embodiment of the inventive concept.
Figure 24:
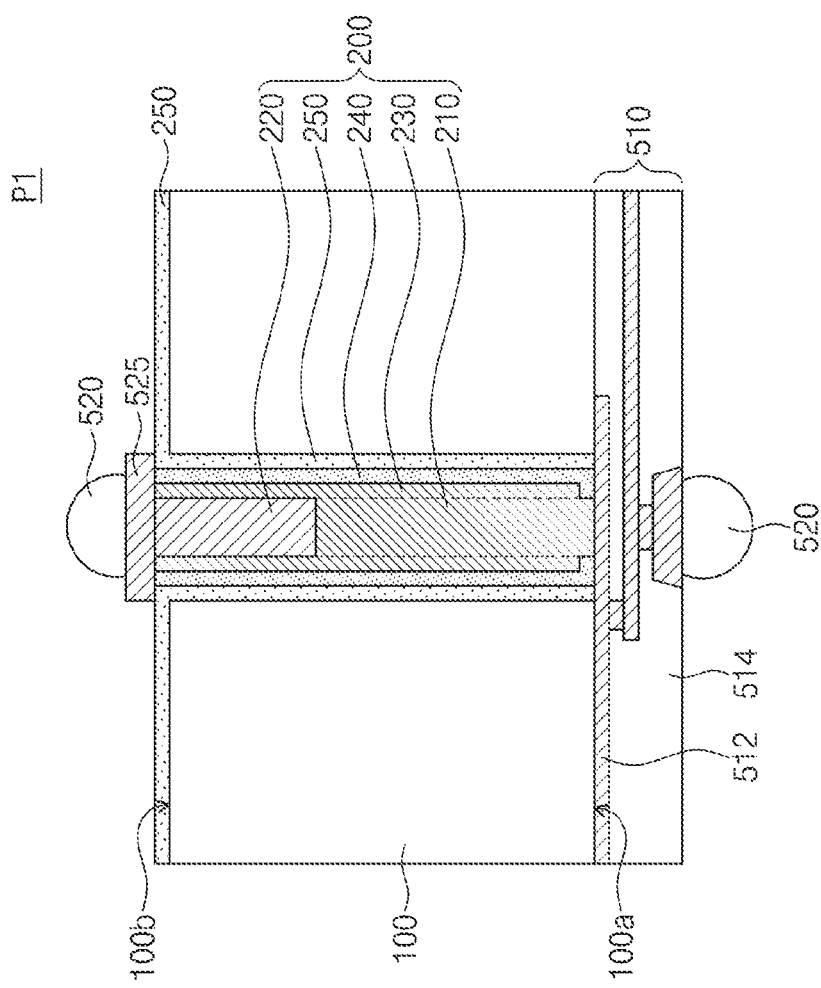
FIG. 24 is an enlarged view of a portion P1 of FIG. 23 according to an embodiment of the inventive concept.

FIG. 23 is a cross-sectional view illustrating a semiconductor package according to an embodiment of the inventive concept. FIG. 24 is an enlarged view of a portion P1 of FIG. 23 according to an embodiment of the inventive concept.

Referring to FIG. 23, a semiconductor package 1000 may include an interposer substrate 30, a plurality of first semiconductor chips 500 vertically stacked on the interposer substrate 30, and a second semiconductor chip 600, which is disposed on the interposer substrate 30 and is horizontally spaced apart from the first semiconductor chips 500.

The interposer substrate 30 may have a first surface 30a and a second surface 30b, which are opposite to each other. The interposer substrate 30 may include a substrate 10, which may be a silicon substrate 10, and an interconnection layer 20 disposed on the silicon substrate 10. The interconnection layer 20 may be adjacent to the first surface 30a of the interposer substrate 30. The interconnection layer 20 may include metal lines 22 and an interconnection insulating layer 24 covering the metal lines 22. A plurality of penetration electrodes 15 may be disposed in the silicon substrate 10. Each of the penetration electrodes 15 may penetrate the silicon substrate 10 and may be connected to a corresponding one of the metal lines 22. The penetration electrodes 15 may be formed of or include a conductive material (e.g., copper (Cu)).

Substrate pads 26 may be disposed adjacent to the first surface 30a of the interposer substrate 30. The interconnection insulating layer 24 may cover side surfaces of the substrate pads 26 and may expose top surfaces of the substrate pads 26. Lower bumps 40 may be disposed on the second surface 30b of the interposer substrate 30. The lower bumps 40 may be connected to the penetration electrodes 15, respectively.

The first semiconductor chips 500 may be disposed on the first surface 30a of the interposer substrate 30 and may be stacked in a direction substantially perpendicular to the first surface 30a. Each of the first semiconductor chips 500 may include penetration via structures 200 penetrating the same. Connection bumps 520 may be disposed between the first semiconductor chips 500. The first semiconductor chips 500 may be electrically connected to each other by the penetration via structures 200 and the connection bumps 520. In an embodiment, the first semiconductor chips 500 may constitute a high bandwidth memory (HBM) chip including a plurality of memory chips.

Referring to FIG. 24, each of the first semiconductor chips 500 may include the semiconductor substrate 100 and a first circuit layer 510 disposed on the first surface 100a of the semiconductor substrate 100. The first circuit layer 510 may include interconnection patterns 512 and an insulating layer 514 covering the interconnection patterns 512. Each of the penetration via structures 200 may penetrate the semiconductor substrate 100 and may be connected to a corresponding one of the interconnection patterns 512 in the circuit layer 510. An end of each of the penetration via structures 200 may be electrically connected to a corresponding one of the connection bumps 520 through the corresponding interconnection pattern 512.

A connection pad 525 may be disposed on the second surface 100b of the semiconductor substrate 100, which is opposite to the first surface 100a. An opposite end of each of the penetration via structures 200 may be connected to the connection pad 525. An opposite end of each of the penetration via structures 200 may be electrically connected to a corresponding one of the connection bumps 520 through the connection pad 525.

Each of the penetration via structures 200 may include the first conductive pattern 210 connected to the corresponding interconnection pattern 512, the second conductive pattern 220 connected to the connection pad 525, the barrier pattern 240 interposed between the semiconductor substrate 100 and the first conductive pattern 210 and between the semiconductor substrate 100 and the second conductive pattern 220, the seed pattern 230 interposed between the barrier pattern 240 and the second conductive pattern 220 and extended to a region between the barrier pattern 240 and the first conductive pattern 210, and the insulating pattern 250 interposed between the semiconductor substrate 100 and the barrier pattern 240. In an embodiment, the insulating pattern 250 may extend to a region on the second surface 100b of the semiconductor substrate 100. Each of the penetration via structures 200 may be substantially the same as the penetration via structure 200 described with reference to FIGS. 1 to 22.

Referring back to FIG. 23, the second semiconductor chip 600 may be disposed on the first surface 30a of the interposer substrate 30 and may be spaced apart from the first semiconductor chips 500 in a direction substantially parallel to the first surface 30a. One surface 600S of the second semiconductor chip 600 may face the first surface 30a of the interposer substrate 30, and the second semiconductor chip 600 may include a second circuit layer 610 adjacent to the one surface 600S of the second semiconductor chip 600. The second circuit layer 610 may include an integrated circuit. The second semiconductor chip 600 may be one of, for example, a memory chip, a logic chip, an application processor (AP) chip, and a system-on-chip (SOC). However, the second semiconductor chip 600 is not limited thereto. Chip pads 620 may be disposed adjacent to the one surface 600S of the second semiconductor chip 600.

Upper bumps 50 may be disposed between the lowermost one of the first semiconductor chips 500 and the interposer substrate 30 and between the second semiconductor chip 600 and the interposer substrate 30. The lowermost one of the first semiconductor chips 500 may be connected to the metal lines 22 of the interposer substrate 30 through corresponding ones of the upper bumps 50 and corresponding ones of the substrate pads 26. The second semiconductor chip 600 may be connected to the metal lines 22 of the interposer substrate 30 through the chip pads 620, corresponding ones of the upper bumps 50, and corresponding ones of the substrate pads 26.

Figure 25:
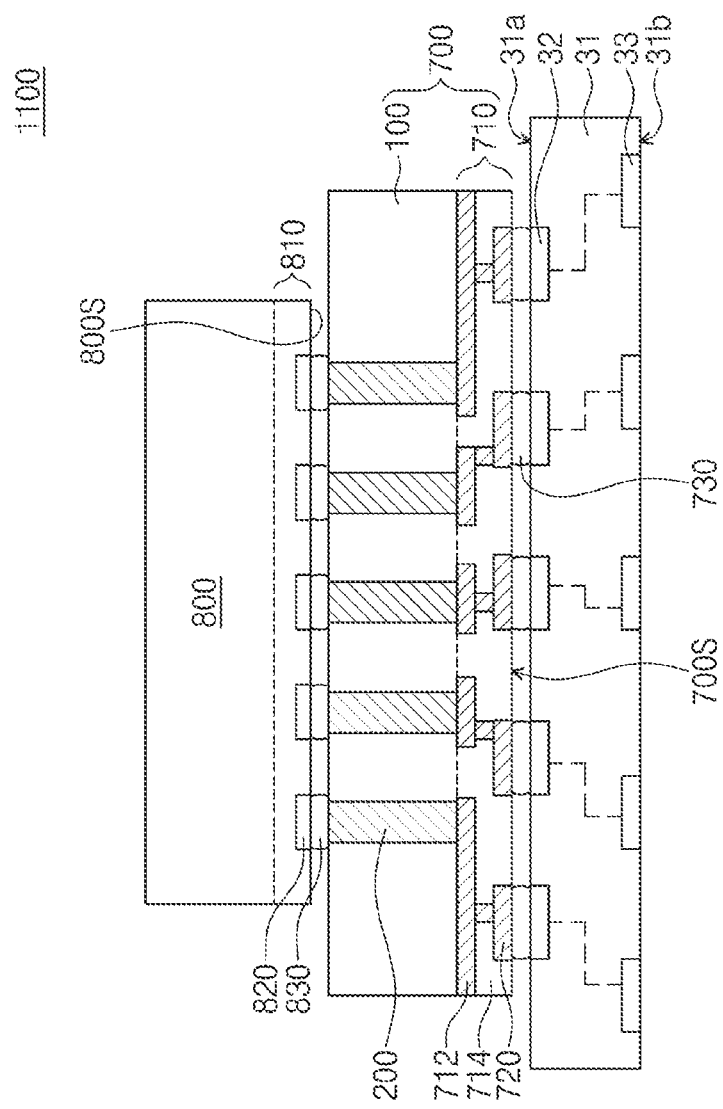
FIG. 25 is a cross-sectional view illustrating a semiconductor package according to an embodiment of the inventive concept.

FIG. 25 is a cross-sectional view illustrating a semiconductor package according to an embodiment of the inventive concept.

Referring to FIG. 25, a semiconductor package 1100 may include a package substrate 31, a lower semiconductor chip 700 disposed on the package substrate 31, and an upper semiconductor chip 800 disposed on the lower semiconductor chip 700.

The package substrate 31 may be, for example, a printed circuit board. The package substrate 31 may include first substrate pads 32, which are adjacent to a first surface 31a of the package substrate 31, and second substrate pads 33, which are adjacent to a second surface 31b of the package substrate 31. The first and second substrate pads 32 and 33 may be formed of or include at least one of conductive materials. Outer terminals may be disposed on the second surface 31b of the package substrate 31 and may be connected to the second substrate pads 33, respectively. The first substrate pads 32 may be electrically connected to the second substrate pads 33 through internal lines in the package substrate 31.

The lower semiconductor chip 700 may be mounted on the first surface 31a of the package substrate 31. The lower semiconductor chip 700 may include the semiconductor substrate 100 and a lower circuit layer 710. One surface 700S of the lower semiconductor chip 700 may face the first surface 31a of the package substrate 31, and the lower circuit layer 710 may be adjacent to the one surface 700S of the lower semiconductor chip 700. The lower circuit layer 710 may include lower interconnection lines 712 and a lower insulating layer 714 covering the lower interconnection lines 712. Lower chip pads 720 may be disposed adjacent to the one surface 700S of the lower semiconductor chip 700. The lower insulating layer 714 may expose bottom surfaces of the lower chip pads 720. Each of the lower chip pads 720 may be connected to at least one of the lower interconnection lines 712.

The lower semiconductor chip 700 may include the penetration via structures 200, which are disposed in the semiconductor substrate 100. Each of the penetration via structures 200 may penetrate the semiconductor substrate 100 and may be connected to a corresponding one of the lower interconnection lines 712 in the lower circuit layer 710. Each of the penetration via structures 200 may be configured to have substantially the same features as those of the penetration via structure 200 described with reference to FIG. 24.

Lower connection bumps 730 may connect the first substrate pads 32 and the lower chip pads 720 to each other. The lower semiconductor chip 700 may be electrically connected to the package substrate 31 through the lower chip pads 720, the lower connection bumps 730, and the first substrate pads 32. Each of the lower semiconductor chip 700 may be one of, for example, a memory chip, a logic chip, an application processor (AP) chip, and a system-on-chip (SOC). However, each of the lower semiconductor chips 700 is not limited thereto.

The upper semiconductor chip 800 may be disposed on the lower semiconductor chip 700. The upper semiconductor chip 800 may include an upper circuit layer 810 that is adjacent to one surface 800S of the upper semiconductor chip 800. The one surface 800S of the upper semiconductor chip 800 may face one surface of the lower semiconductor chip 700. The upper circuit layer 810 may include an integrated circuit. Upper chip pads 820 may be disposed adjacent to the one surface 800S of the upper semiconductor chip 800.

Upper connection bumps 830 may be interposed between the lower semiconductor chip 700 and the upper semiconductor chip 800. The upper connection bumps 830 may be respectively connected to the upper chip pads 820 and may be respectively connected to the penetration via structures 200 of the lower semiconductor chip 700. The upper semiconductor chip 800 may be electrically connected to the lower semiconductor chip 700 and the package substrate 31 through the upper chip pads 820, the upper connection bumps 830, and the penetration via structures 200. The upper semiconductor chip 800 may be one of, for example, a memory chip, a logic chip, an application processor (AP) chip, and a system-on-chip (SOC). However, the upper semiconductor chip 800 is not limited thereto.

Figure 26:
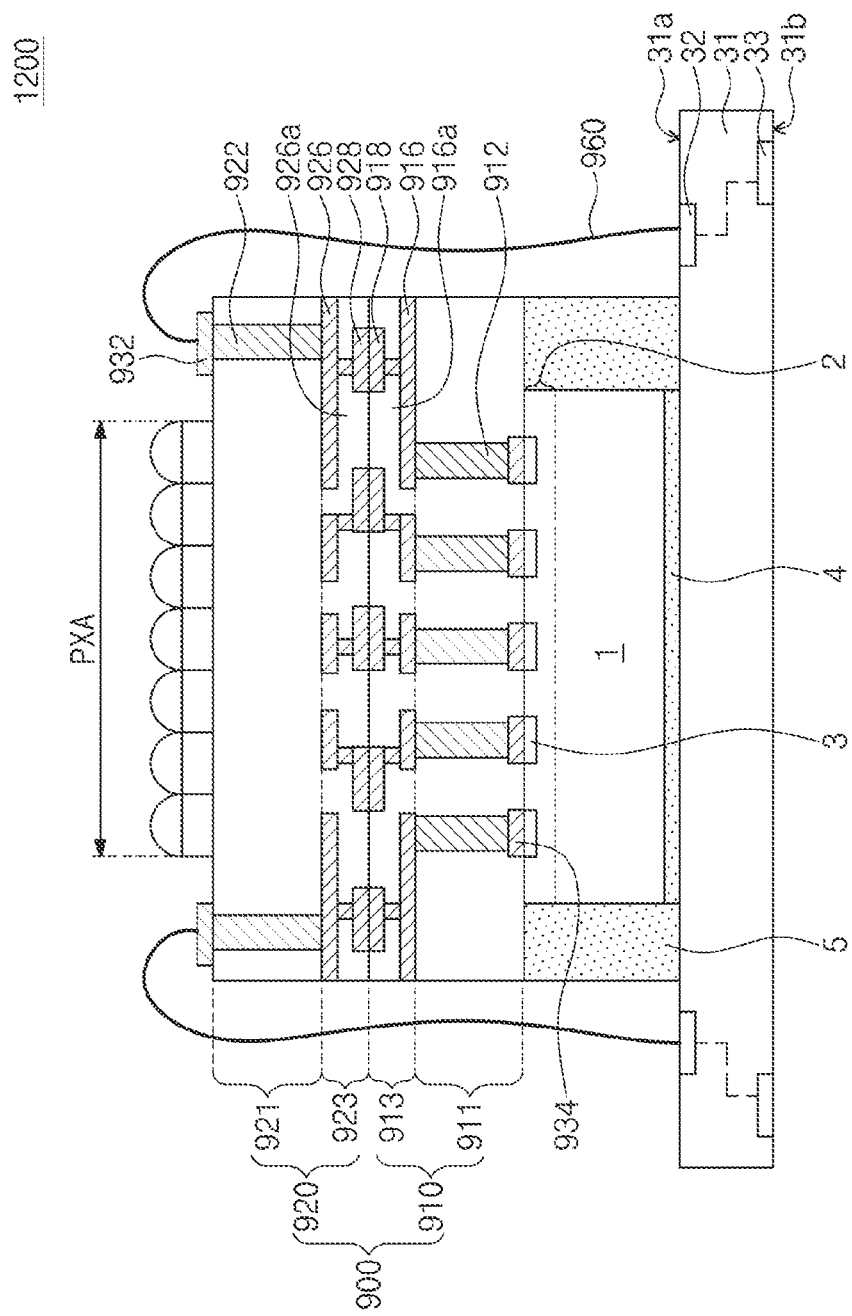
FIG. 26 is a cross-sectional view illustrating a semiconductor package according to an embodiment of the inventive concept.

FIG. 26 is a cross-sectional view illustrating a semiconductor package according to an embodiment of the inventive concept.

Referring to FIG. 26, a semiconductor package 1200 may include a package substrate 31, a memory chip 1 disposed on the package substrate 31, and an image sensor chip 900 disposed on the memory chip 1. The package substrate 31 may be substantially the same as the package substrate 31 described with reference to FIG. 25.

The memory chip 1 may include one of, for example, dynamic random-access memory (DRAM), static random-access memory (SRAM), magnetoresistive random-access memory (MRAM), or flash memory devices. However, the memory chip 1 is not limited thereto. The memory chip 1 may include a circuit layer 2 and a chip pad 3. The chip pad 3 may be disposed on a top surface of the memory chip 1 and may be electrically connected to an integrated circuit in the circuit layer 2. An adhesive layer 4 may be interposed between the memory chip 1 and the package substrate 31. The adhesive layer 4 may be formed of or include at least one of, for example, insulating polymer materials. The mold layer 5 may be disposed on the package substrate 31 to cover side surfaces of the memory chip 1. The mold layer 5 may include an insulating polymer material (e.g., an epoxy molding compound).

The image sensor chip 900 may be disposed on the memory chip 1 and the mold layer 5. The image sensor chip 900 may include a logic chip 910 and a sensing chip 920 disposed on the logic chip 910.

The logic chip 910 may include a first base layer 911, a first via 912, a logic circuit layer 913, and a first bonding pad 918. The first base layer 911 may include a silicon substrate. The first via 912 may penetrate the first base layer 911. The first via 912 may be disposed on a first pad 934 and may be connected to the first pad 934. The first pad 934 may be connected to the chip pad 3 of the memory chip 1. Accordingly, the first via 912 may be electrically connected to the memory chip 1 through the first pad 934 and the chip pad 3.

The logic circuit layer 913 may be provided on the first base layer 911. The logic circuit layer 913 may include logic circuit lines 916 and an insulating layer 916a covering the logic circuit lines 916. The first bonding pad 918 may be disposed in the logic circuit layer 913 and may be connected to the logic circuit lines 916. The first via 912 may penetrate the first base layer 911 and may be connected to the logic circuit lines 916.

The sensing chip 920 may include a second base layer 921, a second via 922, a sensing circuit layer 923, and a second bonding pad 928. The second base layer 921 may include a silicon substrate. The sensing circuit layer 923 may be disposed between the second base layer 921 and the logic chip 910. The sensing circuit layer 923 may include sensing circuit lines 926 and an insulating layer 926a covering the sensing circuit lines 926.

The second bonding pad 928 may be disposed in the sensing circuit layer 923 and may be connected to the sensing circuit lines 926. The first bonding pad 918 may be connected to the second bonding pad 928. Accordingly, the logic circuit layer 913 of the logic chip 910 may be electrically connected to the sensing circuit layer 923 of the sensing chip 920. The second via 922 may penetrate the second base layer 921 and may be connected to the sensing circuit lines 926. A second pad 932 may be disposed on the second via 922 and may be connected to the second via 922. The second pad 932 may be connected to the first substrate pad 32 of the package substrate 31 through a bonding wire 960. The image sensor chip 900 may further include a pixel array PXA disposed on the sensing chip 920.

According to an embodiment of the inventive concept, at least one of the first and second vias 912 and 922 may be substantially the same as the penetration via structure 200 described with reference to FIG. 24.

According to an embodiment of the inventive concept, a penetration via structure may include a first conductive pattern and a second conductive pattern, which include different materials from each other. The first conductive pattern may be formed of or include a material (e.g., a non-copper metal), which can more easily fill a penetration hole in a semiconductor substrate, compared with the second conductive pattern. Thus, difficulty in performing a deposition process to form the penetration via structure may be decreased. The second conductive pattern may be formed of or include a material (e.g., copper) whose resistance is lower than the first conductive pattern, and in this case, a total resistance of the penetration via structure may be reduced. Thus, embodiments of the inventive concept provide a semiconductor device having increased reliability, which can be easily fabricated, and a semiconductor package including the same.

A semiconductor device may be embedded in a semiconductor package, and in this case, the semiconductor device can be used as a part of an electronic product. Embodiments of the inventive concept allow for the implementation of small, light, and multifunctional electronic devices, in which, for example, a multi-chip package in which a plurality of chips is stacked in a single semiconductor package, or a system-in-package in which a plurality of stacked chips of different kinds serving as a single system is mounted in a single semiconductor package, may be provided.

While the inventive concept has been particularly shown and described with reference to the embodiments thereof, it will be understood by those of ordinary skill in the art that various changes in form and detail may be made therein without departing from the spirit and scope of the inventive concept as defined by the following claims.

What is claimed is:
1. A semiconductor device, comprising:
a semiconductor substrate having a first surface and a second surface, which are opposite to each other;
an active pattern protruding from the first surface of the semiconductor substrate, the active pattern including a source/drain region;
a power rail electrically connected to the source/drain region;
a power delivery network disposed on the second surface of the semiconductor substrate;
a device isolation layer disposed on the first surface of the semiconductor substrate and covering a side surface of the active pattern,
wherein the power rail is buried in the device isolation layer; and
a penetration via structure penetrating the semiconductor substrate and electrically connected to the power rail and the power delivery network,
wherein the penetration via structure comprises:
a first conductive pattern electrically connected to the power rail; and
a second conductive pattern electrically connected to the power delivery network,
wherein the first conductive pattern comprises a material different from the second conductive pattern.

2. The semiconductor device of claim 1, wherein the penetration via structure further comprises:
a barrier pattern interposed between the semiconductor substrate and the first conductive pattern and between the semiconductor substrate and the second conductive pattern.

3. The semiconductor device of claim 2, wherein the penetration via structure further comprises:
a seed pattern interposed between the barrier pattern and the second conductive pattern,
wherein the seed pattern comprises a same material as the first conductive pattern.

4. The semiconductor device of claim 3, wherein the seed pattern and the first conductive pattern are in direct contact with each other and form a single object.

5. The semiconductor device of claim 2, wherein the penetration via structure further comprises:
a seed pattern interposed between the barrier pattern and the first conductive pattern and between the barrier pattern and the second conductive pattern,
wherein the seed pattern comprises a material different from the first conductive pattern.

6. The semiconductor device of claim 5, wherein the first conductive pattern comprises an extended portion interposed between the seed pattern and the second conductive pattern.

7. The semiconductor device of claim 5, wherein the seed pattern comprises a same material as the second conductive pattern.

8. The semiconductor device of claim 5, wherein the seed pattern comprises a material different from the second conductive pattern.

9. The semiconductor device of claim 2, wherein the penetration via structure further comprises:
an insulating pattern interposed between the semiconductor substrate and the barrier pattern.

10. The semiconductor device of claim 1, wherein the power delivery network comprises:
a plurality of lower interconnection lines disposed on the second surface of the semiconductor substrate,
wherein the second conductive pattern of the penetration via structure penetrates a portion of the semiconductor substrate and is connected to a corresponding one of the lower interconnection lines.

11. The semiconductor device of claim 10, wherein
the first conductive pattern of the penetration via structure penetrates another portion of the semiconductor substrate and is electrically connected to the power rail.

12. The semiconductor device of claim 11, further comprising:
a first contact disposed on the first surface of the semiconductor substrate and electrically connected to the source/drain region,
wherein the first contact comprises a contact extended portion penetrating the device isolation layer and connected to the power rail.

13. The semiconductor device of claim 10, further comprising:
a first contact disposed on the first surface of the semiconductor substrate and electrically connected to the source/drain region;
a plurality of upper interconnection lines disposed on the first contact; and
a plurality of upper vias disposed between the first contact and the upper interconnection lines,
wherein the power rail is located at a same height as the upper interconnection lines, from the first surface of the semiconductor substrate, and
the first contact is electrically connected to the power rail through a corresponding one of the upper vias.

14. A semiconductor device, comprising:
a semiconductor substrate having a first surface and a second surface, which are opposite to each other;
a transistor disposed on the first surface of the semiconductor substrate;
a power rail electrically connected to a terminal of the transistor;
a lower insulating layer disposed on the second surface of the semiconductor substrate;
a plurality of lower interconnection lines disposed in the lower insulating layer; and
a penetration via structure penetrating the semiconductor substrate and electrically connecting a corresponding one of the lower interconnection lines to the power rail,
wherein the penetration via structure extends from the second surface toward the first surface in a direction substantially perpendicular to the second surface of the semiconductor substrate, and
the penetration via structure comprises:
a first conductive pattern electrically connected to the power rail; and
a second conductive pattern electrically connected to the corresponding lower interconnection line,
wherein the first conductive pattern comprises a first metal, and the second conductive pattern comprises a second metal different from the first metal.

15. The semiconductor device of claim 14, wherein the penetration via structure further comprises:
a barrier pattern interposed between the semiconductor substrate and the first conductive pattern and between the semiconductor substrate and the second conductive pattern; and
an insulating pattern interposed between the semiconductor substrate and the barrier pattern.

16. The semiconductor device of claim 15, wherein the penetration via structure further comprises:
a seed pattern interposed between the barrier pattern and the first conductive pattern and between the barrier pattern and the second conductive pattern.

17. The semiconductor device of claim 16, wherein the seed pattern comprises a same metal as the first conductive pattern or the second conductive pattern.

18. The semiconductor device of claim 16, wherein the seed pattern comprises a metal different from the first and second conductive patterns.

19. The semiconductor device of claim 16, wherein the first conductive pattern comprises an extended portion interposed between the seed pattern and the second conductive pattern.

20. A semiconductor package, comprising:
a lower semiconductor chip including a semiconductor substrate and a penetration via structure penetrating the semiconductor substrate; and
an upper semiconductor chip disposed on the lower semiconductor chip,
wherein the upper semiconductor chip is electrically connected to the lower semiconductor chip through the penetration via structure, and
the penetration via structure comprises:
a first conductive pattern penetrating a lower portion of the semiconductor substrate; and
a second conductive pattern penetrating an upper portion of the semiconductor substrate;
a barrier pattern interposed between the semiconductor substrate and the first conductive pattern and between the semiconductor substrate and the second conductive pattern;
an insulating pattern interposed between the semiconductor substrate and the barrier pattern; and
a seed pattern interposed between the barrier pattern and the first conductive pattern and between the barrier pattern and the second conductive pattern,
wherein the first conductive pattern comprises a first metal, and the second conductive pattern comprises a second metal different from the first metal.

* * * * *